United States Patent
Jobetto

(10) Patent No.: US 7,843,071 B2
(45) Date of Patent: Nov. 30, 2010

(54) SEMICONDUCTOR DEVICE INCLUDING WIRING AND MANUFACTURING METHOD THEREOF

(75) Inventor: Hiroyasu Jobetto, Hachioji (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 12/358,572

(22) Filed: Jan. 23, 2009

(65) Prior Publication Data

US 2009/0194888 A1   Aug. 6, 2009

(30) Foreign Application Priority Data

Jan. 31, 2008   (JP) .............................. 2008-020693

(51) Int. Cl.
  *H01L 29/40* (2006.01)
  *H01L 21/44* (2006.01)
(52) U.S. Cl. ...................................... 257/773; 438/666
(58) Field of Classification Search ................ 257/698, 257/700, 773–776, E23.141–E23.179, E21.588, 257/E21.597; 438/666–675
See application file for complete search history.

(56) References Cited

U.S. PATENT DOCUMENTS

| | | | |
|---|---|---|---|
| 7,294,922 | B2 | 11/2007 | Jobetto et al. |
| 7,618,886 | B2 | 11/2009 | Jobetto et al. |
| 7,737,543 | B2 | 6/2010 | Jobetto et al. |
| 2007/0138619 | A1* | 6/2007 | Shinagawa et al. ........... 257/700 |
| 2009/0135575 | A1* | 5/2009 | Kajiki et al. ................. 361/803 |

FOREIGN PATENT DOCUMENTS

| | | |
|---|---|---|
| CN | 1568546 A | 1/2005 |
| JP | 2004-071998 A | 3/2004 |
| JP | 2004-087661 A | 3/2004 |
| JP | 2005-019938 A | 1/2005 |
| JP | 2005-142248 A | 6/2005 |
| JP | 2005-159199 A | 6/2005 |
| WO | WO 2004/015771 A2 | 2/2004 |

OTHER PUBLICATIONS

Japanese Office Action dated Jan. 12, 2010 and English translation thereof issued in a counterpart Japanese Application No. 2008-020693.
Chinese Office Action dated Mar. 29, 2010 and English translation thereof in counterpart Chinese Application No. 200910003372.9.

* cited by examiner

*Primary Examiner*—Calvin Lee
(74) *Attorney, Agent, or Firm*—Holtz, Holtz, Goodman & Chick, PC

(57) ABSTRACT

A semiconductor construct is provided which has a semiconductor substrate, an external connection electrode, and an electrode enveloping layer for enveloping the external connection electrode. Also, a base plate is provided which includes a wiring having a first opening corresponding to the external connection electrode. Subsequently, the base plate is removed after the semiconductor construct is fixed to the base plate, and a second opening which reaches the external connection electrode is formed on the electrode enveloping layer corresponding to the first opening of the wiring. Then, a connection conductor for electrically connecting the wiring and the external connection electrode is formed.

11 Claims, 58 Drawing Sheets

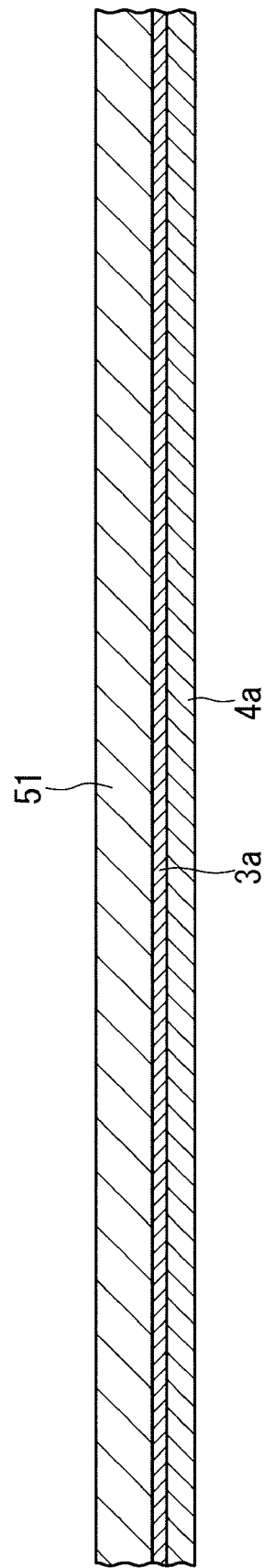

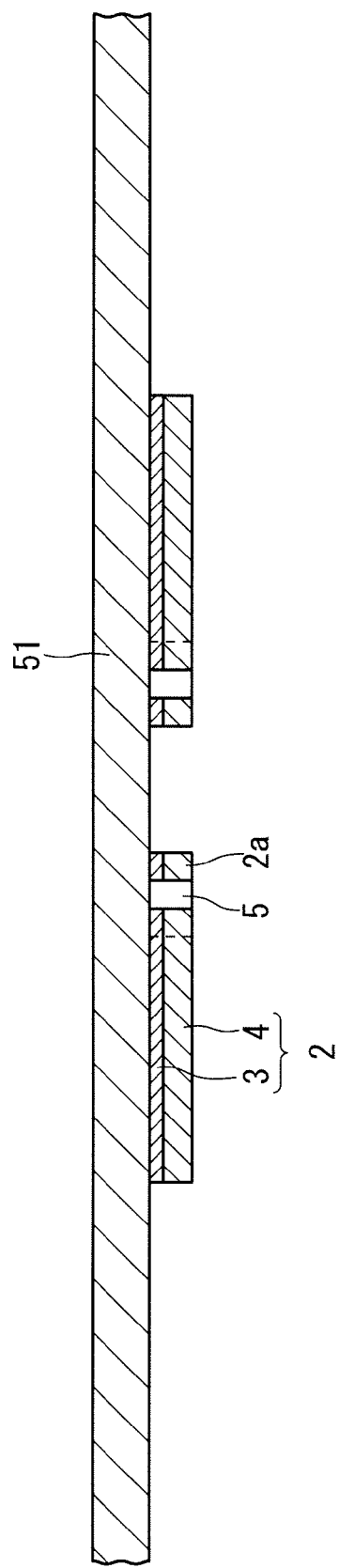
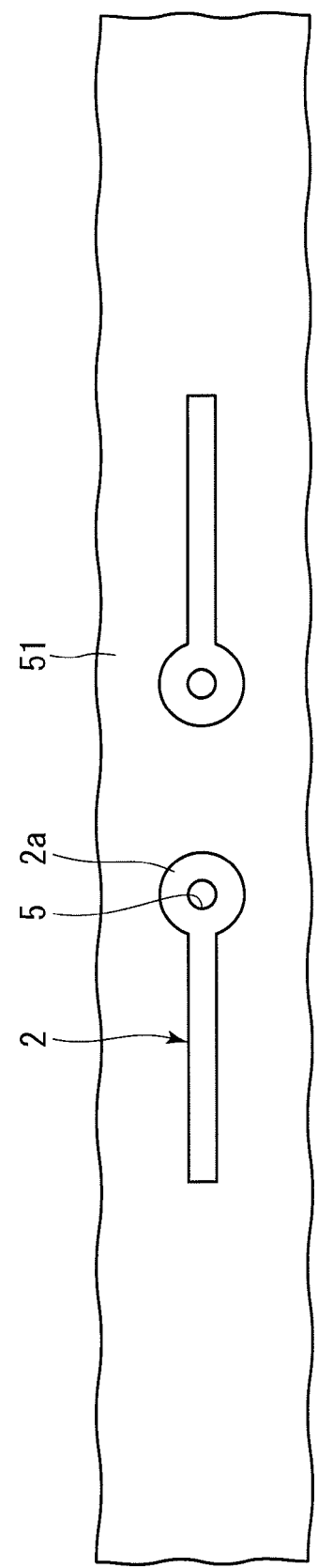

SEMICONDUCTOR DEVICE INCLUDING WIRING AND MANUFACTURING METHOD THEREOF

CROSS-REFERENCE TO RELATED APPLICATION

This application is based upon and claims the benefit of priority from the prior Japanese Patent Application No. 2008-020693, filed Jan. 31, 2008, the entire contents of which is incorporated herein by reference.

BACKGROUND OF THE INVENTION

1. Field of the Invention

The present invention relates to a semiconductor device including wiring and a manufacturing method thereof.

2. Description of the Related Art

To increase packaging density of a semiconductor device, a method is used in which a semiconductor construct, referred to as a chip size package (CSP), is provided on a base plate having a planar size that is greater than that of the semiconductor construct. Japanese Patent Application Laid-Open (Kokai) Publication No. 2004-71998 discloses the configuration of a semiconductor device such as this and a manufacturing method thereof. In the semiconductor device disclosed in this patent publication, an insulating layer is provided on a base plate around a periphery of a semiconductor construct, and an upper-layer insulating film is provided on the semiconductor construct and the insulating layer. An upper-layer wiring connected to the external connection electrode (columnar electrode) of the semiconductor construct is provided on the upper-layer insulating film.

In the manufacturing method of the above-described conventional semiconductor device, a plurality of semiconductor constructs are disposed on the base plate of which the size allows a plurality of completed semiconductor devices to be formed thereon, and the insulating layer and the upper-layer insulating film are formed. Then, the upper-layer wiring is formed on the upper-layer insulating film. Therefore, when the upper-layer wiring is formed on the upper-layer insulating film, the semiconductor constructs are already embedded under the upper-layer insulating film.

Therefore, after the formation of the upper-layer wiring, when the upper-layer wiring is inspected and judged to be defective, non-defective semiconductor constructs that are relatively expensive which are embedded under the upper-layer insulating film under the upper-layer wiring judged to be defective must be discarded. As a result, in view of the yield rate of the semiconductor device configured as described above, yield requirements of upper-layer wiring formation becomes more difficult to achieve.

For example, the yield rate of wiring formation with a 50 µm to 70 µm rule is currently 80% to 85%. The yield rate in terms of the cost aspect of the semiconductor device configured as described above is said to be 99.5% or more, and cannot be satisfied. With the miniaturization of wiring, a method that can be applied to a 30 µm to 50 µm rule and a 15 µm to 25 µm rule is especially required.

SUMMARY OF THE INVENTION

The present invention is to provide a manufacturing method of a semiconductor device that improves overall yield.

In accordance with one aspect of the present invention, there is provided a semiconductor device, comprising: a semiconductor construct having a semiconductor substrate, an external connection electrode formed on the semiconductor substrate and an electrode enveloping layer which has a second opening that exposes at least a portion of the external connection electrode; an insulating layer formed around a periphery of the semiconductor construct; a wiring formed below the semiconductor construct and below the insulating layer and including a connection pad having a first opening which is formed at the position corresponding to the external connection electrode; and a connection conductor for electrically connecting the external connection electrode to the wiring via the second opening and the first opening.

In accordance with another aspect of the present invention, there is provided a manufacturing method of a semiconductor device comprising the steps of: providing a semiconductor construct having a semiconductor substrate, an external connection electrode formed on the semiconductor substrate and an electrode enveloping layer for enveloping the external connection electrode; providing a base plate including a wiring which contains a connection pad having a first opening corresponding to the external connection electrode; fixing the semiconductor construct to the base plate; forming an insulating layer on the base plate around a periphery of the semiconductor construct; removing the base plate; forming a second opening which reaches the external connection electrode at a position in the electrode enveloping layer of the semiconductor construct corresponding to the first opening of the wiring; and forming a connection conductor for electrically connecting the wiring to the external connection electrode.

According to the present invention, a semiconductor construct having an external connection electrode and a wiring separately formed, and after the two are fixed, the external connection electrode and the wiring are electrically connected. Therefore, the wiring can be inspected before the semiconductor construct is mounted, thereby improving overall yield.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

FIG. 2 is a cross-sectional view of an initially prepared semiconductor device in an example of a manufacturing method of the semiconductor device shown in FIG. 1;

FIG. 3A is a cross-sectional view of a procedure performed after that in FIG. 2;

FIG. 3B is a bottom view of a procedure performed after that in FIG. 2;

DETAILED DESCRIPTION OF THE PREFERRED EMBODIMENTS

The present invention will hereinafter be described in detail with reference to the preferred embodiments shown in the accompanying drawings.

First Embodiment

Figure 1:
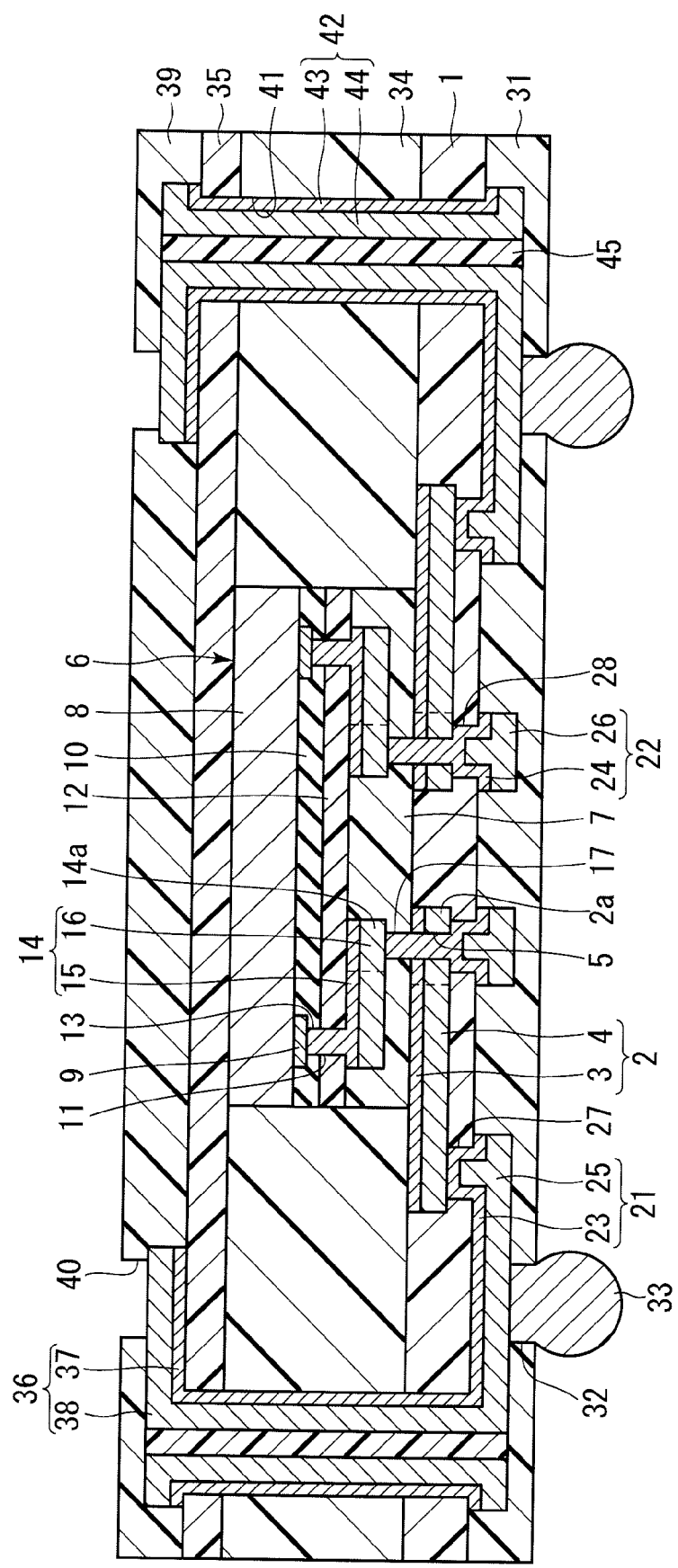
FIG. 1 is a cross-sectional view of a semiconductor device according to the first embodiment of the present invention.

FIG. 1 is a cross-sectional view of a semiconductor device according to a first embodiment of the present invention. The semiconductor device includes an insulating layer 1 of flat square shape made of epoxy system resin, polyimide system resin, glass cloth base material epoxy resin, and the like. A first lower-layer wiring (wiring) 2 is embedded into the top surface side of the lower-layer insulating film (insulating layer) 1 in such a manner that the top surface of the first lower-layer wiring 2 is flush with the top surface of the lower-layer insulating film 1. The first lower-layer wiring 2 has a double-layered structure including a metallic base layer 3 and a metallic upper layer 4. The metallic base layer 3 is made of nickel. The metallic upper layer 4 is made of copper and provided on the bottom surface of the metallic base layer 3. One connection pad section 2a of the first lower-layer wiring 2 is ring shaped having a circular opening section 5 of which the planar shape is circular (see FIG. 3B). The connection pad section 2a is provided at the center of the top surface of the lower-layer insulating film 1.

A semiconductor construct 6 is mounted at the center of the top surface of the lower-layer insulating film 1 including the first lower-layer wiring 2 via an adhesive layer (electrode enveloping layer) 7. The adhesive layer 7 is made of epoxy system resin and the like. The semiconductor construct 6 includes a silicon substrate (semiconductor substrate) 8 of flat square shape. An integrated circuit (not shown) providing a predetermined function is provided on the bottom surface of the silicon substrate 8. A plurality of connection pads 9 connected to the integrated circuit are provided in the periphery of the bottom surface, arrayed along each side. The connection pads 9 are made of aluminum and the like. An insulating film 10 made of silicon oxide and the like is provided on the bottom surface of the silicon substrate 8, excluding the centers of the connection pads 9. The centers of the connection pads 9 are exposed via openings 11 provided on the insulating film 10.

A protective film 12 made of polyimide system resin and the like is provided on the bottom surface of the insulating film 10. Openings 13 are formed on the protective film 12 at sections corresponding to the openings 11 on the insulating film 10. A wiring member 14 is provided on the bottom surface of the protective film 12. The wiring member 14 has a double-layered structure including a metallic base layer 15 and a metallic upper layer 16. The metallic base layer 15 is made of nickel. The metallic upper layer 16 is made of copper and provided on the bottom surface of the metallic base layer 15. One end of the wiring member 14 is connected to a connection pad 9 via an opening 11 on the insulating film 10 and an opening 13 on the protective film 12. Only two wirings 14 are shown in FIG. 1. However, in actuality, a number of wirings 14 corresponding to the number of connection pads 9 arrayed along each side of the silicon substrate 8 of flat square shape is provided. Other ends of the wirings 14 serve as connection pad sections 14a described hereafter, and are arranged to form a matrix on the protective film 12.

The bottom surface of the protective film 12 including the wirings 14 of the semiconductor construct 6 is adhered to the center of the top surface of the lower-layer insulating film 1 including the first lower-layer wiring 2 by the adhesive layer 7 made of epoxy system resin and the like. As a result, the semiconductor construct 6 is mounted at the center of the top surface of the lower-layer insulating film 1 including the first lower-layer wiring 2. Circular openings 17 are formed on the adhesive layer 7 at sections corresponding to the centers of the bottom surfaces of connection pad sections 14a of the wirings 14 of the semiconductor construct 6. An opening 17 on the adhesive layer 7 communicates to an opening 5 formed on the one connection pad section 2a of the first lower-layer wiring 2.

A second lower-layer wiring 21 and a connection pad section (connection conductor) 22 are provided on the bottom surface of the lower-layer insulating film 1. The second lower-layer wiring 21 has a double-layered structure including a metallic base layer 23 and a metallic upper layer 25. The connection pad section 22 has a double-layered structure including a metallic base layer 24 and a metallic upper layer 26. The metallic base layer 23 and the metallic base layer 24 are made of nickel. The metallic upper layer 25 and the metallic upper layer 26 are made of copper and respectively provided on the bottom surface of the metallic base layer 23 and the bottom surface of the metallic base layer 24. One end of the second lower-layer wiring 21 is connected to another connection pad section of the first lower layer wiring 2 via a circular opening 27 provided on the lower-layer insulating film 1.

The connection pad section 22 is connected to the one connection pad section 2a of the first lower-layer wiring 2 via a circular opening 28 provided on the lower-layer insulating film 1. The connection pad section 22 is also connected to a connection pad section 14a of the wiring member 14 of the semiconductor construct 6 via the opening 5 on the one connection pad section 2a of the first lower-layer wiring 2 and the opening 17 on the adhesive layer 7. In other words, the connection pad section 22 connects the one connection pad section 2a of the first lower-layer wiring 2 and the connection pad section 14a of the wiring member 14 of the semiconductor construct 6.

A lower-layer overcoat film 31 made of solder resist and the like is provided on the bottom surfaces of the second lower-layer wiring 21, the connection pad section 22, and the lower-layer insulating film 1. An opening 32 is formed on the lower-layer overcoat film 31 at a section corresponding to a connection pad section of the second lower-layer wiring 21. A solder ball 33 is provided in the opening 32 on the lower-layer overcoat film 31 and below the opening 32 in such a manner to be connected to the connection pad section of the second lower-layer wiring 21.

Around a periphery of the semiconductor construct 6 and the adhesive layer 7, an insulating layer 34 is provided on the top surface of the first lower-layer wiring 2 and the top surface of the lower-layer insulating film 1. The insulating layer 34 is made of epoxy system resin, polyimide system resin, glass cloth base material epoxy resin, and the like. An upper-layer insulating film 35 made of the same material as the lower-layer insulating film 1 is provided on the top surface of the insulating layer 34 and the semiconductor construct 6.

An upper-layer wiring 36 is provided on the top surface of the upper-layer insulating film 35. The upper-layer wiring 36 has a double-layered structure including a metallic base layer 37 and a metallic upper layer 38. The metallic base layer 37 is made of nickel and provided on the top surface of the upper-layer insulating film 35, and the metallic upper layer 38 is made of copper and provided on the top surface of the metallic base layer 37. An upper-layer overcoat film 39 made of solder resist and the like is provided on the top surface of the upper-layer insulating film 35 including the upper-layer wiring 36. An opening 40 is formed on the upper-layer overcoat film 39 at a section corresponding to a connection pad section of the upper-layer wiring 36.

The second lower-layer wiring 21 and the upper-layer wiring 36 are connected via an upper/lower communicating section 42. The upper/lower communicating section 42 is provided on the inner wall surface of a through-hole 41, and the through-hole 41 is provided in predetermined sections of the lower-layer insulating film 1, the insulating layer 34, and the upper-layer insulating film 35. The upper/lower communicating section 42 has a double-layered structure including a metallic base layer 43 and a metallic upper layer 44. The metallic base layer 43 is made of nickel and provided on the inner wall surface of the through-hole 41. The metallic upper layer 44 is made of copper and provided on the inner surface of the metallic base layer 43. The upper/lower communicating section 42 is filled with a filler material 45 made of solder resist and the like.

Next, an example of a manufacturing method of the semiconductor device will be described. First, as shown in FIG. 2, a base plate 51 made of copper foil, on the bottom surface of which a first metallic base layer formation layer 3a for lower-layer wiring and a first metallic upper layer formation layer 4a for lower-layer wiring are formed, is prepared. The first metallic base layer formation layer 3a for lower-layer wiring is made of electroless nickel plating. The first metallic upper layer formation layer 4a for lower-layer wiring is made of electrolytic nickel plating. Here, the prepared base plate 51 is of a size allowing a plurality of completed semiconductor devices shown in FIG. 1 to be formed thereon.

Next, the first metallic base layer formation layer 3a for lower-layer wiring and the first metallic upper layer formation layer 4a for lower-layer wiring are patterned by photolithography method. As a result, the first lower-layer wiring 2 having a double-layered structure including the metallic base layer 3 and the metallic upper layer 4 is formed on the bottom surface of the base plate 51 as shown in FIG. 3A and FIG. 3B which is a bottom surface view of FIG. 3A. In this condition, the opening 5 is formed in the center of the one connection pad section 2a of the first lower-surface wiring 2.

A formation method of the first lower-layer wiring 2 may be as follows. First, the base plate 51 in FIG. 2, on the bottom surface of which only the first metallic base layer formation layer 3a for lower-layer wiring is formed and the first metallic upper layer formation layer 4a for lower-layer wiring is not formed, is prepared. A plated resist film is provided on the bottom surface of the first metallic base layer formation layer 3a for lower-layer wiring, and a pattern is formed on the plated resist film in which an area corresponding to the first lower-layer wiring 2 including the connection pad section 2a is removed.

Next, the metallic upper layer 4 including the opening 5 is formed on the bottom surface of the first metallic base layer formation layer 3a for lower-layer wiring by electrolytic copper plating in which the first metallic base layer formation layer 3a for lower-layer wiring serves as a plating current path. Next, the plated resist film is removed. Then, with the metallic upper layer 4 as a mask, unnecessary sections of the first metallic base layer formation layer 3a for lower-layer wiring are removed by etching, and the metallic base layer 3 including the opening 5 is formed on the top surface of the metallic upper surface 4. As a result, the first lower-layer wiring 2 is formed. A formation method such as this is referred to, hereafter, as a pattern-plating method.

Next, a visual inspection or a conductivity inspection is performed on the first lower-layer wiring 2. When the inspection indicates that the first lower-layer wiring 2 is formed as expected in a plurality of semiconductor device formation areas under the base plate 51, the semiconductor device formation areas are judged to be non-defective. When the first lower-layer wiring 2 is not formed as expected, the semiconductor device formation areas are judged to be defective. A semiconductor device formation area judged to be non-defective is identified as a non-defective semiconductor device formation area, and a semiconductor device formation area judged to be defective is identified as a defective semiconductor device formation area.

Figure 4:
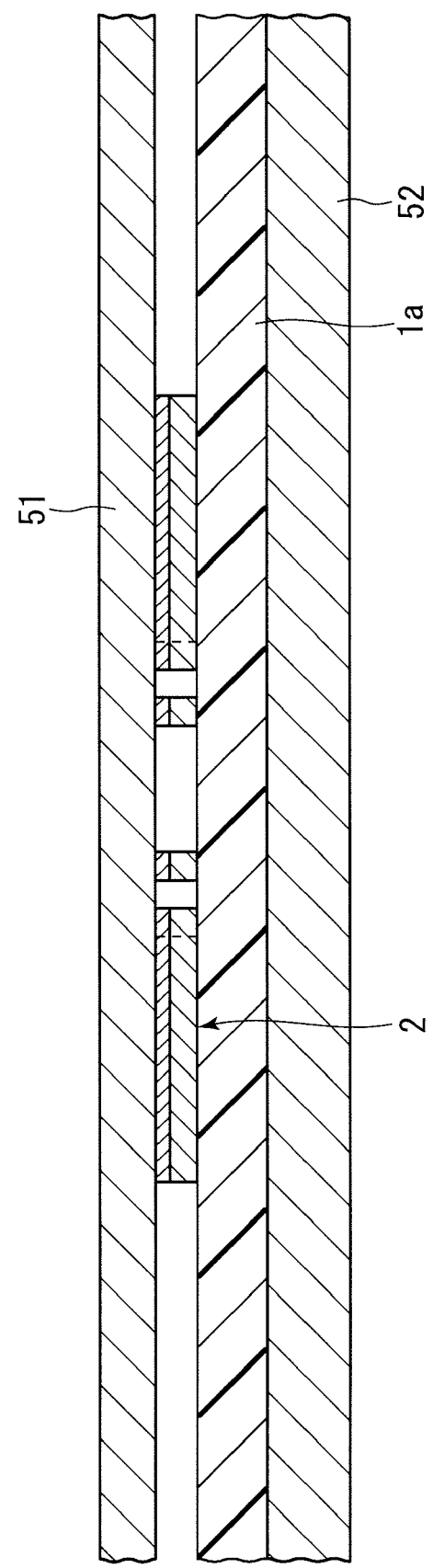
FIG. 4 is a cross-sectional view of a procedure performed after that in FIG. 3A and FIG. 3B.

Next, as shown in FIG. 4, a lower-layer insulating film formation sheet 1a made of epoxy system resin, polyimide system resin, glass fabric resin, and the like is disposed on the top surface of another base plate 52 made of copper foil. In this case, a thermosetting resin composed of epoxy system resin and the like in the lower-layer insulating film forming sheet 1a is in a semi-hardened state. Next, the base plate 51, on the bottom surface of which the first lower-layer wiring 2 is formed, as shown in FIG. 3A and FIG. 3B, is disposed on the top surface of the lower-layer insulating film formation sheet 1a.

Figure 5:
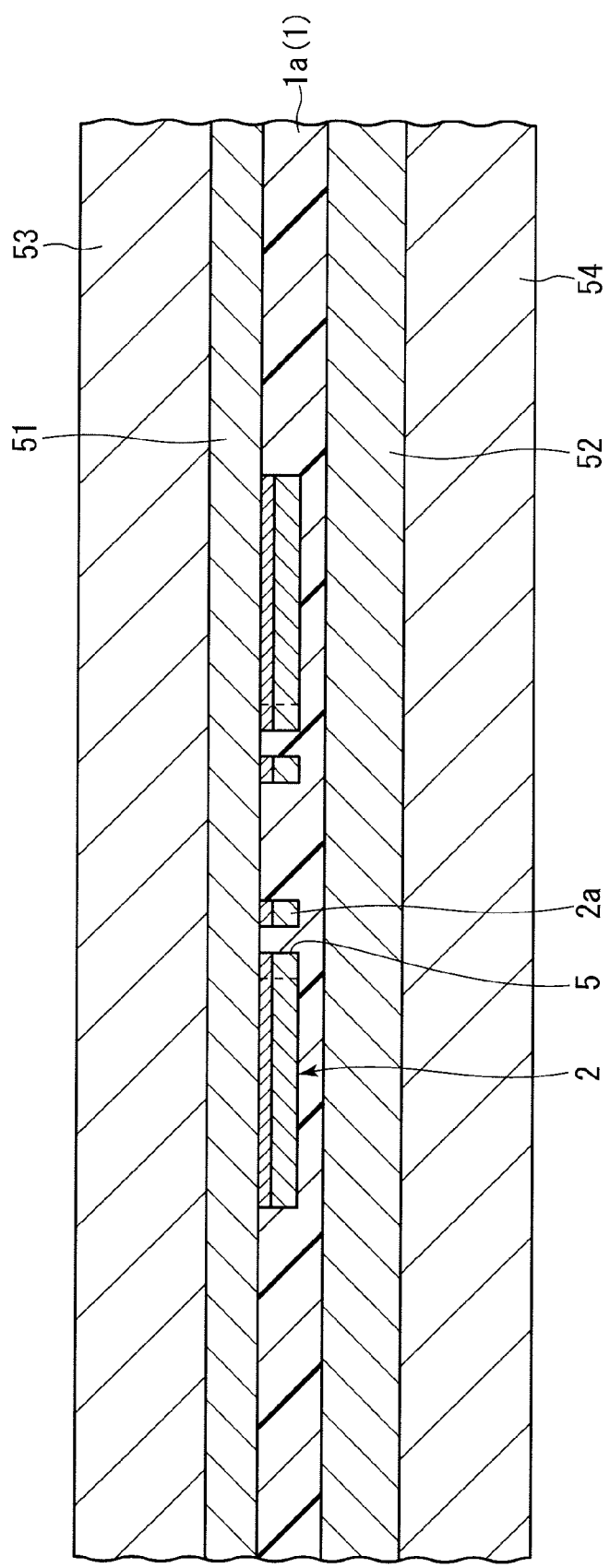
FIG. 5 is a cross-sectional view of a procedure performed after that in FIG. 4.

Next, as shown in FIG. 5, the lower-layer insulating film formation sheet (insulating film formation sheet) 1a is heat-compressed from the upper and lower sides by a pair of heat-compression plates 53 and 54. As a result of the lower-layer insulating film formation sheet 1a being heat-compressed, the thermosetting resin in the lower-layer insulating film formation sheet 1a flows and then hardens by subsequent cooling. As a result, the lower-layer insulating film 1 is formed between the two base plates 51 and 52, and the first lower-layer wiring 2 is embedded on the top surface side of the lower-layer insulating film 1. According to the first embodiment, because the first lower-layer wiring 2 is embedded on the top surface side of the lower-layer insulating film 1 as above, the thickness of the completed semiconductor device can be reduced.

Figure 6:
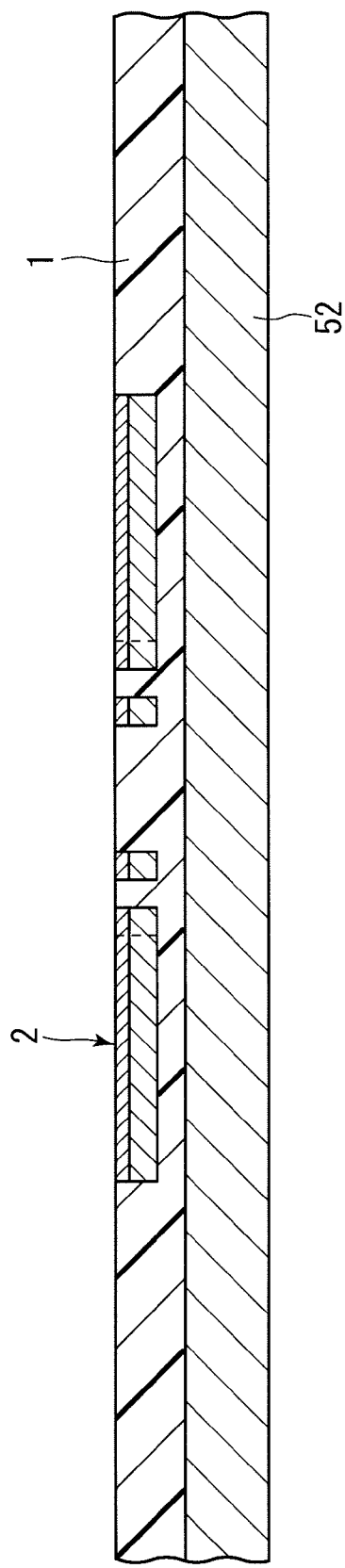
FIG. 6 is a cross-sectional view of a procedure performed after that in FIG. 5.

Next, when the base plate 51 on the upper side is removed by etching, as shown in FIG. 6, the top surface of the lower-layer insulating film 1 including the first lower-layer wiring 2 is exposed. In this condition, the top surface of the first lower-layer wiring 2 is flush with the top surface of the lower-layer insulating film 1. In addition, the lower-layer insulating film 1 fills the opening 5 of the one connection pad section 2a of the first lower-layer wiring 2. Note that the visual inspection or the conductivity inspection can be performed on the first lower-layer wiring 2 at this point.

Figure 7:
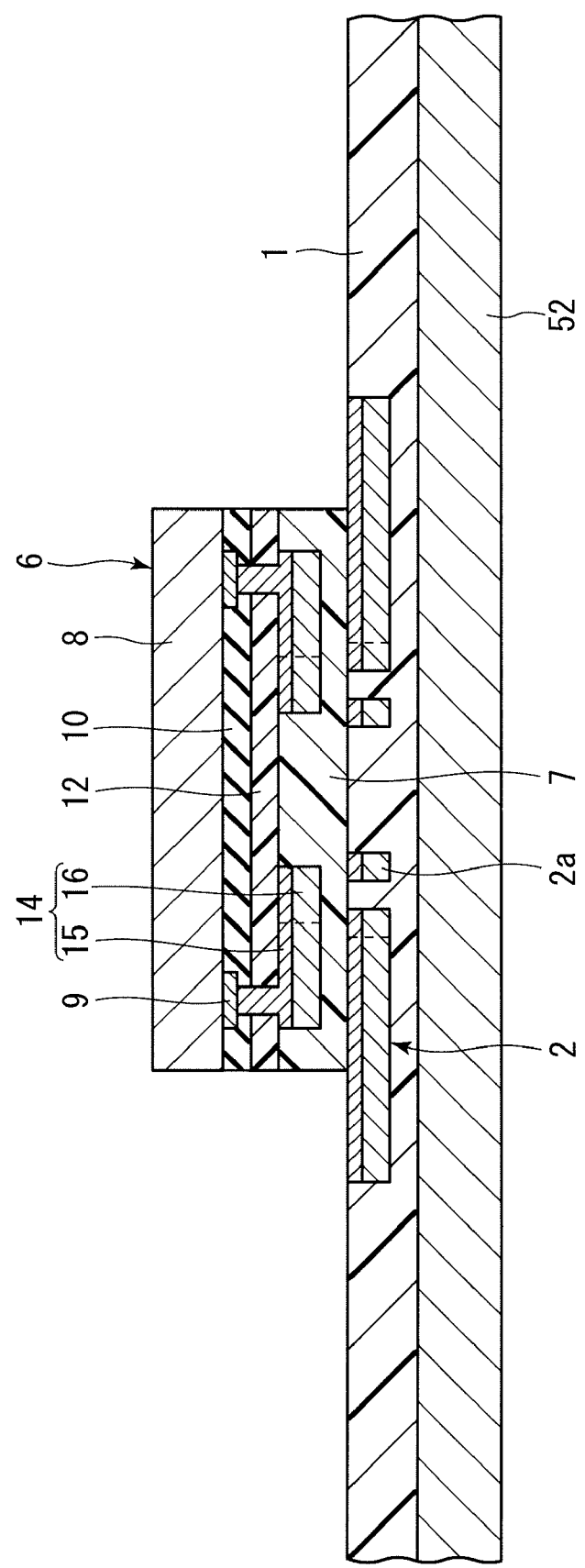
FIG. 7 is a cross-sectional view of a procedure performed after that in FIG. 6.

Next, as shown in FIG. 7, the semiconductor construct 6 is prepared as follows. First, the integrated circuit (not shown), the connection pads 9 made of aluminum and the like, the insulating film 10 made of silicon oxide and the like, the protective film 12 made of polyimide system resin and the like, and the wirings 14 (the metallic base layer 15 made of nickel and the metallic upper layer 16 made of copper) are formed under a silicon substrate 8 that is in a wafer state. Then, the laminate is separated into pieces by dicing.

Next, the bottom surface of the protective film 12 including the wirings 14 of the semiconductor construct 6 is adhered to the semiconductor construct mounting area of the top surface of the lower-layer insulating film 1 including the first lower-layer wiring 2 by the adhesive layer 7 made of epoxy system resin and the like. As a result, the semiconductor construct 6 is mounted. In this case, an adhesive material referred to as a non-conductive paste (NCP) is provided in advance on the semiconductor construct mounting area of the top surface of the lower-layer insulating film 1 and the first lower-layer wiring 2 using a printing method, a dispenser, and the like. Alternatively, an adhesive sheet, referred to as a non-conductive film (NCF), is provided in advance on the semiconductor construct mounting area of the top surface of the lower-layer insulating film 1 and the first lower-layer wiring 2. Then, the semiconductor construct 6 is fixed to the top surface of the lower-layer insulating film 1 including the first lower-layer wiring 2 by heat compression.

Here, a visual inspection or a conductivity inspection is performed on the first lower-layer wiring 2, and a plurality of semiconductor device formation areas on the top surface of the lower-layer insulating film 1 including the first lower-layer wiring 2 are identified as non-defective semiconductor device formation areas or defective semiconductor device formation areas, as described above. Therefore, the semiconductor construct 6 is mounted only on non-defective semiconductor device formation areas and not on defective semiconductor device formation areas.

Figure 8:
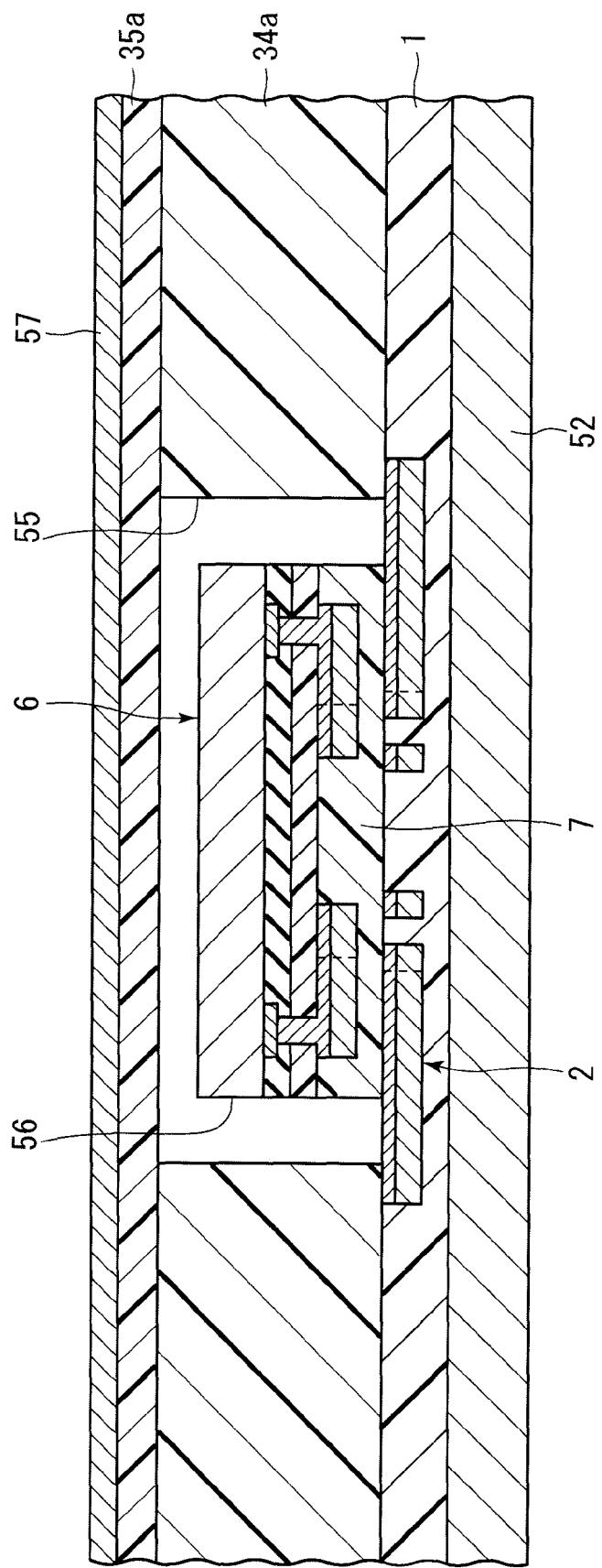
FIG. 8 is a cross-sectional view of a procedure performed after that in FIG. 7.

Next, as shown in FIG. 8, a lattice-shaped insulating layer formation sheet 34a is disposed on the top surface of the lower-layer insulating film 1 including the first lower-layer wiring 2 around a periphery of the semiconductor construct 6 including the adhesive layer 7, while being positioned with a pin and the like. The insulating layer formation sheet 34a is, for example, formed as follows. First, a substrate made of glass fabric and the like is saturated with thermosetting resin composed of epoxy system resin and the like. Next, the thermosetting resin is semi-hardened, and the substrate is formed into a sheet. Then, a plurality of square openings 55 are formed on the sheet by punching and the like. The size of the opening 55 on the insulating layer formation sheet 34a is slightly larger than the size of the semiconductor construct 6. Therefore, a gap 56 is formed between the insulating layer formation sheet 34a and the semiconductor construct 6.

Next, a sub-base plate 57 made of copper foil, on the bottom surface of which an upper-layer insulating film formation layer 35a is formed, is disposed on the top surface of the insulating layer formation sheet 34a. The upper-layer insulating film formation layer 35a is made of the same material as the lower-layer insulating film 1. The thermosetting resin composed of epoxy system resin and the like in the upper-layer insulating film formation layer 35a is semi-hardened.

Figure 9:
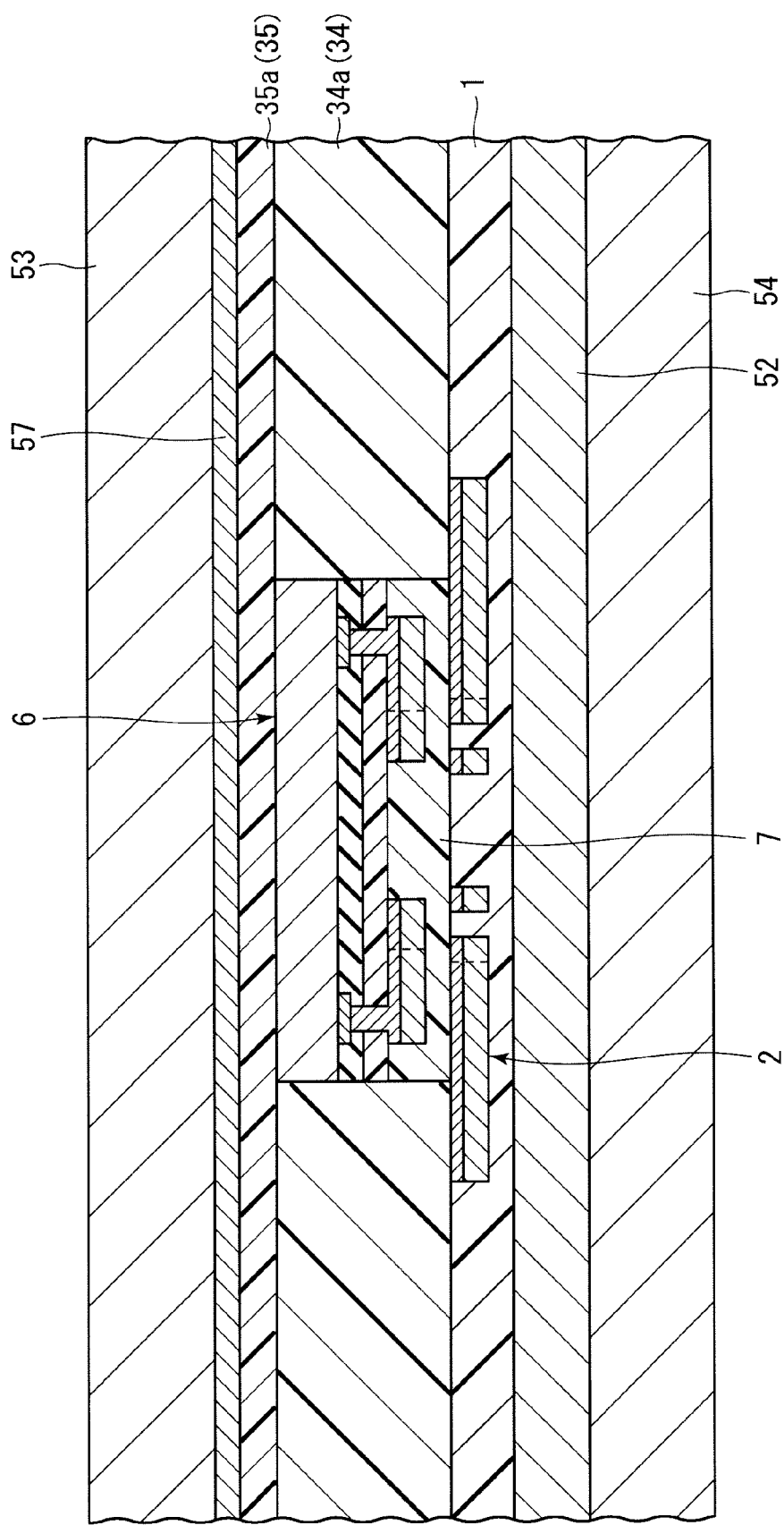
FIG. 9 is a cross-sectional view of a procedure performed after that in FIG. 8.

Next, as shown in FIG. 9, the insulating layer formation sheet 34a and the upper-layer insulating film formation layer 35a are heat-compressed from the upper and lower sides by a pair of heat-compression plates 53 and 54. As a result of heat compression, the thermosetting resin in the insulating layer formation sheet 34a and the upper-layer insulating film formation layer 35a flows and fills the gap 56 shown in FIG. 8. Then, after the thermosetting resin is hardened by subsequent cooling, the insulating layer 34 is formed on the top surface of the lower-layer insulating film 1 including the first lower-layer wiring 2 around a periphery of the semiconductor construct 6 including the adhesive layer 7. The upper-layer insulating film 35 is also formed on the top surface of the insulating layer 34 and the semiconductor construct 6.

Here, as shown in FIG. 8, the lower-layer insulating film 1 and the base plate 52 are disposed on the bottom surface of the insulating layer formation sheet 34a. Also, the upper-layer insulating film formation layer 35a formed from the same material as the lower-layer insulating film 1 and the sub-base plate 57 formed from the same material as the base plate 52 are disposed on the top surface of the insulating layer formation sheet 34a. Therefore, the material compositions of the insulating layer formation sheet 34a section in a thickness direction are symmetrical. As a result, because of heat compression, the insulating layer formation sheet 34a and the upper-layer insulating film formation layer 35a symmetrically harden and contract in the thickness direction. Overall, warping does not easily occur, and problems regarding transportation to the subsequent procedures and processing accuracy at the subsequent procedures do not easily occur.

In this case, because the thermosetting resin in the lower-layer insulating film 1 is hardened in advance, the lower-layer insulating film 1 is barely deformed even after heat compression. The sub-base plate 57 prevents the thermosetting resin in the upper-layer insulating film formation layer 35a from unnecessarily adhering to the bottom surface of the heat-compression plate 53 on the upper side. As a result, the heat-compression plate 53 can be reused as it is.

Figure 10:
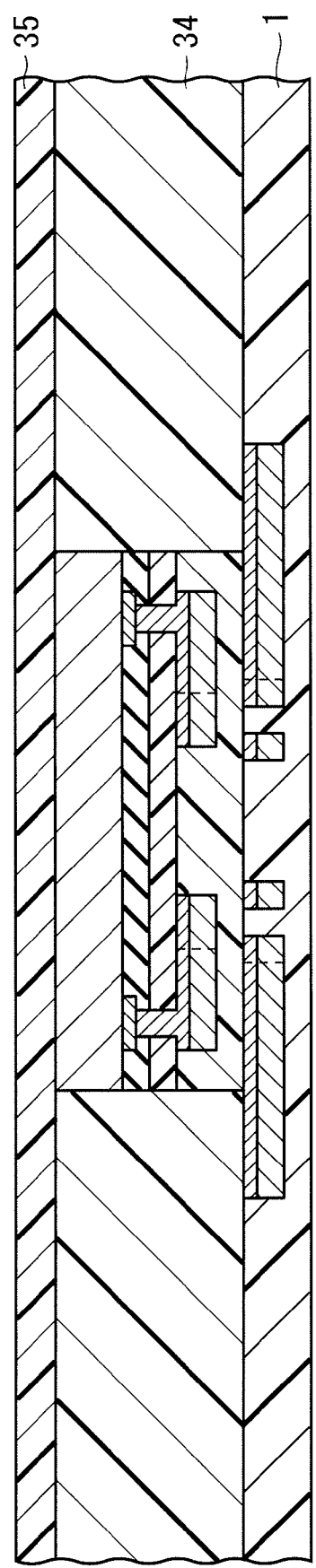
FIG. 10 is a cross-sectional view of a procedure performed after that in FIG. 9.

Next, when the base plate 52 and the sub-base plate 57 are removed by etching, as shown in FIG. 10, the bottom surface of the lower-layer insulating film 1 is exposed, and the top surface of the upper-layer insulating film 35 is also exposed. In this condition, even when the base plate 52 and the sub-base plate 57 are removed, strength is sufficiently obtainable because of the presence of the lower-layer insulating film 1, the insulating layer 34, and the upper-layer insulating film 35. As described above, according to the first embodiment, because the base plate 52 and the sub-base plate 57 required during the manufacturing process are removed by etching, the thickness of the completed semiconductor device can be reduced.

Figure 11:
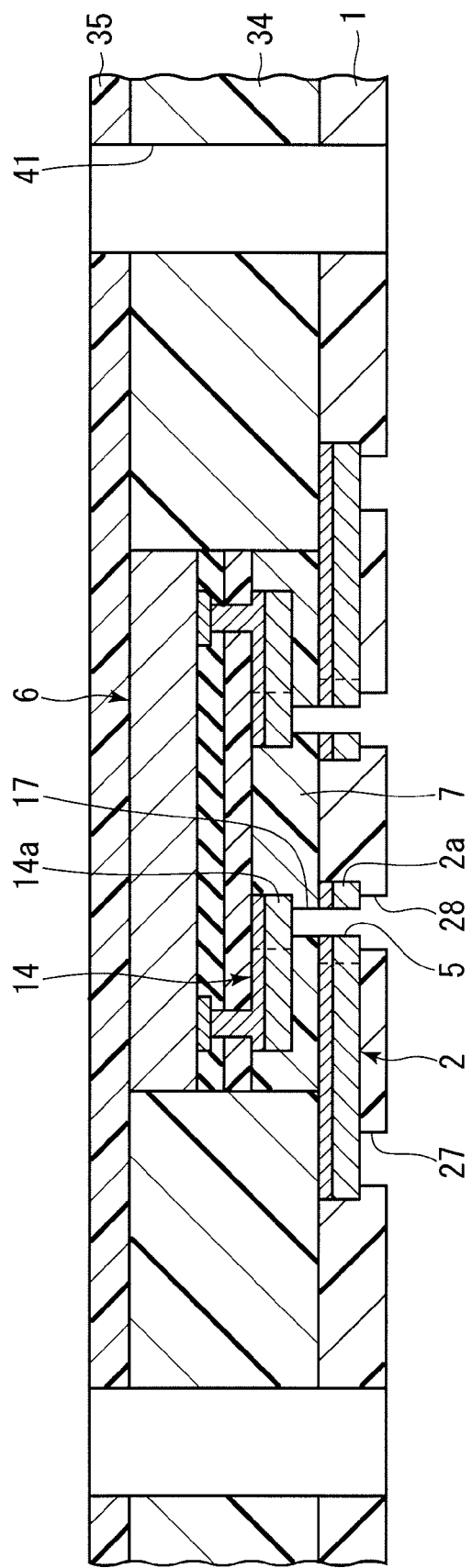
FIG. 11 is a cross-sectional view of a procedure performed after that in FIG. 10.

Next, as shown in FIG. 11, by laser processing performed by laser beam irradiation, the opening 28 and the opening 27 are formed on the lower-layer insulating film 1 at sections corresponding to the center of each bottom surface of the one connection pad section 2a and the other connection pad section of the first lower-layer wiring 2. In addition, the lower-layer insulating film 1 in the opening 5 of the one connection pad section 2a of the first lower-layer wiring 2 is removed. At the same time, the opening 17 is formed on the adhesive layer 7 at a section corresponding to the center of the bottom surface of the connection pad section 14a of the wiring member 14 of the semiconductor construct 6. The through-hole 41 is formed in predetermined sections of the lower-layer insulating film 1, the insulating layer 34, and the upper-layer insulating film 35 using a mechanical drill or laser processing performed by laser beam irradiation.

Here, an explanation regarding cases where the opening 27, the opening 28, and the opening 17 are formed by laser beam irradiation will be described. When a laser beam is irradiated onto the lower-layer insulating film 1, the opening 27 and the opening 18 of a size corresponding to the beam diameter of the laser beam are formed. Here, the diameter of the connection pad section 14a of the wiring member 14 of the semiconductor construct 6 is smaller than the outer diameter and larger than the inner diameter (diameter of the opening 5) of the one connection pad section 2a of the first lower-layer wiring 2 Therefore, when the beam diameter of the laser beam is the same size as the diameter of the connection pad section 14a of the wiring member 14 of the semiconductor construct 6 or more, and less than the outer diameter of the one connection pad section 2a of the first lower-layer wiring 2, the laser beam irradiated outside of the opening 5 of the connection pad section 2a is blocked by the connection pad section 2a. Thus, the diameter of the opening 17 formed on the adhesive layer 7 is a size based on the diameter of the opening 5 of the one connection pad section 2a of the first lower-layer wiring 2.

In other words, because the one connection pad section 2a of the first lower-layer wiring 2 has the opening 5 in the center thereof, the connection pad section 2a serves as a mask when the opening 17 is formed on the adhesive layer 7 by laser beam irradiation. The opening 17 that is self-aligned with the opening 5 of the connection pad section 2a and has a same diameter as that of the opening 5 of the connection pad section 2a is formed on the adhesive layer 7.

As a result, the diameter of the opening 17 to be formed on the adhesive layer 7 can be reduced to a minimum. In addition, positioning of the connection pad section 14a of the wiring member 14 of the semiconductor construct 6 in relation to the one connection pad section 2a of the first lower-layer wiring 2 can be performed with relative ease. Moreover, the diameter of the connection pad section 14a of the wiring member 14 of the semiconductor construct 6 can be reduced to a minimum, allowing the miniaturization of the semiconductor construct 6.

For example, under the current method, the beam diameter of a laser beam is a minimum of about 50 μm, and the diameters of the opening 27 and the opening 28 formed on the lower-layer insulating film 1 are about 70 μm. Therefore, to fully receive the laser beam irradiated, the diameter of the connection pad section 14a of the wiring member 14 of the semiconductor construct 6 is required to be about 100 μm to 120 μm under the current method, in view of laser processing accuracy.

On the other hand, in the method according to the first embodiment in which the connection pad section 2a of the first lower-layer wiring 2 serves as a mask for a laser beam, the diameter of the opening 5 of the one connection pad section 2a of the first lower-layer wiring 2 formed by photolithography method can be 20 μm to 50 μm, and more particularly 20 μm to 30 μm. Therefore, the diameter of the connection pad section 14a of the wiring member 14 of the semiconductor construct 6 can be 50 μm to 80 μm, and more particularly 50 μm to 60 μm, allowing the miniaturization of the semiconductor construct 6.

Figure 12:
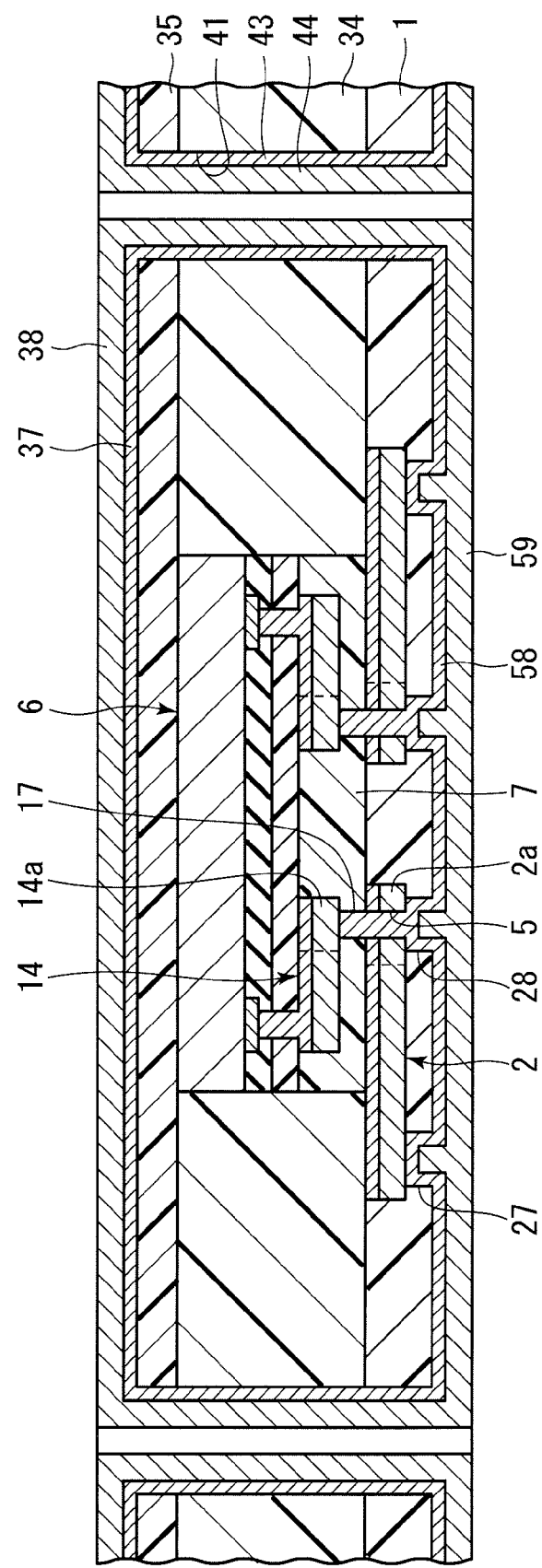
FIG. 12 is a cross-sectional view of a procedure performed after that in FIG. 11.

Next, as shown in FIG. 12, a metallic base layer 58, a metallic base layer 37, and a metallic base layer 43 are formed by non-electrolytic copper plating. The metallic base layer 58 is formed on the bottom surfaces of both connection pad sections of the first lower-layer wiring 2 exposed via the opening 27 and the opening 18 on the lower-layer insulating film 1, the bottom surface of the connection pad section 14a of the wiring member 14 of the semiconductor construct 6 exposed via the opening 5 of the one connection pad section 2a of the first lower-layer wiring 2 and the opening 17 of the adhesive layer 7, and the overall bottom surface of the lower-layer insulating film 1. The metallic base layer 37 is formed on the overall top surface of the upper-layer insulating film 35. The metallic base layer 43 is formed on the inner wall surface of the through-hole 41. Next, by electrolytic copper plating in which the metallic base layer 58, the metallic base layer 37, and the metallic base layer 43 serve as the plating current paths, a metallic upper layer 59, a metallic upper layer 38, and a metallic upper layer 44 are respectively formed on the surfaces of the metallic base layer 58, the metallic base layer 37, and the metallic base layer 43.

Figure 13:
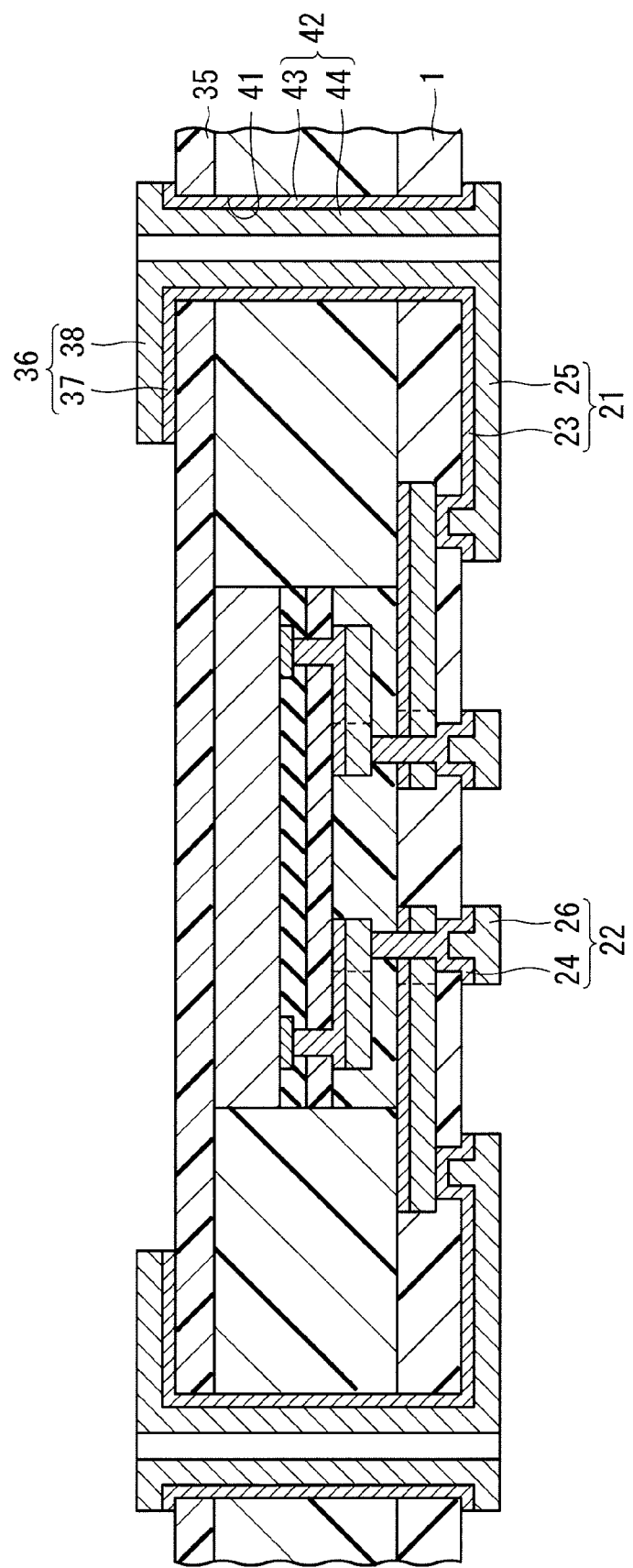
FIG. 13 is a cross-sectional view of a procedure performed after that in FIG. 12.

Next, the metallic upper layer 59, the metallic upper layer 38, the metallic base layer 58, and the metallic base layer 37 are patterned by photolithography method using the same mask, a result of which is shown in FIG. 13. In other words, the second lower-layer wiring 21 having a double-layered structure including the metallic base layer 23 and the metallic upper layer 25, and the connection pad section 22 having a double-layered structure including the metallic base layer 24 and the metallic upper layer 26 are formed on the bottom surface of the lower-layer insulating film 1. Also, the upper-layer wiring 36 having a double-layered structure including the metallic base layer 37 and the metallic upper layer 38 is formed on the top layer of the upper-layer insulating film 35. Moreover, the upper/lower communicating section 42 having a double-layered structure including the metallic base layer 43 and the metallic upper layer 44 is formed on the inner wall surface of the through-hole 41. Note that the second lower-layer wiring 21, the connection pad section 22, the upper-layer wiring 36, and the upper/lower communicating section 42 can be formed by pattern plating method used to form the metallic upper layer 59, the metallic upper layer 38, and the metallic upper layer 44 by electrolytic plating, after a plated resist layer in which metallic upper layer formation areas are removed is formed on the metallic base layer 58 and the metallic base layer 37.

Figure 14:
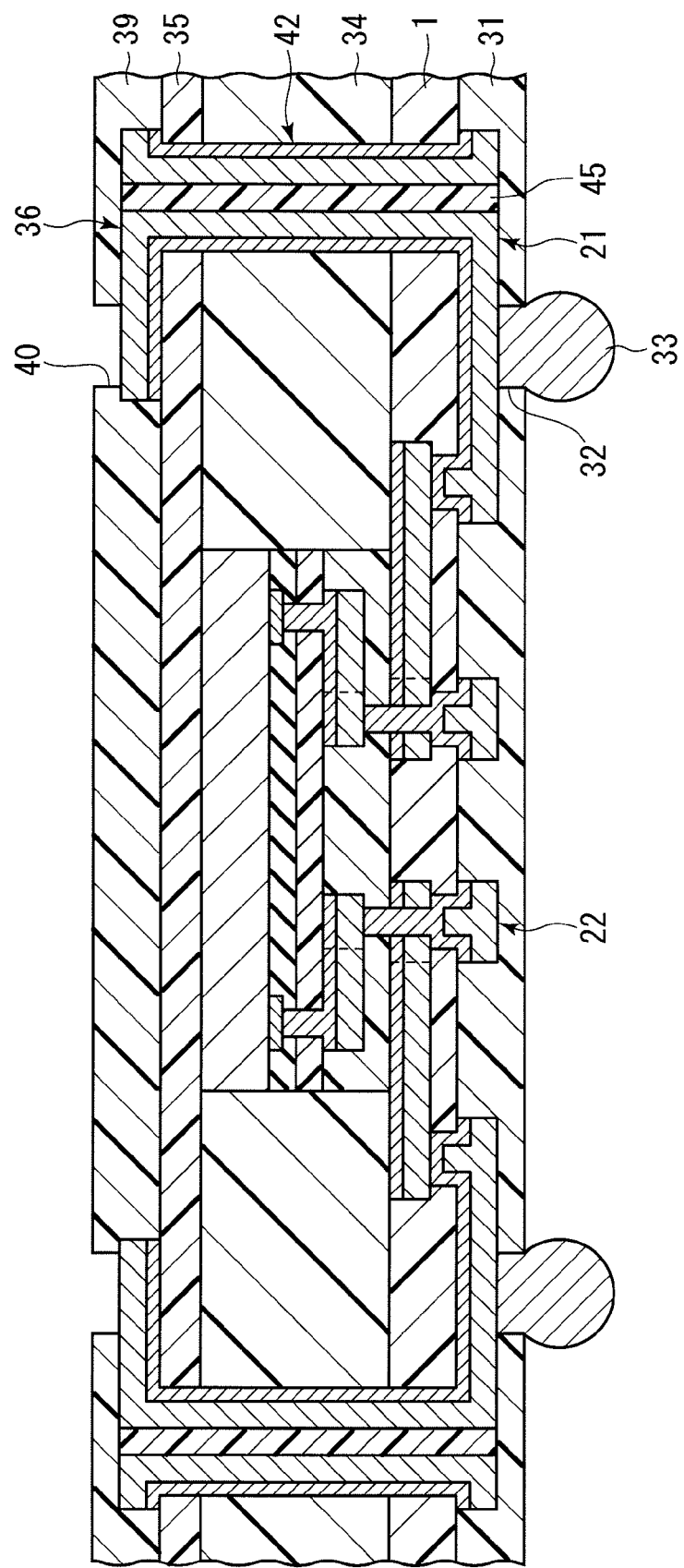
FIG. 14 is a cross-sectional view of a procedure performed after that in FIG. 13.

Next, as shown in FIG. 14, the lower-layer overcoat film 31 made of solder resist and the like is formed on the bottom surface of the second lower-layer wiring 21, the connection pad section 22, and the lower-layer insulating film 1 by screen printing method, spin-coat method, and the like. In addition, the upper-layer overcoat film 39 made of solder resist and the like is formed on the upper-layer wiring 36 and the upper-layer insulating film 35 by screen printing method, spin-coat method, and the like. In this condition, the upper/lower communicating section 42 is filled with the filler material 45 made of solder resist and the like.

Next, the opening 32 is formed on the lower-layer overcoat film 31 in a section corresponding to the connection pad section of the second lower-layer wiring 21 by laser processing performed by laser beam irradiation. The opening 40 is formed on the upper-layer overcoat film 39 in a section corresponding to the connection pad section of the upper-layer wiring 36 by laser processing performed by laser beam irradiation.

Next, the solder ball 33 is formed in the opening 32 of the lower-layer overcoat film 31 and below the opening 32 in such a manner to be connected to the connection pad section of the second lower-layer wiring 21. Next, the lower-layer overcoat film 31, the lower-layer insulating film 1, the insulating layer 34, the upper-layer insulating film 35, and the upper-layer overcoat film 39 are cut between mutually adjacent semiconductor constructs 6. As a result, a plurality of semiconductor devices shown in FIG. 1 is obtained. In this case, as described above, the semiconductor construct 6 is not mounted on the defective semiconductor device formation areas. Therefore, in addition to semiconductor devices including the semiconductor construct 6, semiconductor devices that do not include the semiconductor construct 6 are also obtained.

As described above, in this semiconductor device manufacturing method, a visual inspection or a conductivity inspection of the first lower-layer wiring 2 is performed, and the non-defective semiconductor device formation areas and the defective semiconductor device formation areas are identified, before the semiconductor construct 6 is mounted. Then, the semiconductor construct 6 is only mounted on the non-defective semiconductor device formation areas. Therefore, in addition to the semiconductor devices including the semiconductor construct 6 shown in FIG. 1, the semiconductor devices that do not include the semiconductor construct 6 are also obtained.

As a result, even when the yield of first lower-layer wiring 2 formation is low, the yield of the semiconductor device including the semiconductor construct 6 can be improved, and the expensive semiconductor constructs 6 can be effectively used. Moreover, in view of the first lower-layer wiring 2, the yield can be improved even with the 30 μm to 50 μm rule and the 15 μm to 25 μm rule.

With reference to FIG. 6, the first lower-layer wiring 2 having a double-layered structure including the metallic base layer 3 and the metallic upper layer 4 can be formed by the first metallic base layer formation layer for lower-layer wiring made of electroless nickel plating and the first metallic upper layer formation layer for lower-layer wiring made of electrolytic copper plating being formed on the top surface of the lower-layer insulating film 1 formed on the top surface of the base plate 52, and patterning being performed. In this case, to improve adhesion between the first lower-layer wiring 2 and the lower-layer insulating film 1, the top surface of the lower-layer insulating film 1 is required to be a roughened surface (rough surface) by surface-roughening process being performed in advance. However, when the top surface of the lower-layer insulating film 1 is rough, the miniaturization of the first lower-layer wiring 2 formed on the top surface of the lower-layer insulating film 1 is limited, and a 40 μm-rule or less is difficult to achieve.

On the other hand, in the above-described semiconductor device manufacturing method, as shown in FIG. 2, the first lower-layer wiring 2 having the double-layered structure including the metallic base layer 3 and the metallic upper layer 4 can be formed by the first metallic base layer formation layer 3a for lower-layer wiring made of electroless nickel plating and the first metallic upper layer formation layer 4a for lower-layer wiring made of electrolytic copper plating being formed on the top surface of the lower-layer insulating film 1 formed on the bottom surface of the base plate 51, and patterning being performed. Then, after the procedures shown in FIG. 4 and FIG. 5 are performed, the first lower-layer wiring 2 is embedded on the top surface side of the lower-layer insulating film 2 formed on the top surface of the other base plate 52 as shown in FIG. 6.

In this case, as shown in FIG. 2, the first metallic base layer formation layer 3a for lower-layer wiring made of electroless nickel plating is formed on the bottom surface of the base plate 51 made of copper foil. Therefore, even when the bottom surface of the base plate 51 is flat, the adhesion between the first metallic base layer formation layer 3a for lower-layer wiring and the base plate 51 becomes favorable. As a result, the miniaturization of the first lower-layer wiring 2 formed on the flat bottom surface of the base plate 51 can be facilitated, and a 40 μm-rule or less can be achieved.

Second Embodiment

Figure 15:
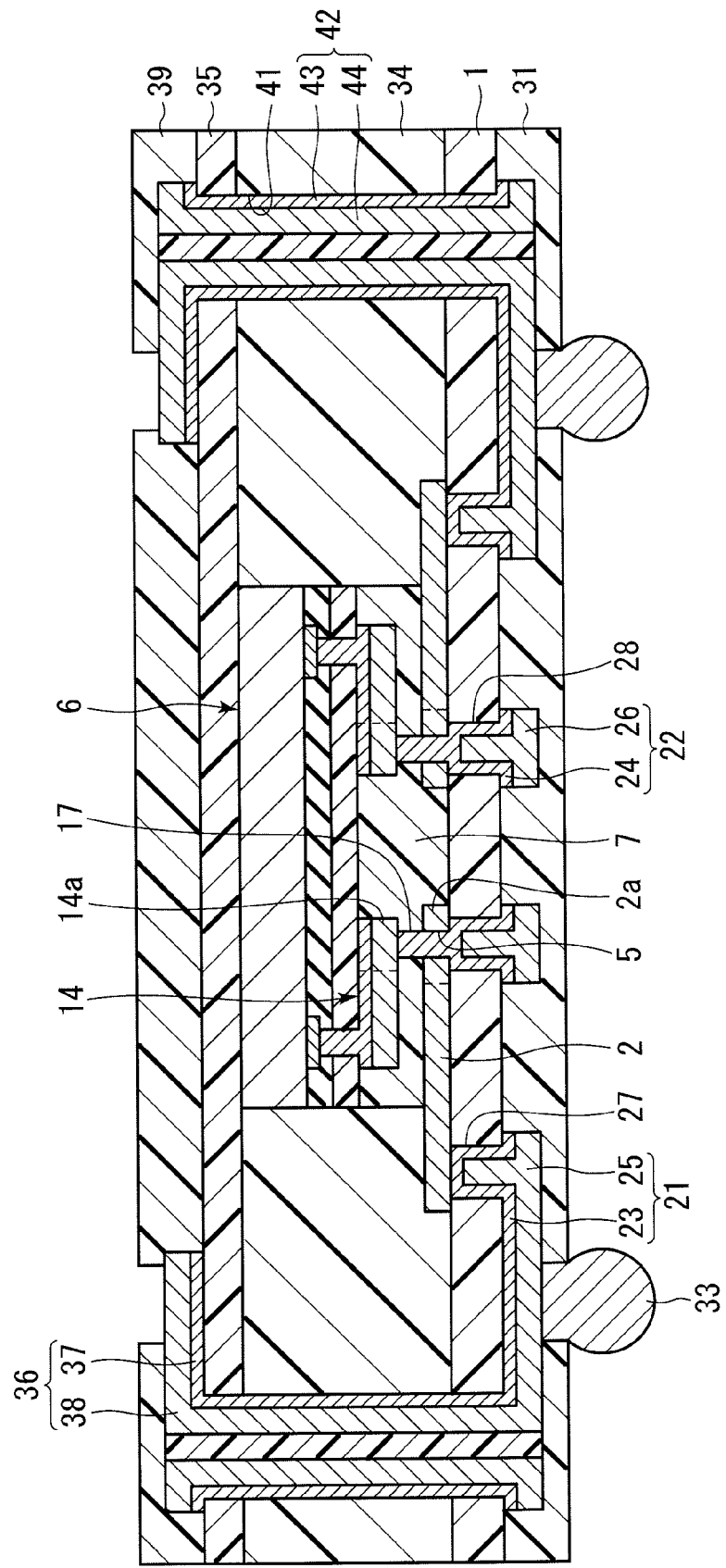
FIG. 15 is a cross-sectional view of a semiconductor device according to the second embodiment of the present invention.

FIG. 15 is a cross-sectional view of a semiconductor device according to the second embodiment of the present invention. The semiconductor device according to the second embodiment differs from the semiconductor device shown in FIG. 1 in that the first lower-layer wiring 2 has a single-layer structure including only a copper layer, and the first lower-layer wiring 2 is provided on the top surface of the lower-layer insulating film 1.

Figure 16:
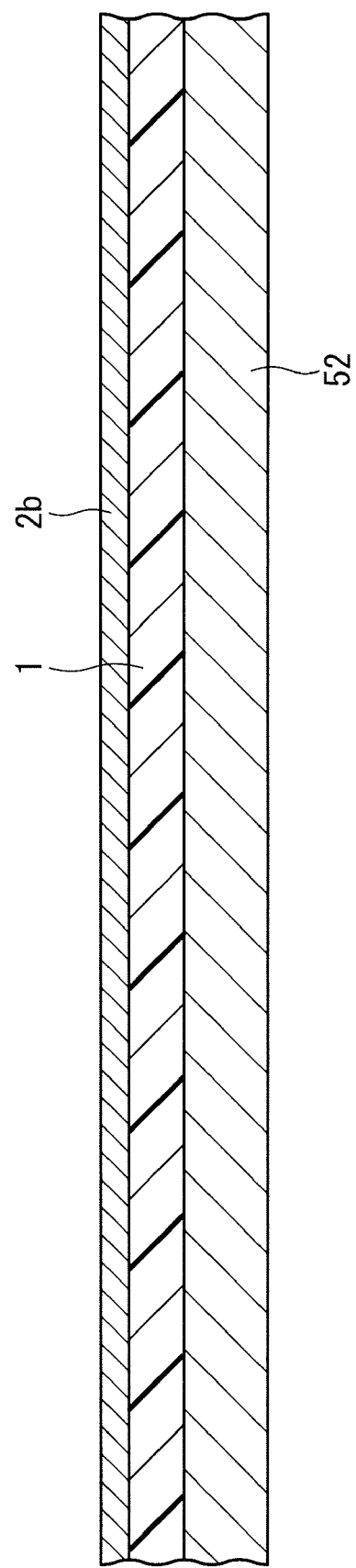
FIG. 16 is a cross-sectional view of an initially prepared semiconductor device in an example of a manufacturing method of the semiconductor device shown in FIG. 15.

Next, an example of a manufacturing method of the semiconductor device will be described. First, as shown in FIG. 16, the base plate 52 made of copper foil, on the top surface of which the lower-layer insulating film 1 and the first lower-layer wiring formation layer 2b are formed, is prepared. The lower-layer insulating film 1 is made of epoxy system resin, polyimide system resin, glass cloth base material epoxy resin, and the like, and the first lower-layer wiring formation layer 2b is made of copper foil. In this case as well, the prepared base plate 52 is of a size allowing a plurality of completed semiconductor devices shown in FIG. 15 to be formed thereon. Thermosetting resin composed of epoxy system resin and the like in the lower-layer insulating film 1 is already hardened.

Figure 17:
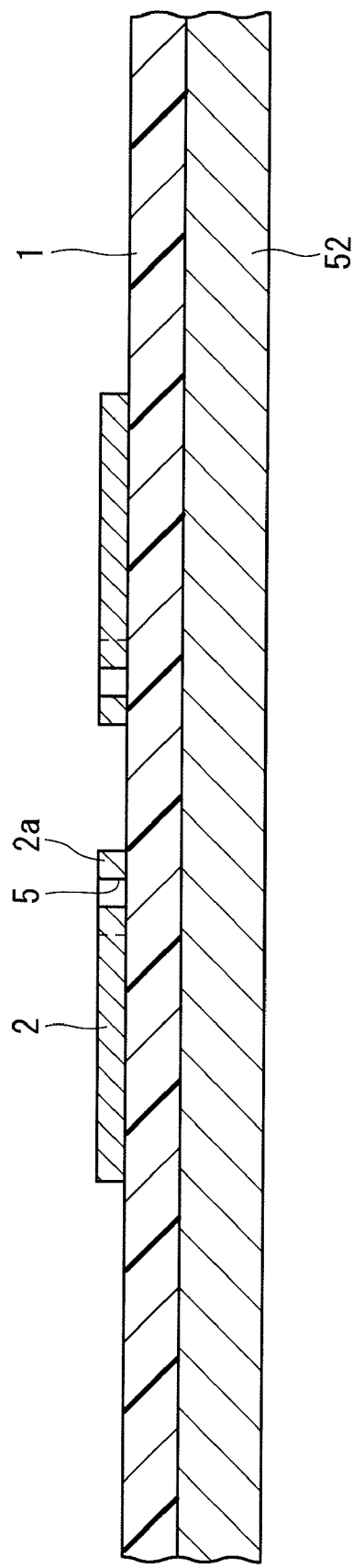
FIG. 17 is a cross-sectional view of a procedure performed after that in FIG. 16.

Next, the first lower-layer wiring formation layer 2b is patterned by photolithography method. As a result, the first lower-layer wiring 2 including only the copper layer is formed on the top surface of the lower-layer insulating film 1, as shown in FIG. 17. In this condition, a circular hole 5 is formed in the center of the one connection pad section 2a of the first lower-surface wiring 2.

Next, a visual inspection or a conductivity inspection is performed on the first lower-layer wiring 2. When the inspection indicates that the first lower-layer wiring 2 is formed as expected in a plurality of semiconductor device formation areas on the base plate 52, the semiconductor device formation areas are judged to be non-defective. When the first lower-layer wiring 2 is not formed as expected, the semiconductor device formation areas are judged to be defective. A semiconductor device formation area judged to be non-defective is identified as a non-defective semiconductor device formation area, and a semiconductor device formation area judged to be defective is identified as a defective semiconductor device formation area.

Figure 18:
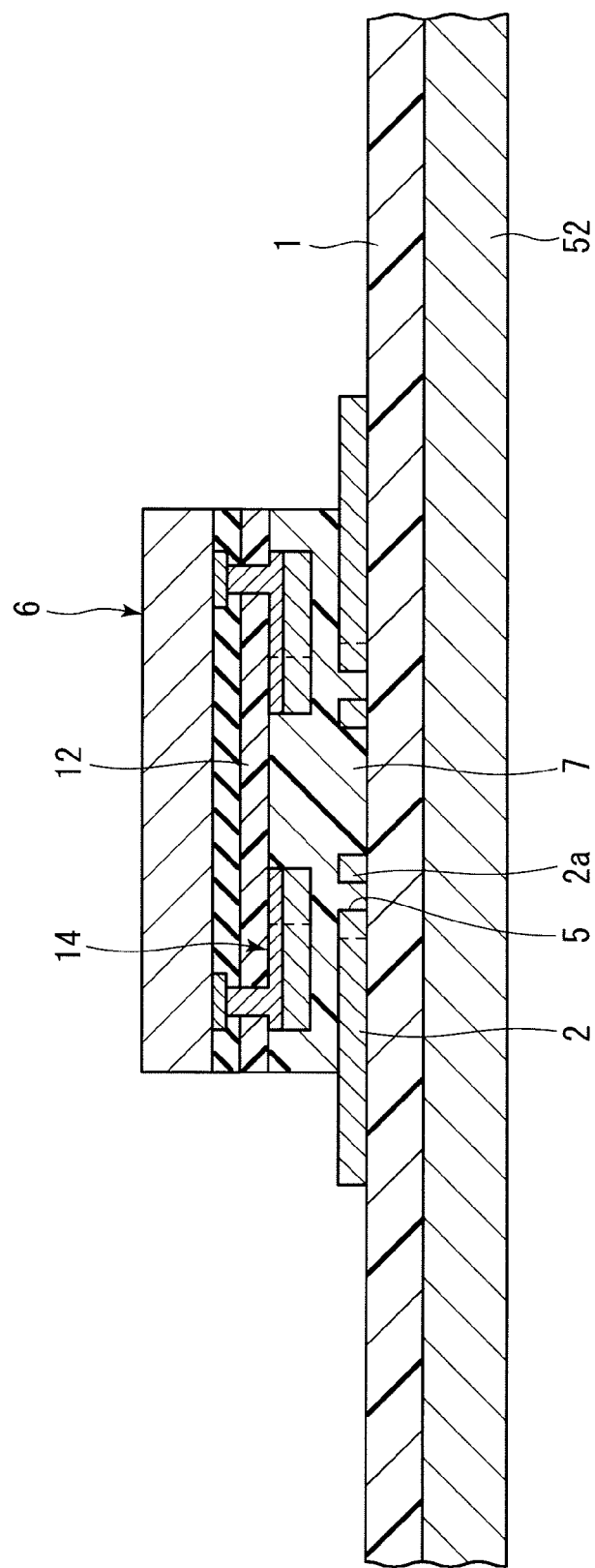
FIG. 18 is a cross-sectional view of a procedure performed after that in FIG. 17.

Next, as shown in FIG. 18, the semiconductor construct 6 is mounted by the bottom surface of the protective film 12 including the wiring member 14 of the semiconductor construct 6 being adhered to a semiconductor construct mounting area on the top surface of the lower-layer insulating film 1 including the first lower-layer wiring 2 via the adhesive layer 7 made of epoxy system resin and the like. In this case as well, an adhesive material referred to as NCP or an adhesive sheet referred to as NCF is provided in advance on the semiconductor construct mounting area of the top surface of the lower-layer insulating film 1 including the first lower-layer wiring 2. Then, the semiconductor construct 6 is fixed to the top surface of the lower-layer insulating film 1 including the first lower-layer wiring 2 by heat compression. In this condition, the circular hole 5 of the one connection pad section 2a of the first lower-layer wiring 2 is filled with the adhesive layer 7.

In this case as well, a visual inspection or a conductivity inspection is performed on the first lower-layer wiring 2, and a plurality of semiconductor device formation areas on the top surface of the lower-layer insulating film 1 including the first lower-layer wiring 2 are identified as non-defective semiconductor device formation areas or defective semiconductor device formation areas, as described above. Therefore, the semiconductor construct 6 is mounted only on non-defective semiconductor device formation areas and not on defective semiconductor device formation areas.

Figure 19:
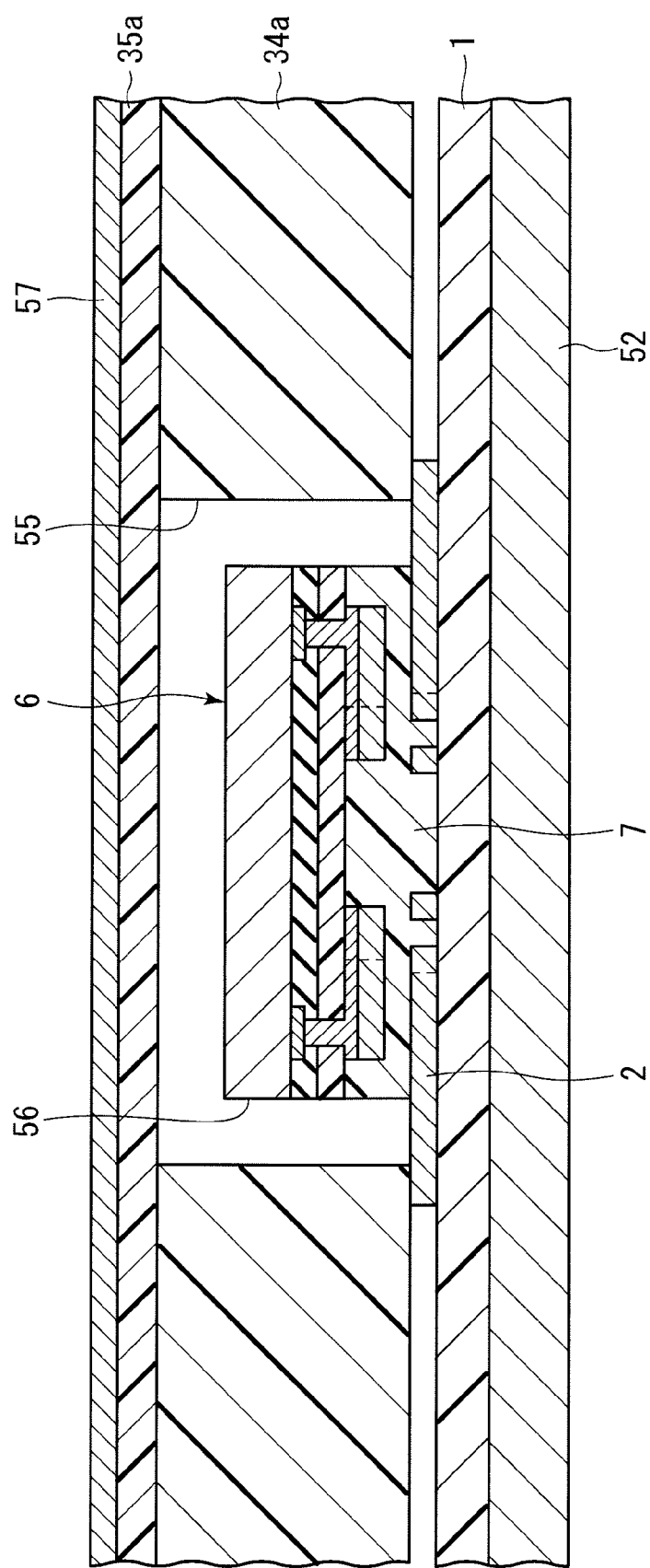
FIG. 19 is a cross-sectional view of a procedure performed after that in FIG. 18.

Next, as shown in FIG. 19, the lattice-shaped insulating layer formation sheet 34a is disposed on the top surface of the lower-layer insulating film 1 including the first lower-layer wiring 2 around a periphery of the semiconductor construct 6 including the adhesive layer 7, while being positioned with a pin and the like. In this case as well, the insulating layer formation sheet 34a is, for example, formed as follows. First, a substrate made of glass fabric and the like is saturated with thermosetting resin composed of epoxy system resin and the like. Next, the thermosetting resin is semi-hardened, and the substrate is formed into a sheet. Then, a plurality of square openings 55 are formed on the sheet by punching and the like. The size of the opening 55 on the insulating layer formation sheet 34a is slightly larger than the size of the semiconductor construct 6. Therefore, the gap 56 is formed between the insulating layer formation sheet 34a and the semiconductor construct 6.

Next, the sub-base plate 57 made of copper foil, on the bottom surface of which the upper-layer insulating film formation layer 35a is formed, is disposed on the top surface of the insulating layer formation sheet 34a. In this case as well, the upper-layer insulating film formation layer 35a is made of the same material as the lower-layer insulating film 1. The thermosetting resin composed of epoxy system resin and the like in the upper-layer insulating film formation layer 35a is semi-hardened.

Figure 20:
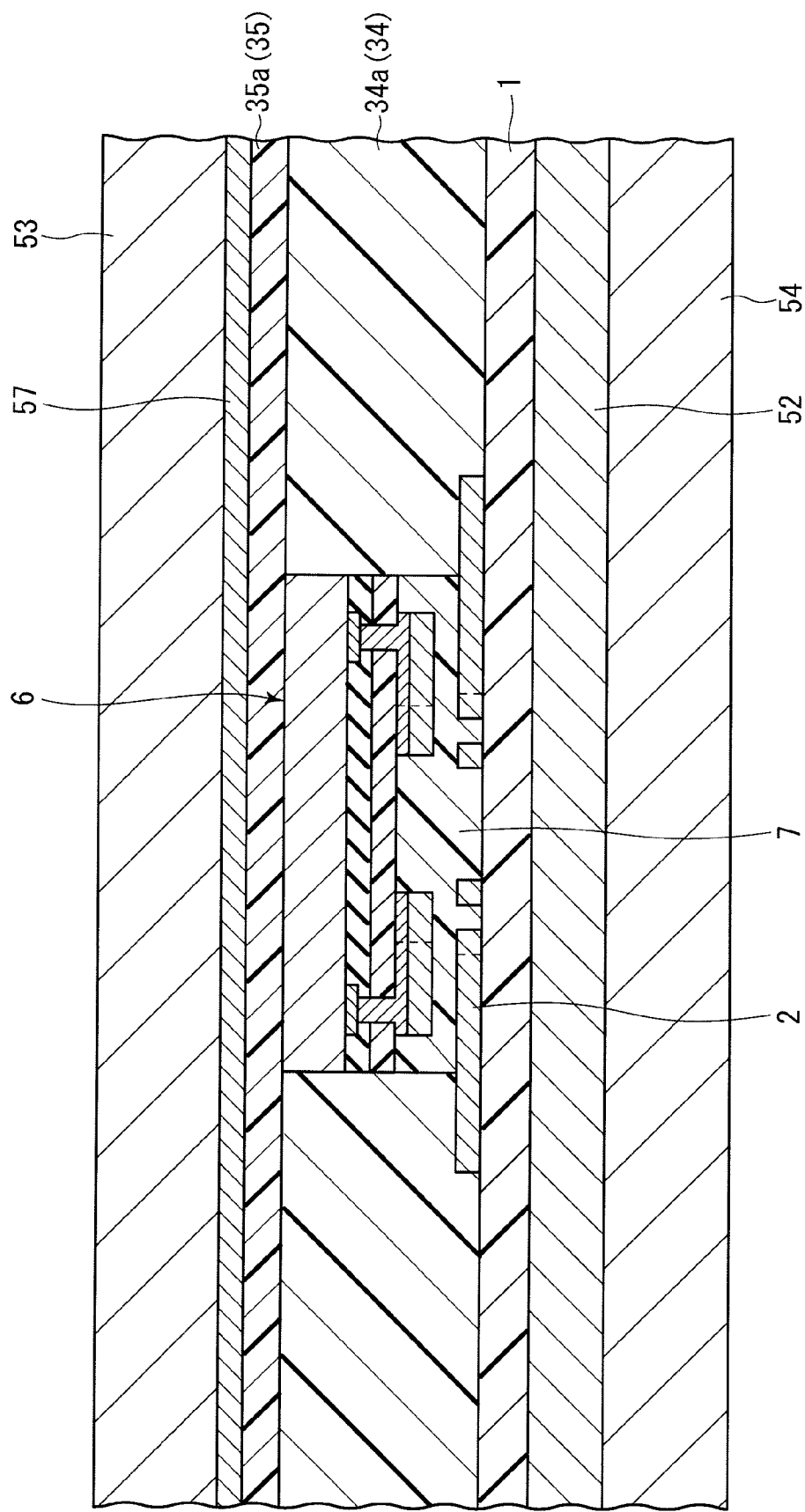
FIG. 20 is a cross-sectional view of a procedure performed after that in FIG. 19.

Next, as shown in FIG. 20, the insulating layer formation sheet 34a and the upper-layer insulating film formation layer 35a are heat-compressed from the upper and lower sides by a pair of heat-compression plates 53 and 54. As a result of heat compression, the thermosetting resin in the insulating layer formation sheet 34a and the upper-layer insulating film formation layer 35a flows and fills the gap 56 shown in FIG. 19. Then, after thermosetting resin is hardened by subsequent cooling, the insulating layer 34 is formed on the top surface of the lower-layer insulating film 1 including the first lower-layer wiring 2 around a periphery of the semiconductor construct 6 including the adhesive layer 7. In addition, the upper-layer insulating film 35 is also formed on the top surface of the insulating layer 34 and the semiconductor construct 6.

Figure 21:
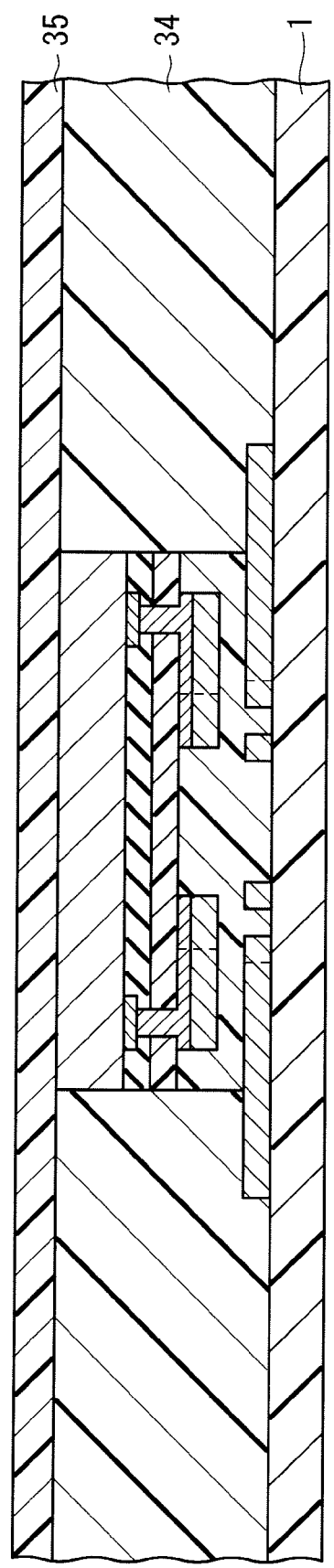
FIG. 21 is a cross-sectional view of a procedure performed after that in FIG. 20.

Next, when the base plate 52 and the sub-base plate 57 are removed by etching, as shown in FIG. 21, the bottom surface of the lower-layer insulating film 1 is exposed, and also the top surface of the upper-layer insulating film 35 is exposed. In this condition, even when the base plate 52 and the sub-base plate 57 are removed, strength is sufficiently obtainable because of the presence of the lower-layer insulating film 1, the insulating layer 34, and the upper-layer insulating film 35.

Figure 22:
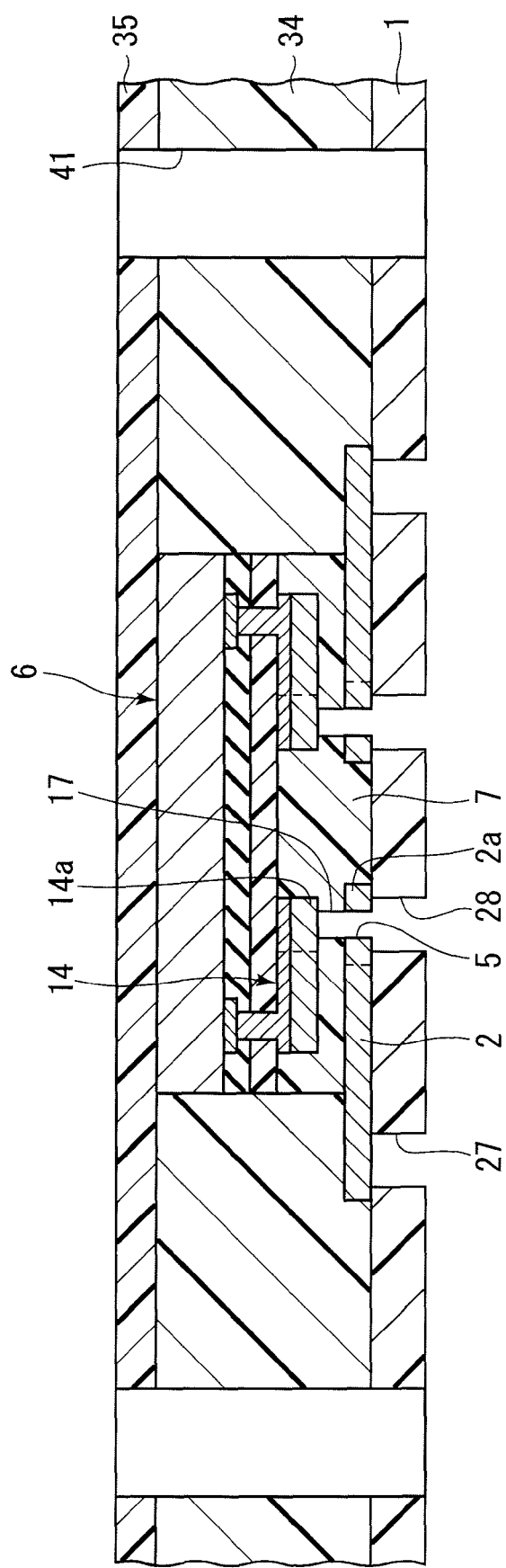
FIG. 22 is a cross-sectional view of a procedure performed after that in FIG. 21.

Next, as shown in FIG. 22, by laser processing performed by laser beam irradiation, the opening 28 and the opening 27 are formed on the lower-layer insulating film 1 at sections corresponding to the center of each bottom surface of the one connection pad section 2a and the other connection pad section of the first lower-layer wiring 2. In addition, the adhesive layer 7 in the circular hole 5 of the one connection pad section 2a of the first lower-layer wiring 2 is removed. At the same time, the opening 17 is formed on the adhesive layer 7 at a section corresponding to the center of the bottom surface of the connection pad section 14a of the wiring member 14 of the semiconductor construct 6. Also, the through-hole 41 is formed in predetermined sections of the lower-layer insulating film 1, the insulating layer 34, and the upper-layer insulating film 35 using a mechanical drill or laser processing performed by laser beam irradiation.

In this case as well, a diameter of the connection pad section 14a of the wiring member 14 of the semiconductor construct 6 is smaller than an outer diameter and larger than an inner diameter (diameter of the opening 5) of the one connection pad section 2a of the first lower-layer wiring 2. Therefore, as is the case for the first embodiment, the diameter of the connection pad section 14a of the wiring member 14 of the semiconductor construct 6 can be reduced to a minimum, thereby allowing the miniaturization of the semiconductor construct 6.

Hereafter, when procedures similar to those in the first embodiment are performed, a plurality of semiconductor devices shown in FIG. 15 can be obtained. In this case as well, the semiconductor construct 6 is not mounted in defective semiconductor device formation areas as described above. Therefore, in addition to semiconductor devices including the semiconductor construct 6 shown in FIG. 15, semiconductor devices that do not include the semiconductor construct 6 are obtained. Therefore, yield can be improved in a manner similar to that in the first embodiment.

Third Embodiment

Figure 23:
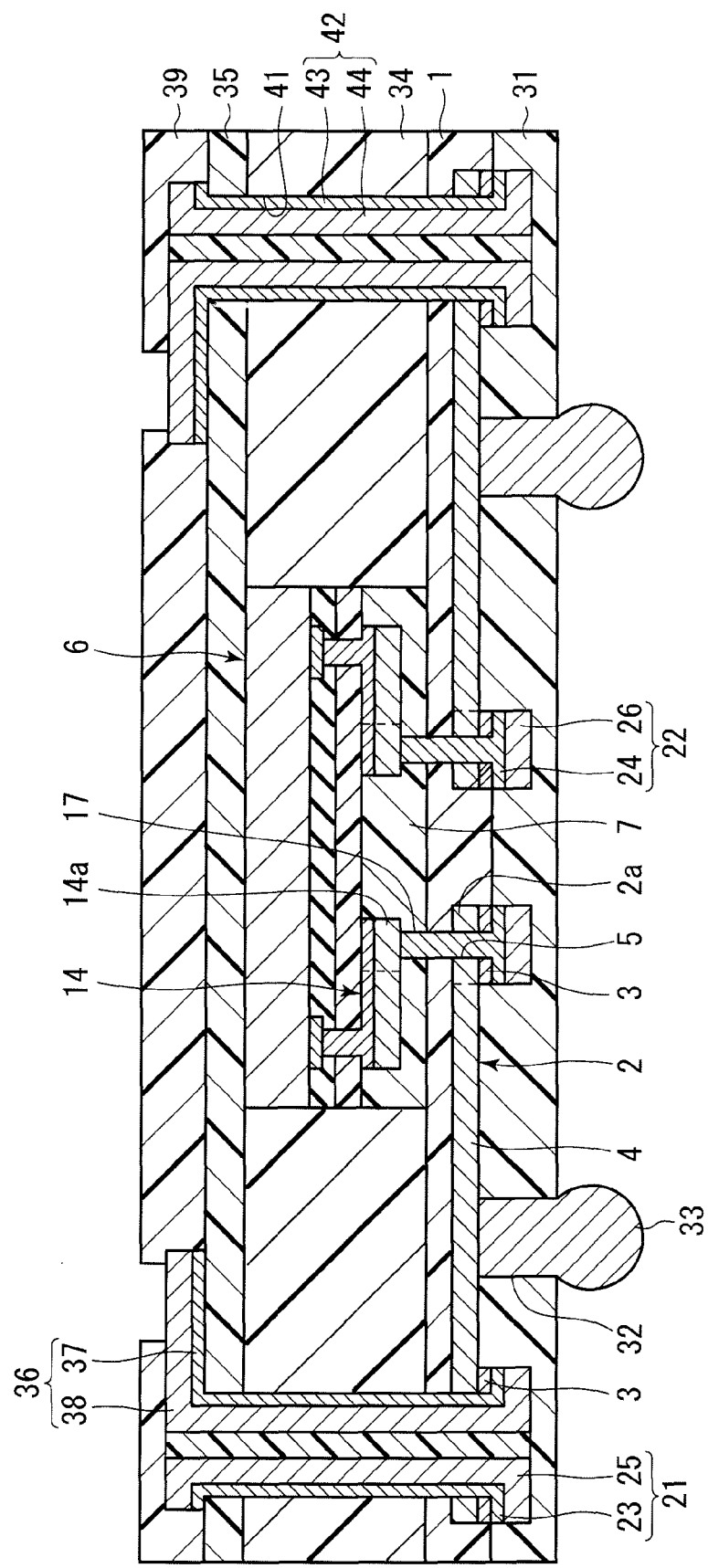
FIG. 23 is a cross-sectional view of a semiconductor device according to the third embodiment of the present invention.

FIG. 23 is a cross-sectional view of a semiconductor device according to the third embodiment of the present invention. The semiconductor device according to the third embodiment differs from the semiconductor device shown in FIG. 1 in that the first lower-layer wiring 2 is embedded on the bottom surface side of the lower-layer insulating film 1, and the first lower-layer wiring 2 is connected to the upper/lower communicating section 42. In this case, both end sections of the first lower-layer wiring 2 including the one connection pad section 2a have a double-layered structure in which the metallic upper layer 4 is provided on the top surface of the metallic base layer 3, and only the metallic upper layer 4 is provided between the end sections.

The connection pad section 22 provided on the bottom surface of the one connection pad section 2a of the first lower-layer wiring 2 is connected to the connection pad section 14a of the wiring member 14 of the semiconductor construct 6, via the circular hole 5 on the one connection pad section 2a of the first lower-layer wiring 2 and the opening 17 provided on the adhesive layer 7 and the lower-layer insulating film 1. The second lower-layer wiring 21 only includes a section formed in a lower section of the upper/lower communicating section 42. The solder ball 33 is provided in the opening 32 of the lower-layer overcoat film 31 and below the opening 32 in such a manner to be connected to the connection pad section provided in an intermediate portion of the second lower-layer wiring 21.

Figure 24:
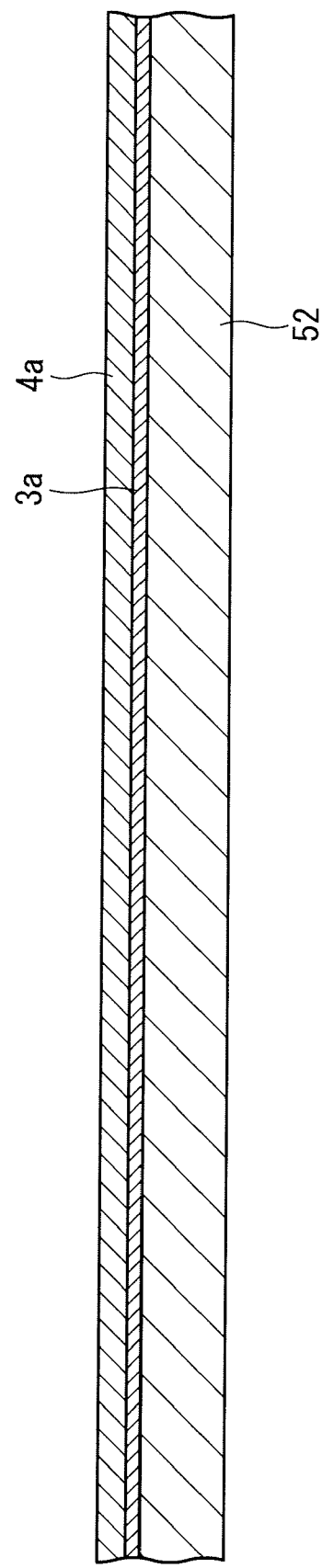
FIG. 24 is a cross-sectional view of an initially prepared semiconductor device in an example of a manufacturing method of the semiconductor device shown in FIG. 23.

Next, an example of a manufacturing method of the semiconductor device will be described. First, as shown in FIG. 24, the base plate 52 made of copper foil, on the top surface of which the first metallic base layer formation layer 3a for lower-layer wiring and the first metallic upper layer formation layer 4a for lower-layer wiring are formed, is prepared. The first metallic base layer formation layer 3a for lower-layer wiring is made of electroless nickel plating, and the first metallic upper layer formation layer 4a for lower-layer wiring is made of electrolytic nickel plating. Here, the prepared base plate 52 is of a size allowing a plurality of completed semiconductor devices shown in FIG. 23 to be formed thereon.

Figure 25:
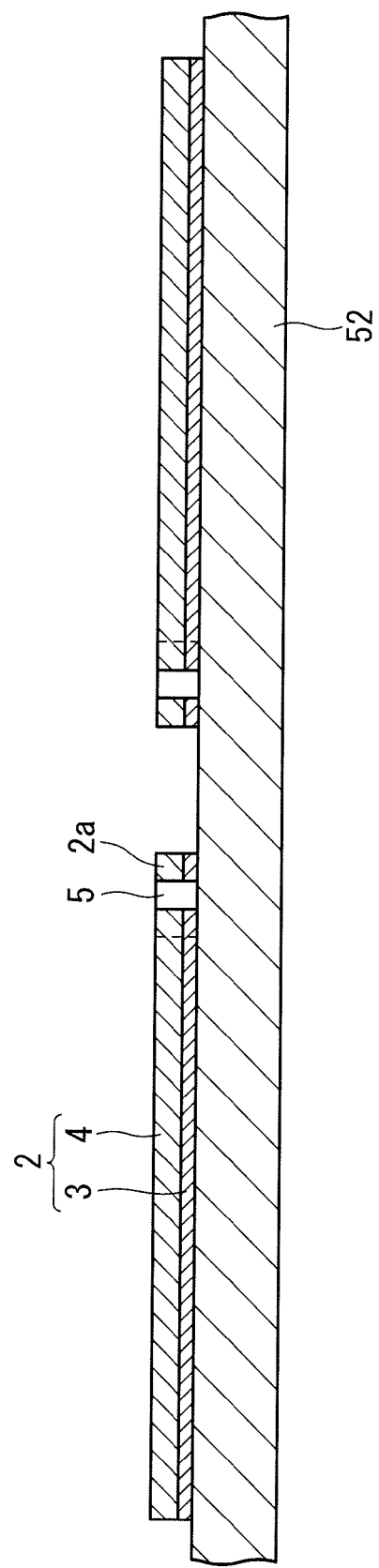
FIG. 25 is a cross-sectional view of a procedure performed after that in FIG. 24.

Next, the first metallic upper layer formation layer 4a for lower-layer wiring and the first metallic base layer formation layer 3a for lower-layer wiring are patterned by photolithography method. As a result, the first lower-layer wiring 2 having a double-layered structure including the metallic base layer 3 and the metallic upper layer 4 is formed on the top surface of the base plate 52 as shown in FIG. 25. In this condition, the circular hole 5 is formed in the center of the one connection pad section 2a of the first lower-surface wiring 2.

Next, a visual inspection or a conductivity inspection is performed on the first lower-layer wiring 2. When the inspection indicates that the first lower-layer wiring 2 is formed as expected in a plurality of semiconductor device formation areas on the base plate 52, the semiconductor device formation areas are judged to be non-defective. When the first lower-layer wiring 2 is not formed as expected, the semiconductor device formation areas are judged to be defective. A semiconductor device formation area judged to be non-defective is identified as a non-defective semiconductor device formation area, and a semiconductor device formation area judged to be defective is identified as a defective semiconductor device formation area.

Figure 26:
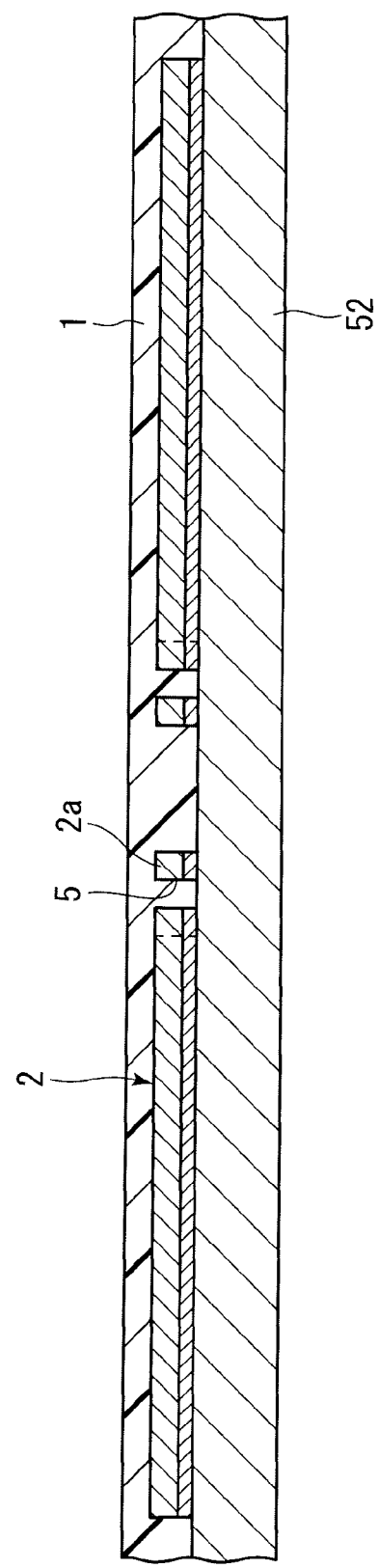
FIG. 26 is a cross-sectional view of a procedure performed after that in FIG. 25.

Next, as shown in FIG. 26, the lower-layer insulating film 1 made of epoxy system resin, polyimide system resin, glass cloth base material epoxy resin, and the like is formed on the top surface of the base plate 52 including the first lower-layer wiring 2. In this condition, the circular hole 5 on the one connection pad section 2a of the first lower-layer wiring 2 is filled with the lower-layer insulating film 1. In addition, thermosetting resin composed of epoxy system resin and the like in the lower-layer insulating film 1 is already hardened.

Figure 27:
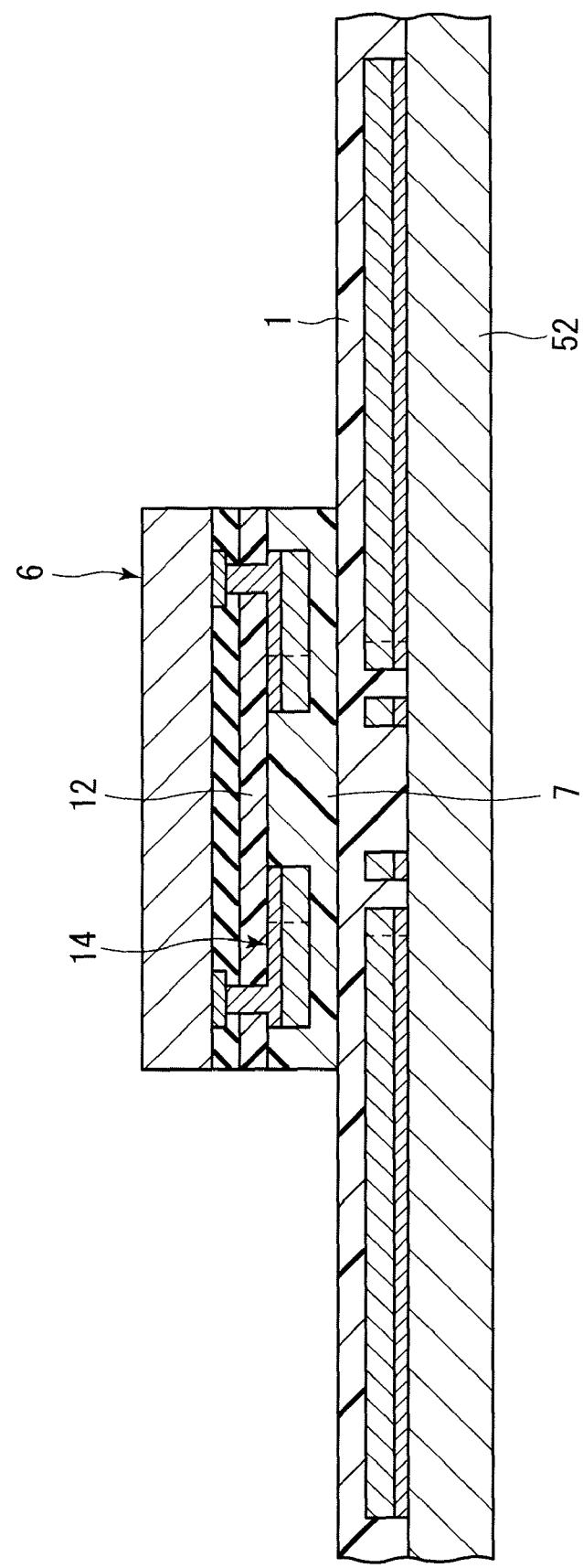
FIG. 27 is a cross-sectional view of a procedure performed after that in FIG. 26.

Next, as shown in FIG. 27, the semiconductor construct 6 is mounted by the bottom surface of the protective film 12 including the wiring member 14 of the semiconductor construct 6 being adhered to a semiconductor device formation area on the top surface of the lower-layer insulating film 1 via the adhesive layer 7 made of epoxy system resin and the like. In this case as well, an adhesive material referred to as NCP or an adhesive sheet referred to as NCF is provided in advance on the semiconductor device formation area of the top surface of the lower-layer insulating film 1. Then, the semiconductor construct 6 is fixed to the top surface of the lower-layer insulating film 1 by heat compression.

In this case as well, a visual inspection or a conductivity inspection is performed on the first lower-layer wiring 2, and a plurality of semiconductor device formation areas on the top surface of the lower-layer insulating film 1 including the first lower-layer wiring 2 are identified as non-defective semiconductor device formation areas or defective semiconductor device formation areas, as described above. Therefore, the semiconductor construct 6 is mounted only on non-defective semiconductor device formation areas and not on defective semiconductor device formation areas.

Figure 28:
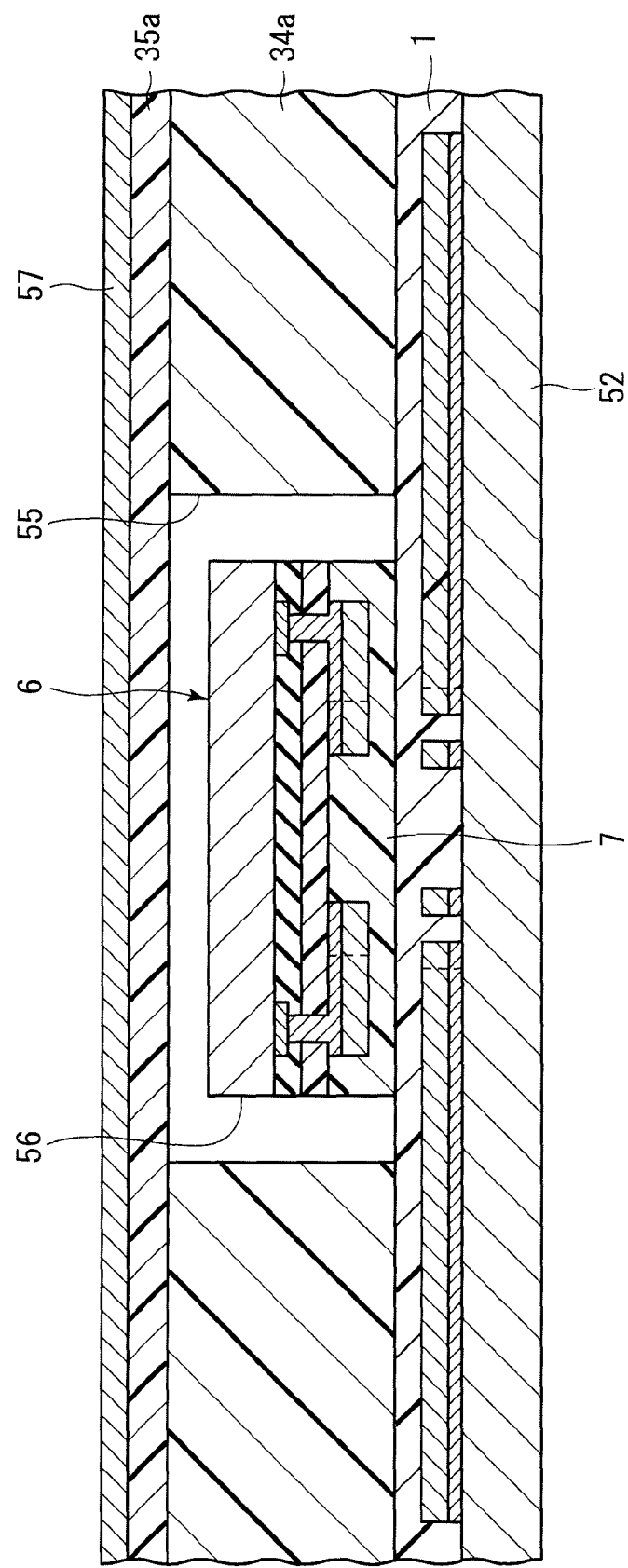
FIG. 28 is a cross-sectional view of a procedure performed after that in FIG. 27.

Next, as shown in FIG. 28, the lattice-shaped insulating layer formation sheet 34a is disposed on the top surface of the lower-layer insulating film 1 around a periphery of the semiconductor construct 6 including the adhesive layer 7, while being positioned with a pin and the like. In this case as well, the insulating layer formation sheet 34a is, for example, formed as follows. First, a substrate made of glass fabric and the like is saturated with thermosetting resin composed of epoxy system resin and the like. Next, the thermosetting resin is semi-hardened, and the substrate is formed into a sheet. Then, a plurality of square openings 55 are formed on the sheet by punching and the like. The size of the opening 55 on the insulating layer formation sheet 34a is slightly larger than the size of the semiconductor construct 6. Therefore, the gap 56 is formed between the insulating layer formation sheet 34a and the semiconductor construct 6.

Next, the sub-base plate 57 made of copper foil, on the bottom surface of which the upper-layer insulating film formation layer 35a is formed, is disposed on the top surface of the insulating layer formation sheet 34a. In this case as well, the upper-layer insulating film formation layer 35a is made of the same material as the lower-layer insulating film 1, and the thermosetting resin composed of epoxy system resin and the like in the upper-layer insulating film formation layer 35a is semi-hardened.

Figure 29:
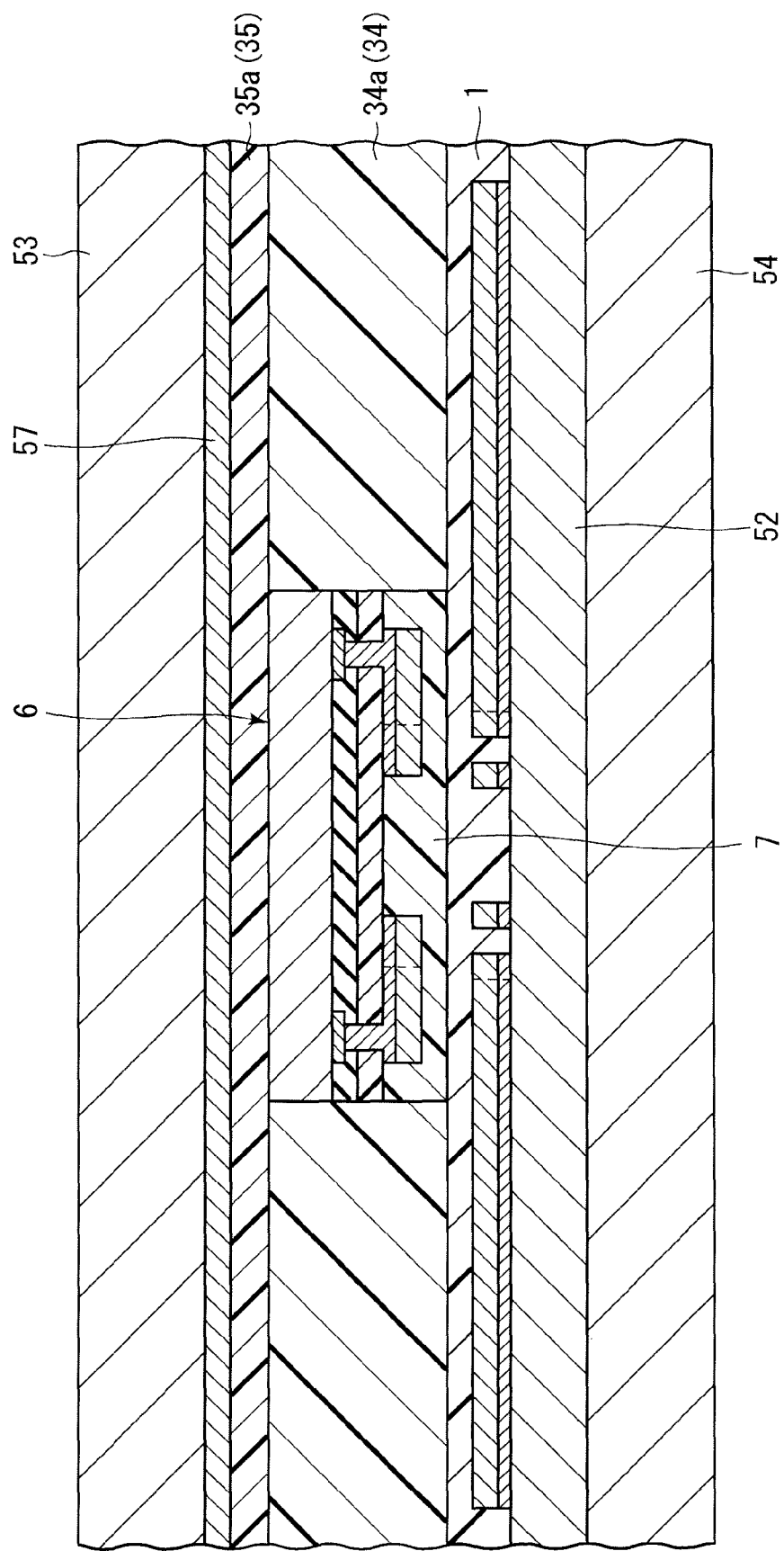
FIG. 29 is a cross-sectional view of a procedure performed after that in FIG. 28.

Next, as shown in FIG. 29, the insulating layer formation sheet 34a and the upper-layer insulating film formation layer 35a are heat-compressed from the upper and lower sides by a pair of heat-compression plates 53 and 54. As a result of heat compression, the thermosetting resin in the insulating layer formation sheet 34a and the upper-layer insulating film formation layer 35a flows and fills the gap 56 shown in FIG. 28. Then, after the thermosetting resin is hardened by subsequent cooling, the insulating layer 34 is formed on the top surface of the lower-layer insulating film 1 around a periphery of the semiconductor construct 6 including the adhesive layer 7. In addition, the upper-layer insulating film 35 is also formed on the top surface of the insulating layer 34 and the semiconductor construct 6.

Figure 30:
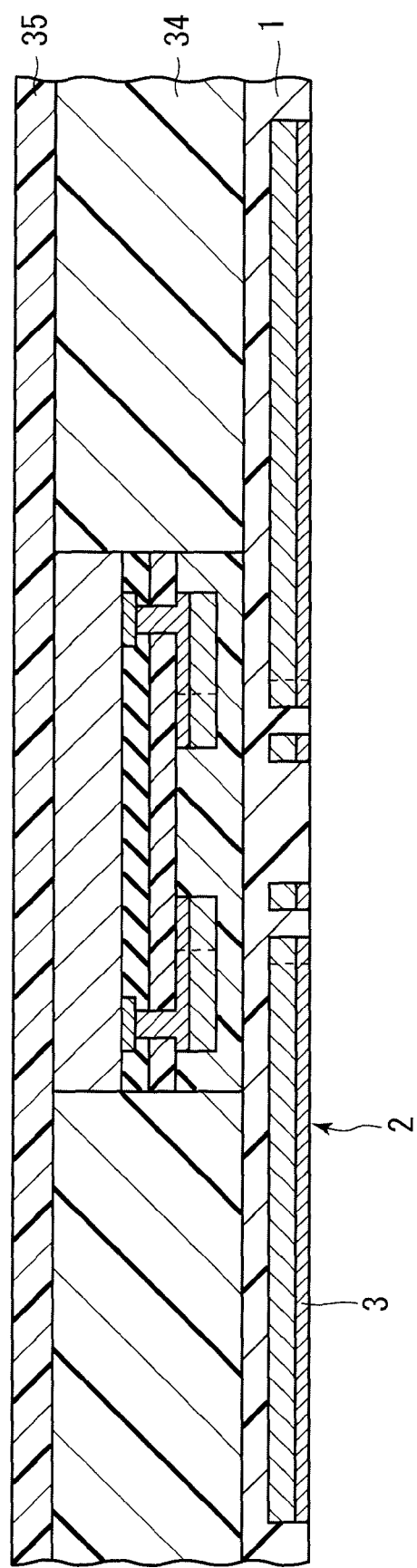
FIG. 30 is a cross-sectional view of a procedure performed after that in FIG. 29.

Next, when the base plate 52 and the sub-base plate 57 are removed by etching, as shown in FIG. 30, the bottom surface of the lower-layer insulating film 1 including the first lower-layer wiring 2 is exposed, and also the top surface of the upper-layer insulating film 35 is exposed. In this condition, even when the base plate 52 and the sub-base plate 57 are removed, strength is sufficiently obtainable because of the presence of the lower-layer insulating film 1, the insulating layer 34, and the upper-layer insulating film 35. Also, the bottom surface of the metallic base layer 3 of the first lower-layer wiring 2 is flush with the bottom surface of the lower-layer insulating film 1.

Figure 31:
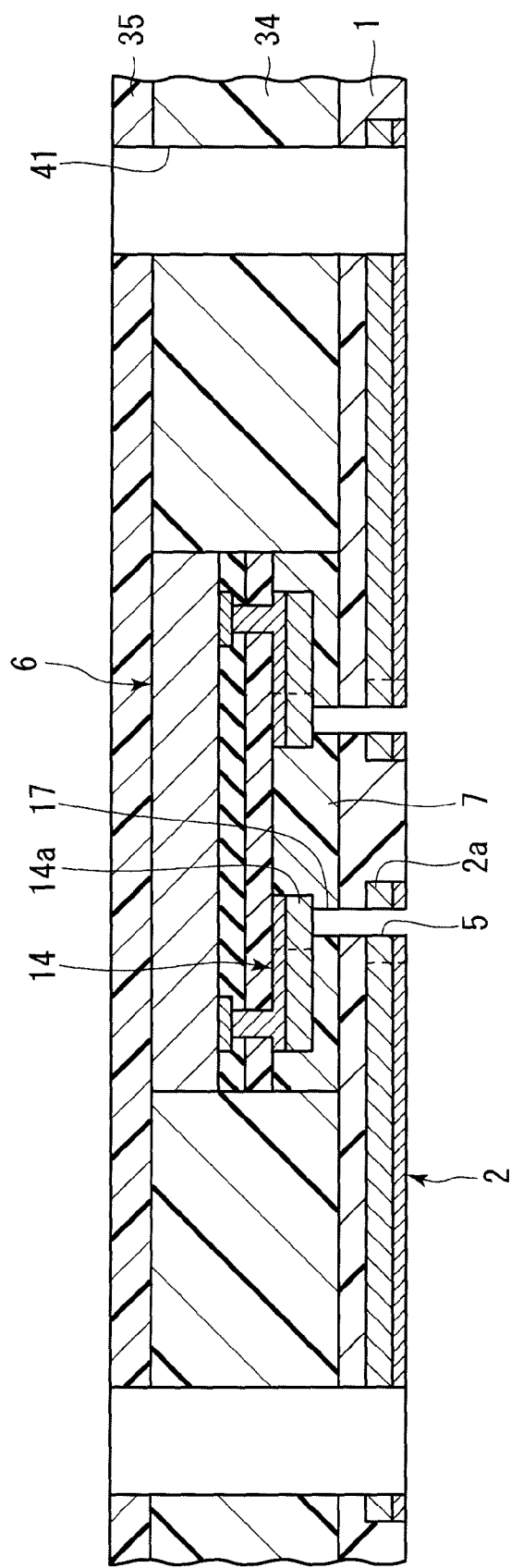
FIG. 31 is a cross-sectional view of a procedure performed after that in FIG. 30.

Next, as shown in FIG. 31, by laser processing performed by laser beam irradiation, the lower-layer insulating film 1 in the circular hole 5 of the one connection pad section 2a of the first lower-layer wiring 2 is removed. At the same time, the opening 17 is formed on the lower-layer insulating film 1 and the adhesive layer 7 at sections corresponding to the center of the bottom surface of the connection pad section 14a of the wiring member 14 of the semiconductor construct 6. In addition, the through-hole 41 is formed in predetermined sections of the lower-layer insulating film 1 including the first lower-layer wiring 2, the insulating layer 34, and the upper-layer insulating film 35 using a mechanical drill or laser processing performed by laser beam irradiation.

In this case as well, a diameter of the connection pad section 14a of the wiring member 14 of the semiconductor construct 6 is smaller than an outer diameter and larger than an inner diameter (diameter of the opening 5) of the one connection pad section 2a of the first lower-layer wiring 2. Therefore, as is the case for the first embodiment, the diameter of the connection pad section 14a of the wiring member 14 of the semiconductor construct 6 can be reduced to a minimum, thereby allowing the miniaturization of the semiconductor construct 6.

Figure 32:
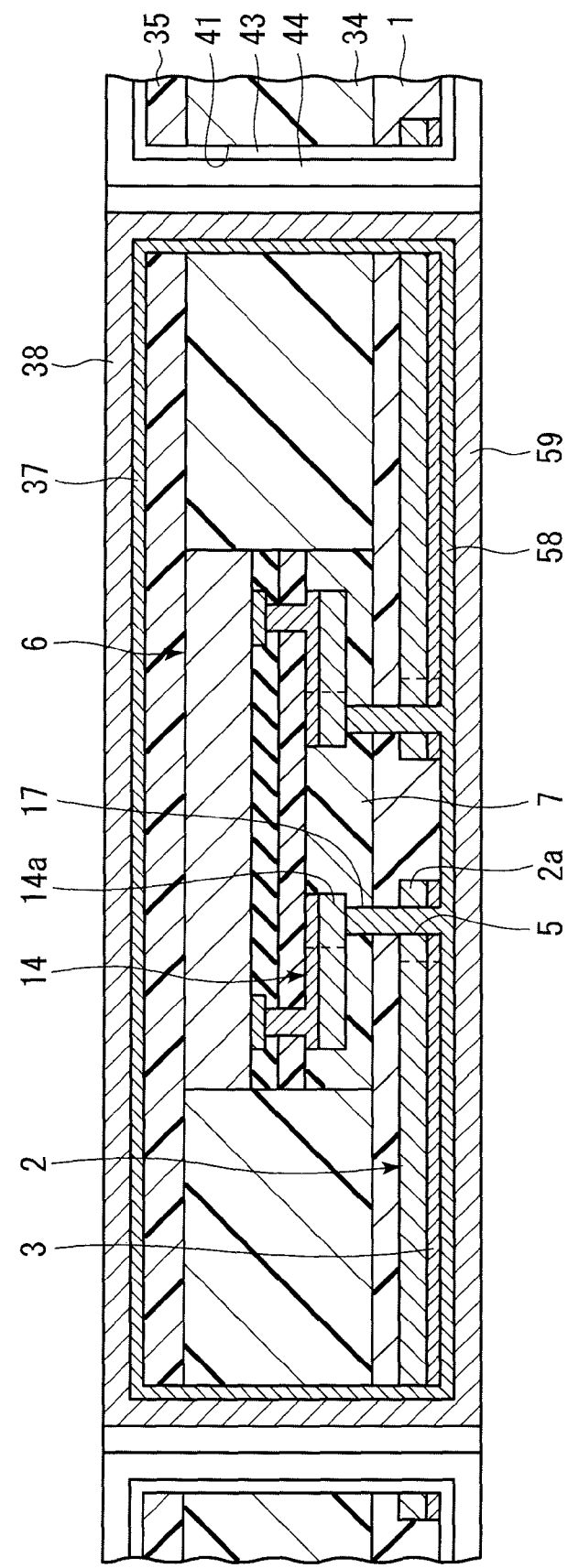
FIG. 32 is a cross-sectional view of a procedure performed after that in FIG. 31.

Next, as shown in FIG. 32, the metallic base layer 58, the metallic base layer 37, and the metallic base layer 43 are formed by non-electrolytic copper plating. The metallic base layer 58 is formed on the bottom surface of the connection pad section 14a of the wiring member 14 of the semiconductor construct 6 exposed via the circular hole 5 on the one connection pad section 2a of the first lower-layer wiring 2 and the opening 17 on the adhesive layer 7 and the lower-layer insulating film 1, and the overall bottom surface of the lower-layer insulating film 1 including the first lower-layer wiring 2. The metallic base layer 37 is formed on the overall top surface of the upper-layer insulating film 35. The metallic base layer 43 is formed on the inner wall surface of the through-hole 41. Next, as a result of electrolytic copper plating in which the metallic base layer 58, the metallic base layer 37, and the metallic base layer 43 serve as the plating current paths, the metallic upper layer 59, the metallic upper layer 38, and the metallic upper layer 44 are respectively formed on the surfaces of the metallic base layer 58, the metallic base layer 37, and the metallic base layer 43.

Figure 33:
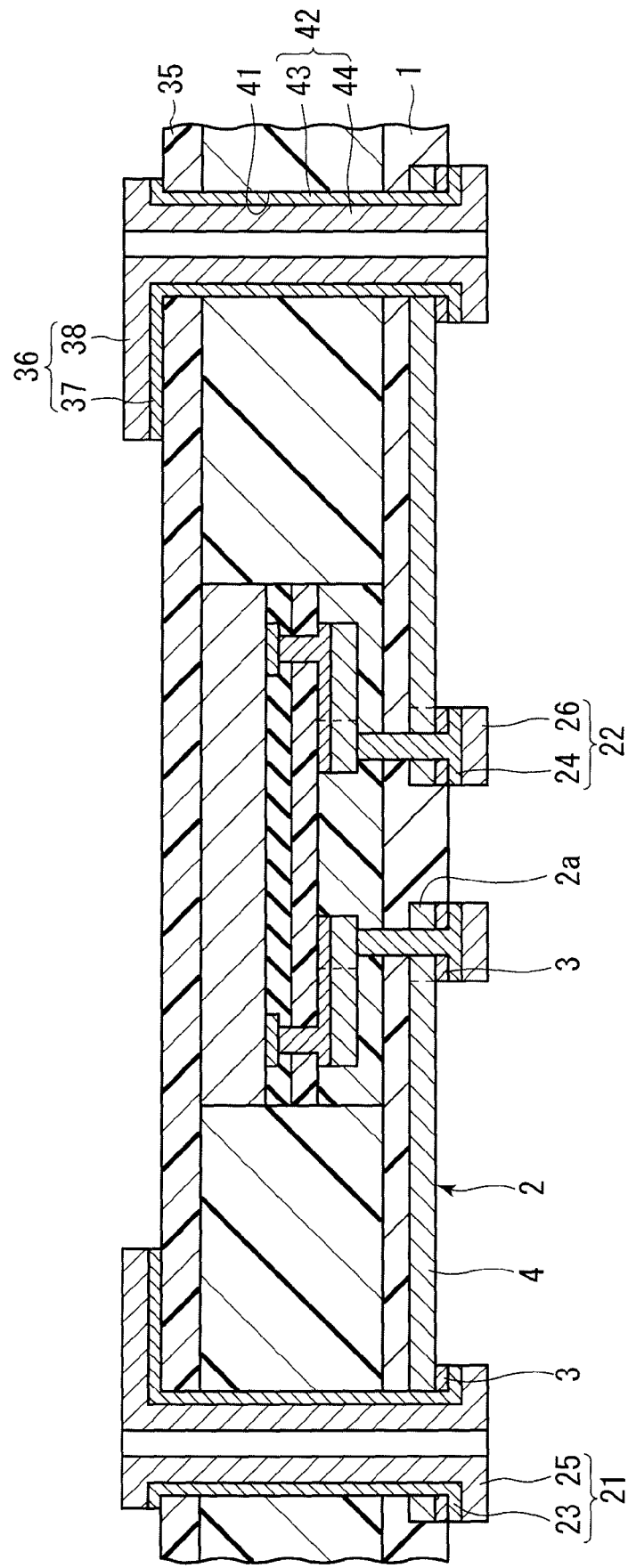
FIG. 33 is a cross-sectional view of a procedure performed after that in FIG. 32.

Next, the metallic upper layer 59, the metallic upper layer 38, the metallic base layer 58, the metallic base layer 37, and the metallic base layer 3 of the first lower-layer wiring 2 are patterned by photolithography method using the same mask, a result of which is shown in FIG. 33. In other words, the second lower-layer wiring 21 having the double-layered structure including the metallic base layer 23 and the metallic upper layer 25, and the connection pad section 22 having the double-layered structure including the metallic base layer 24 and the metallic upper layer 26 are formed on the bottom surface of the lower-layer insulating film 1. In addition, the upper-layer wiring 36 having the double-layered structure including the metallic base layer 37 and the metallic upper layer 38 is formed on the top layer of the upper-layer insulating film 35. Moreover, the upper/lower communicating section 42 having the double-layered structure including the metallic base layer 43 and the metallic upper layer 44 is formed on the inner wall surface of the through-hole 41.

Furthermore, the metallic base layer 3 is removed from an area of the first lower-layer wiring 2 excluding both end sections including the one connection pad section 2a, and the bottom surface of the metallic upper layer 4 is exposed in the area. Note that the second lower-layer wiring 21, the connection pad section 22, the upper-layer wiring 36, and the upper/lower communicating section 42 can be formed by pattern plating method. In this case as well, the metallic base layer 3 is removed from the area of the first lower-layer wiring 2 excluding both end sections including the one connection pad section 2a, and the bottom surface of the metallic upper layer 4 is exposed in the area.

Hereafter, when procedures similar to those in the first embodiment are performed, a plurality of semiconductor devices shown in FIG. 23 can be obtained. In this case as well, the semiconductor construct 6 is not mounted in defective semiconductor device formation areas as described above.

Therefore, in addition to semiconductor devices including the semiconductor construct 6 shown in FIG. 23, semiconductor devices that do not include the semiconductor construct 6 are obtained. Therefore, yield can be improved in a manner similar to that in the first embodiment.

Fourth Embodiment

Figure 34:
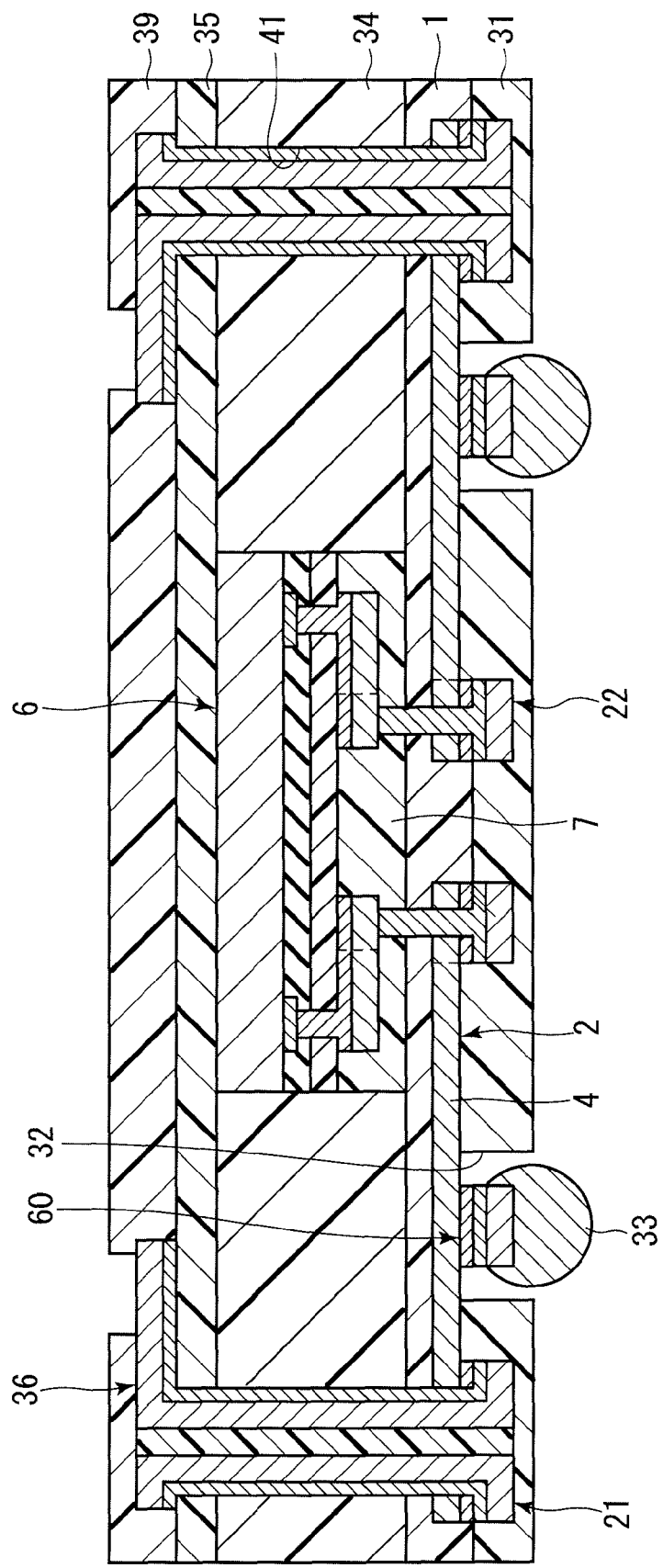
FIG. 34 is a cross-sectional view of a semiconductor device according to the fourth embodiment of the present invention.

FIG. 34 is a cross-sectional view of a semiconductor device according to a fourth embodiment of the present invention. The semiconductor device according to the fourth embodiment differs from the semiconductor device shown in FIG. 23 in that a connection pad section 60 is provided in island shape on the bottom surface of a connection pad section provided in an intermediate section of the portion of the first lower-layer wiring 2 formed only by the metallic upper layer 4. The connection pad section 60 has a three-layer structure including a nickel layer, a nickel layer, and a copper layer, and the solder ball 3 is provided below the surface of the copper layer of the connection pad section 60. In this case, the size of the opening 22 on the lower-layer overcoat film 31 is larger than the size of the solder ball 33.

In this manufacturing method of the semiconductor device, it is required that the connection pad section 60 having a three-layer structure including a nickel layer, a nickel layer, and a copper layer is formed in island shape on the bottom surface of the connection pad section provided in an intermediate section of the first lower-layer wiring 2 formed by only the metallic upper layer 4 in the procedure shown in FIG. 33. In this case, because the solder ball 33 is formed below the surface of the bottommost copper layer of the connection pad section 60 having a three-layer structure, bonding strength thereof can be increased.

Fifth Embodiment

Figure 35:
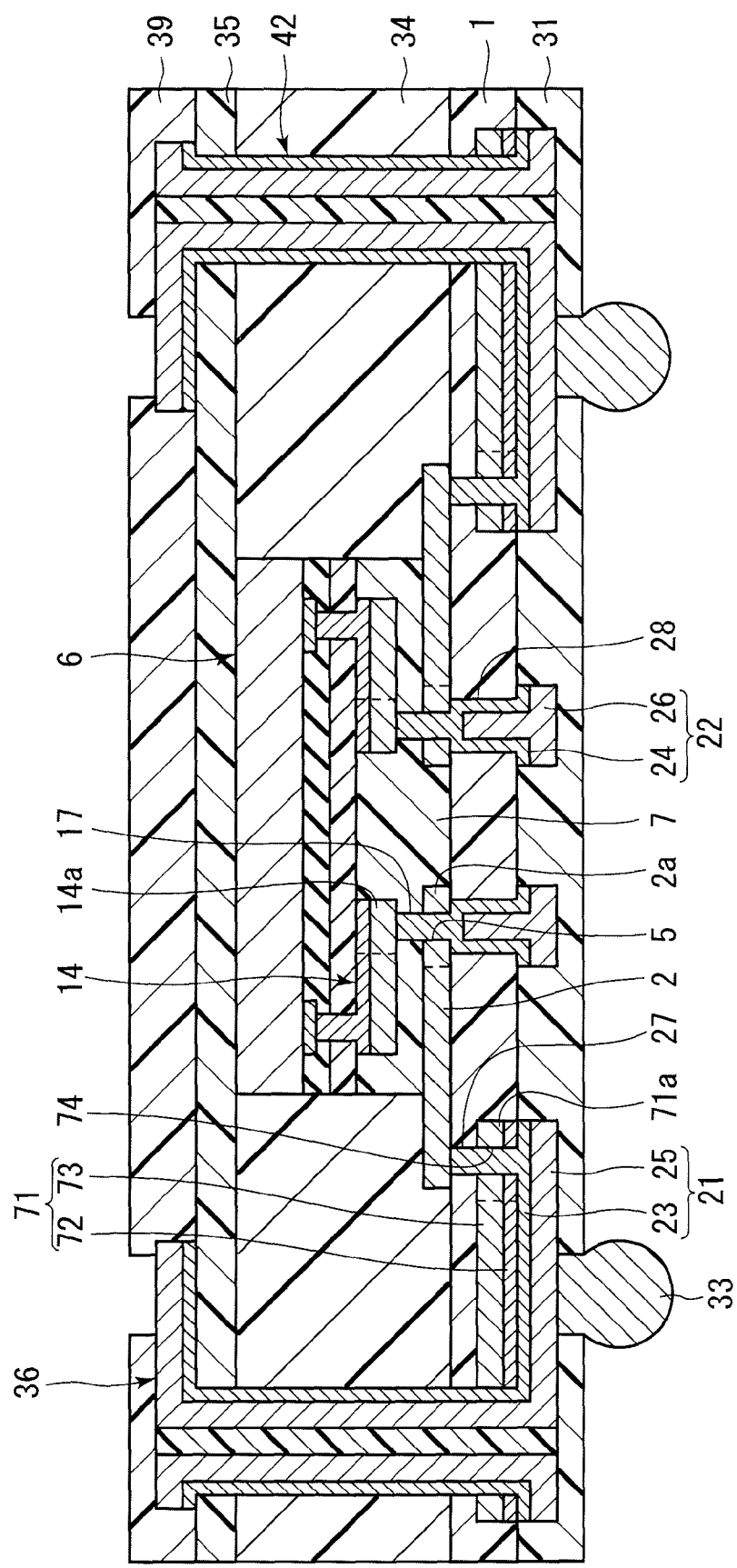
FIG. 35 is a cross-sectional view of a semiconductor device according to the fifth embodiment of the present invention.

FIG. 35 is a cross-sectional view of a semiconductor device according to the fifth embodiment of the present invention. The semiconductor device according to the fifth embodiment greatly differs from the semiconductor device shown in FIG. 15 in that a laser mask layer 71 is embedded on the bottom surface side of the lower-layer insulating film 1, on the second lower-layer wiring 21. In this case, the laser mask layer 71 has a double-layered structure including a metallic base layer 72 and a metallic upper layer 73 provided on the metallic base layer 72.

A ring section 71a including a circular hole 74 is provided on one end section of the laser mask layer 71. Another end section of the laser mask layer 71 is connected to the upper/lower communicating section 42. Also, the opening 27 is provided on the lower-layer insulating film 1 in a section corresponding to the circular hole 74 in the ring section 71a of the laser mask layer 71. One end section of the second lower-layer wiring 21 is connected to the other connection pad section of the first lower-layer wiring 2 via the circular hole 74 in the ring section 71a of the laser mask layer 71 and the opening 27 on the lower layer insulating film 1.

Figure 36:
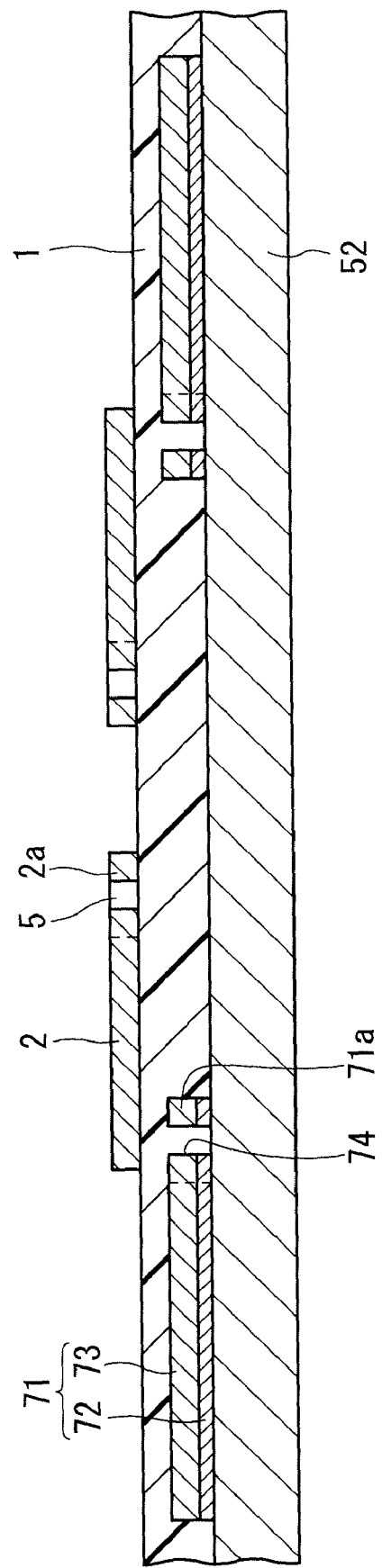
FIG. 36 is a cross-sectional view of an initial procedure in an example of a manufacturing method of the semiconductor device shown in FIG. 35.

Next, an example of a manufacturing method of the semiconductor device will be described. First, as shown in FIG. 36, the laser mask layer 71 having a double-layered structure including the metallic base layer 72 made of non-electrolytic nickel and the metallic upper layer 73 made of electrolytic copper is patterned on the top surface of the base plate 52 made of copper foil. In this condition, the ring section 71a including the circular hole 74 is formed on one end section of the laser mask layer 71.

Next, the lower-layer insulating film 1 made of epoxy system resin, polyimide system resin, glass cloth base material epoxy resin, and the like is formed on the top surface of the base plate 52 including the laser mask layer 71. In this case, thermosetting resin composed of epoxy system resin and the like in the lower-layer insulating film 1 is already hardened. Next, the first lower-layer wiring 2 made of copper foil is patterned on the top surface of the lower-layer insulating film 1. In this condition, the circular hole 5 is formed in the center of the one connection pad section 2a of the first lower-surface wiring 2.

Next, a visual inspection or a conductivity inspection is performed on the first lower-layer wiring 2. When the inspection indicates that the first lower-layer wiring 2 is formed as expected in a plurality of semiconductor device formation areas on the base plate 52, the semiconductor device formation areas are judged to be non-defective. When the first lower-layer wiring 2 is not formed as expected, the semiconductor device formation areas are judged to be defective. A semiconductor device formation area judged to be non-defective is identified as a non-defective semiconductor device formation area, and a semiconductor device formation area judged to be defective is identified as a defective semiconductor device formation area.

Figure 37:
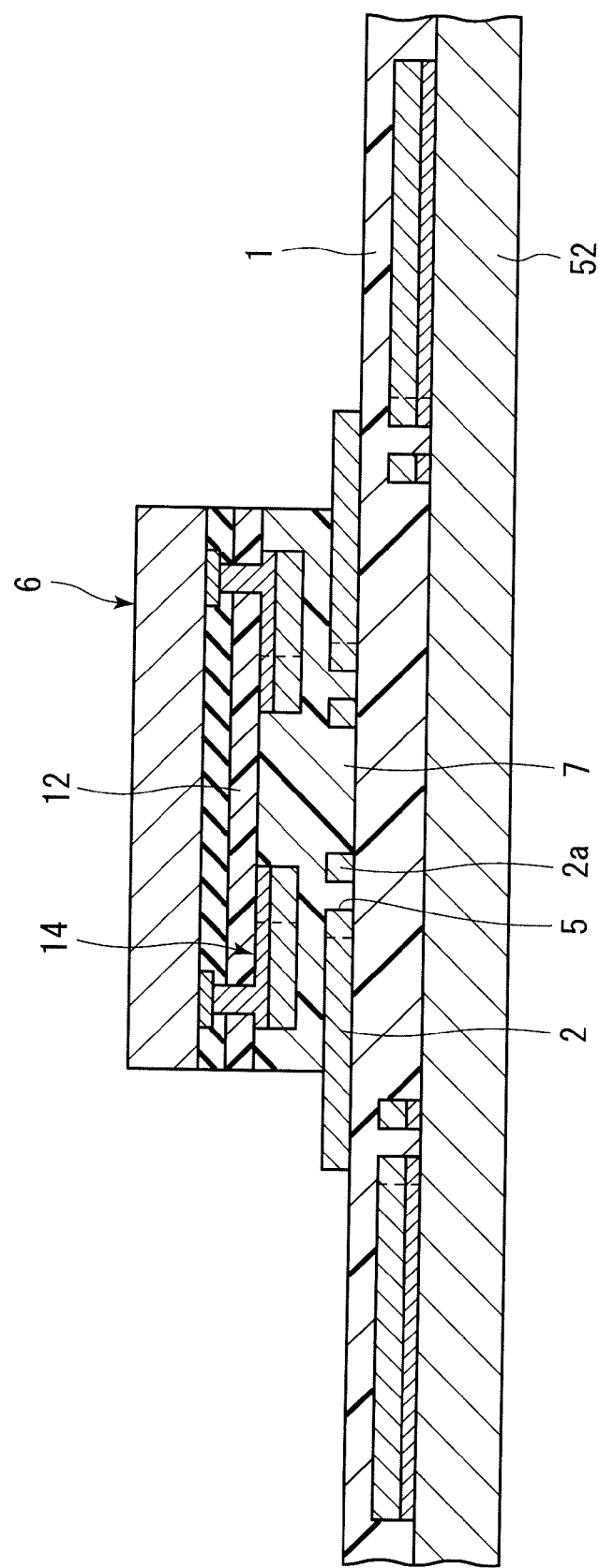
FIG. 37 is a cross-sectional view of a procedure performed after that in FIG. 36.

Next, as shown in FIG. 37, the semiconductor construct 6 is mounted by the bottom surface of the protective film 12 including the wiring member 14 of the semiconductor construct 6 being adhered to a semiconductor device formation area on the top surface of the lower-layer insulating film 1 including the first lower-layer wiring 2 via the adhesive layer 7 made of epoxy system resin and the like. In this case as well, an adhesive material referred to as NCP or an adhesive sheet referred to as NCF is provided in advance on the semiconductor device formation area of the top surface of the lower-layer insulating film 1 including the first lower-layer wiring 2. Then, the semiconductor construct 6 is fixed to the top surface of the lower-layer insulating film 1 including the first lower-layer wiring 2 by heat compression. In this condition, the circular hole 5 of the one connection pad section 2a of the first lower-layer wiring 2 is filled with the adhesive layer 7.

In this case as well, the visual inspection or the conductivity inspection is performed on the first lower-layer wiring 2, and a plurality of semiconductor device formation areas on the top surface of the lower-layer insulating film 1 including the first lower-layer wiring 2 are identified as non-defective semiconductor device formation areas or defective semiconductor device formation areas, as described above. Therefore, the semiconductor construct 6 is mounted only on non-defective semiconductor device formation areas and not on defective semiconductor device formation areas.

Figure 38:
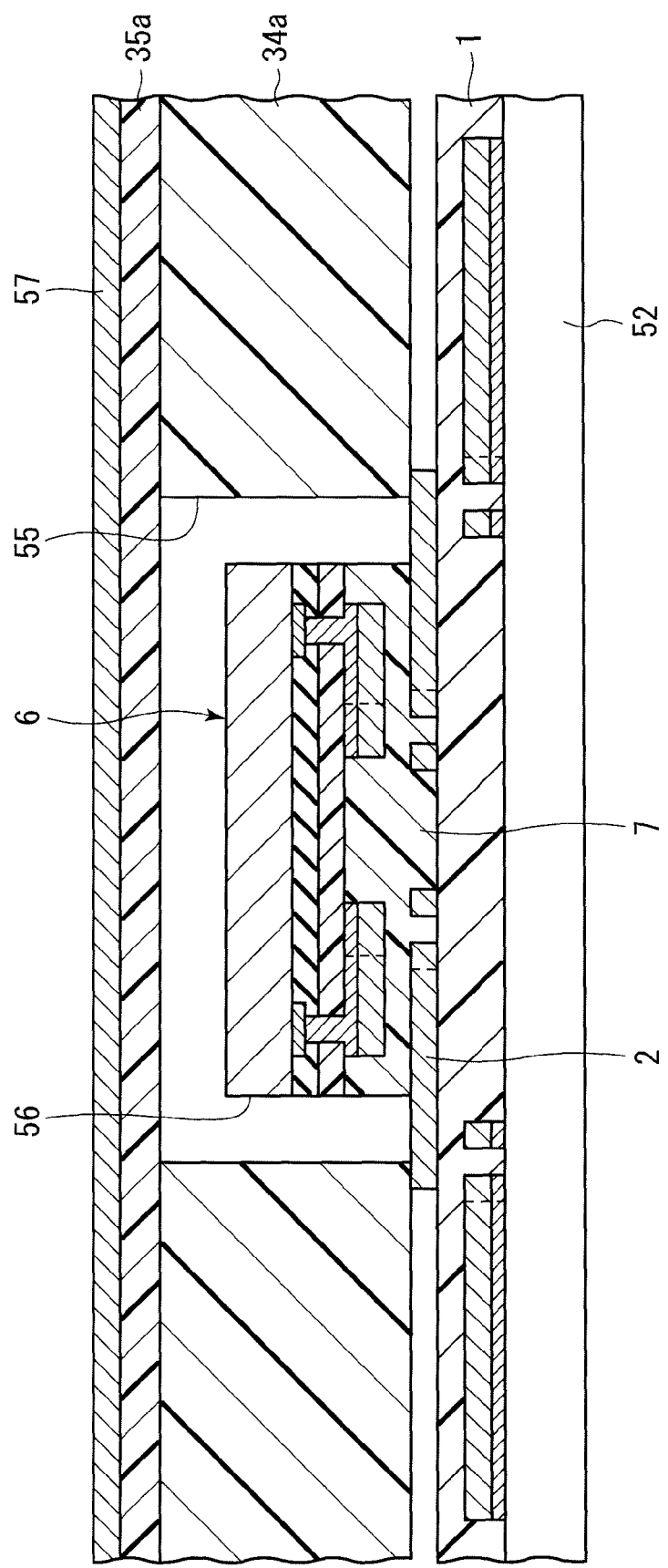
FIG. 38 is a cross-sectional view of a procedure performed after that in FIG. 37.

Next, as shown in FIG. 38, the lattice-shaped insulating layer formation sheet 34a is disposed on the top surface of the lower-layer insulating film 1 including the first lower-layer wiring 2 such as to surround the semiconductor construct 6 including the adhesive layer 7, while being positioned with a pin and the like. In this case as well, the insulating layer formation sheet 34a is, for example, formed as follows. First, a substrate made of glass fabric and the like is saturated with thermosetting resin composed of epoxy system resin and the like. Next, the thermosetting resin is semi-hardened, and the substrate is formed into a sheet. Then, a plurality of square openings 55 are formed on the sheet by punching and the like. The size of the opening 55 on the insulating layer formation sheet 34a is slightly larger than the size of the semiconductor construct 6. Therefore, the gap 56 is formed between the insulating layer formation sheet 34a and the semiconductor construct 6.

Next, the sub-base plate 57 made of copper foil, on the bottom surface of which the upper-layer insulating film formation layer 35a is formed, is disposed on the top surface of the insulating layer formation sheet 34a. In this case as well, the upper-layer insulating film formation layer 35a is made of the same material as the lower-layer insulating film 1, and thermosetting resin composed of epoxy system resin and the like in the upper-layer insulating film formation layer 35a is semi-hardened.

Figure 39:
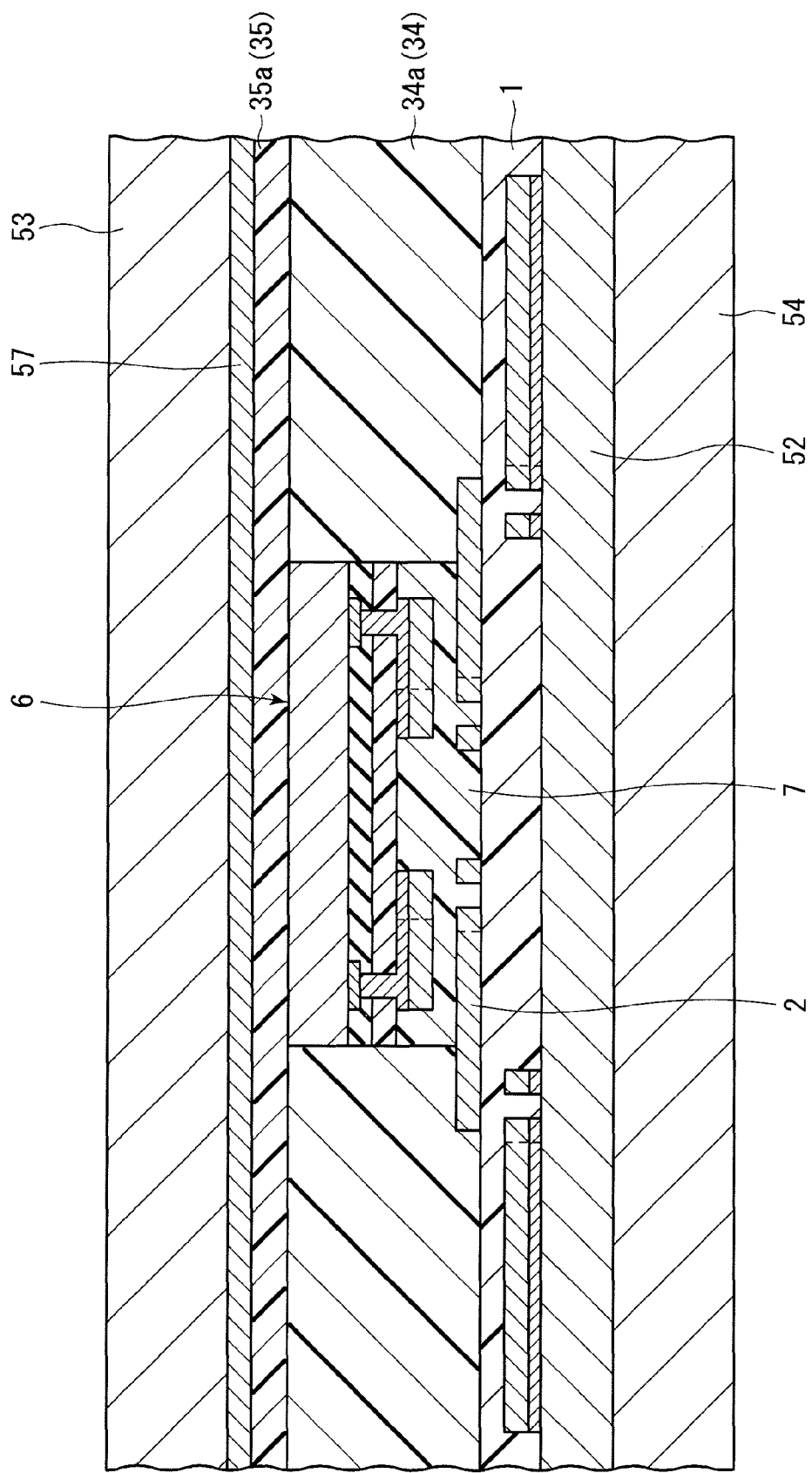
FIG. 39 is a cross-sectional view of a procedure performed after that in FIG. 38.

Next, as shown in FIG. 39, the insulating layer formation sheet 34a and the upper-layer insulating film formation layer 35a are heat-compressed from the upper and lower sides by a pair of heat-compression plates 53 and 54. As a result of heat compression, the thermosetting resin in the insulating layer formation sheet 34a and the upper-layer insulating film formation layer 35a flows and fills the gap 56 shown in FIG. 19. Then, after thermosetting resin is hardened by subsequent cooling, the insulating layer 34 is formed on the top surface of the lower-layer insulating film 1 including the first lower-layer wiring 2 around a periphery of the semiconductor construct 6 including the adhesive layer 7. In addition, the upper-layer insulating film 35 is also formed on the top surface of the insulating layer 34 and the semiconductor construct 6.

Figure 40:
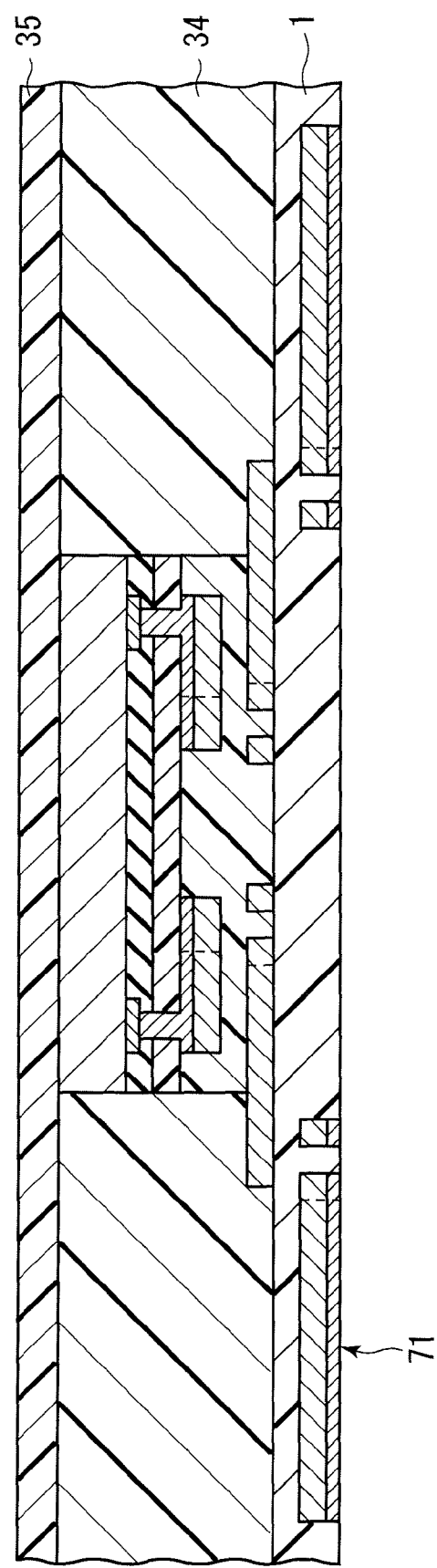
FIG. 40 is a cross-sectional view of a procedure performed after that in FIG. 39.

Next, when the base plate 52 and the sub-base plate 57 are removed by etching, as shown in FIG. 40, the bottom surface of the lower-layer insulating film 1 including the laser mask layer 71 is exposed. Also, the top surface of the upper-layer insulating film 35 is exposed. In this condition, even when the base plate 52 and the sub-base plate 57 are removed, strength is sufficiently obtainable because of the presence of the lower-layer insulating film 1, the insulating layer 34, and the upper-layer insulating film 35.

Figure 41:
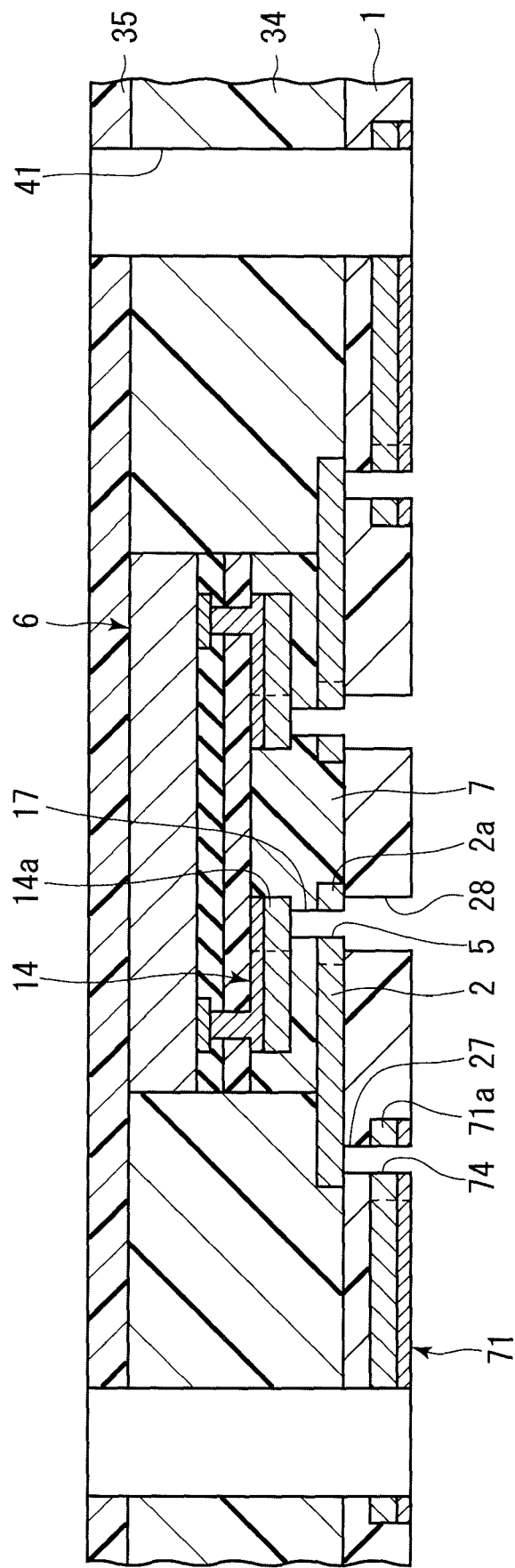
FIG. 41 is a cross-sectional view of a procedure performed after that in FIG. 40.

Next, as shown in FIG. 41, by laser processing performed by laser beam irradiation, the opening 28 is formed on the lower-layer insulating film 1 at a section corresponding to the center of the bottom surface of the one connection pad section 2a of the first lower-layer wiring 2. In addition, the adhesive layer 7 in the circular hole 5 of the one connection pad section 2a of the first lower-layer wiring 2 is removed, and the opening 17 is formed on the adhesive layer 7 at a section corresponding to the center of the bottom surface of the connection pad section 14a of the wiring member 14 of the semiconductor construct 6. Also, the lower-layer insulating film 1 in the circular hole 74 in the ring section 71a of the laser mask layer 71 is removed, and the opening 27 is formed on the lower-layer insulating film 1 at a section corresponding to the center of the bottom surface of the other connection pad section of the first lower-layer wiring 2. Moreover, the through-hole 41 is formed in predetermined sections of the lower-layer insulating film 1 including the laser mask layer 71, the insulating layer 34, and the upper-layer insulating film 35 using a mechanical drill or laser processing performed by laser beam irradiation.

In this case as well, a diameter of the connection pad section 14a of the wiring member 14 of the semiconductor construct 6 is smaller than an outer diameter and larger than an inner diameter (diameter of the opening 5) of the one connection pad section 2a of the first lower-layer wiring 2. Therefore, as is the case for the first embodiment, the diameter of the connection pad section 14a of the wiring member 14 of the semiconductor construct 6 can be reduced to a minimum, thereby allowing the miniaturization of the semiconductor construct 6. In addition, a diameter of the other connection pad section of the first lower-layer wiring 2 is smaller than an outer diameter and larger than an inner diameter (diameter of the circular hole 74) of the ring section 71a of the laser mask layer 71. Therefore, in a manner similar to that described above, the diameter of the other connection pad section of the first lower-layer wiring 2 can be reduced to a minimum, thereby allowing the miniaturization of the first lower-layer wiring 2.

Hereafter, when procedures similar to those in the first embodiment are performed, a plurality of semiconductor devices shown in FIG. 35 can be obtained. In this case as well, the semiconductor construct 6 is not mounted in the defective semiconductor device formation areas as described above. Therefore, in addition to semiconductor devices including the semiconductor construct 6 shown in FIG. 35, semiconductor devices that do not include the semiconductor construct 6 are obtained. Therefore, yield can be improved in a manner similar to that in the first embodiment. Note that the laser mask layer 71 may be only the ring section 71a including the circular hole 74.

Sixth Embodiment

Figure 42:
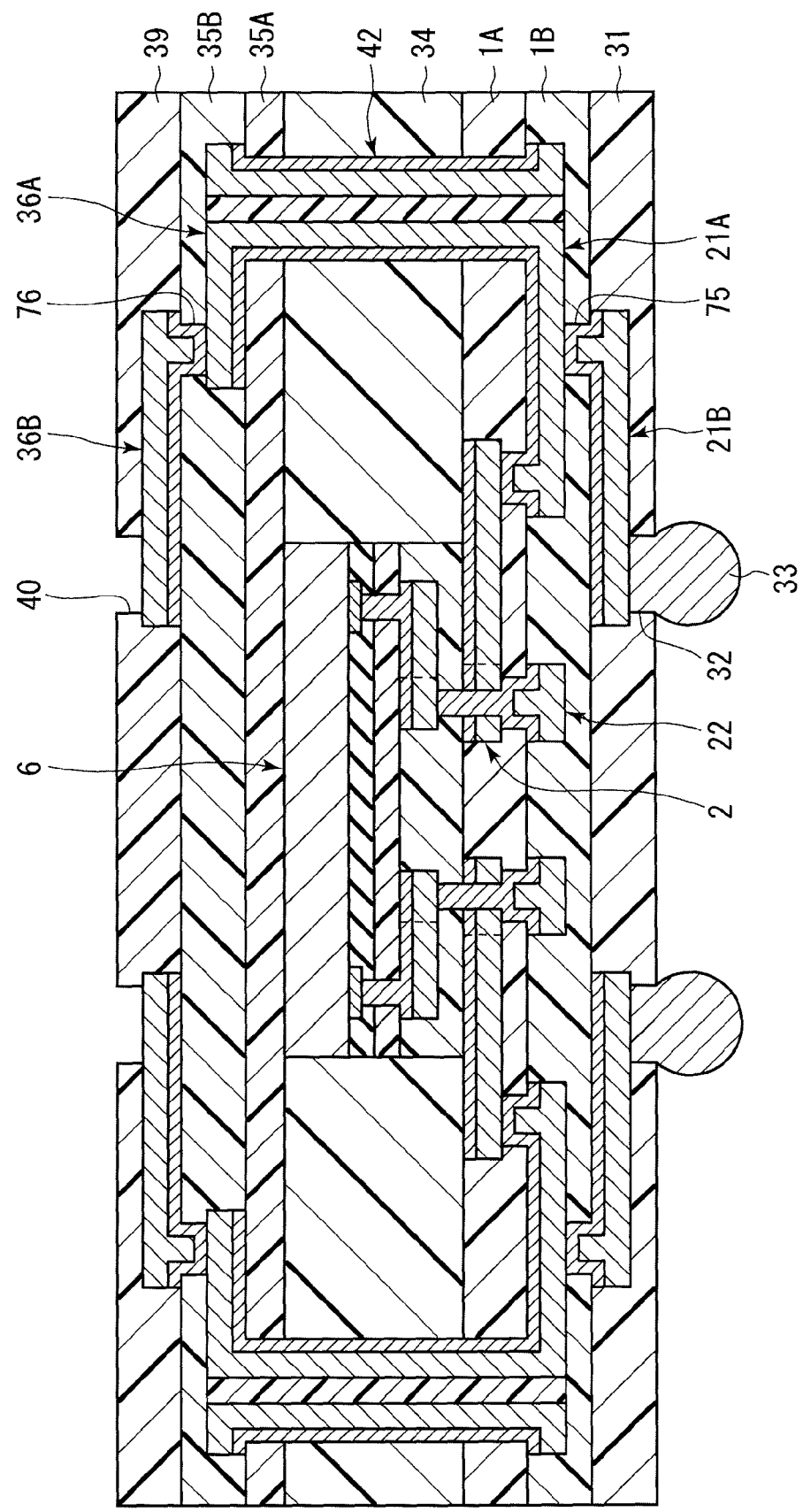
FIG. 42 is a cross-sectional view of a semiconductor device according to the sixth embodiment of the present invention.

FIG. 42 is a cross-sectional view of a semiconductor device according to the sixth embodiment of the present invention. The semiconductor device according to the sixth embodiment greatly differs from the semiconductor device shown in FIG. 1 in that a lower-layer wiring has a two-layer wiring structure and an upper-layer wiring has a three-layer wiring structure by build-up method. In other words, a second lower-layer insulating film B is provided on the bottom surface of a first lower-layer insulating film 1A including a second lower-layer wiring 21A. The second lower-layer insulating film 1B is made of the same material as that of the first lower-layer insulating film 1A.

One end section of a third lower-layer wiring 21B provided on the bottom surface of the second lower-layer insulating film 1B is connected to a connection pad section of the second lower-layer wiring 21A, via an opening 75 provided on the second lower-layer insulating film 1B. The lower-layer overcoat layer 31 is provided on the bottom surface of the second lower-layer insulating film 1B including the third lower-layer wiring 21B. Also, the solder ball 33 is provided in the opening 32 on the lower-layer overcoat film 31 and below the opening 32 in such a manner to be connected to the connection pad section of the third lower-layer wiring 21B.

A second upper-layer insulating film 35B is provided on the top surface of a first upper-layer insulating film 35A including a first upper-layer wiring 36A. The second upper-layer insulating film 35B is made of the same material as that of the first upper-layer insulating film 35A. One end section of a second upper-layer wiring 36B provided on the top surface of the second upper-layer insulating film 35B is connected to a connection pad section of the first upper-layer wiring 36A, via an opening 76 provided on the second upper-layer insulating film 35B. The upper-layer overcoat film 39 made of solder resist and the like is provided on the top surface of the second upper-layer insulating film 35B including the second upper-layer wiring 36B. The opening 40 is formed on the upper-layer overcoat film 39 in a section corresponding to a connection pad section of the second upper-layer wiring 36B. Note that the lower-layer wiring may have a wiring structure with four or more layers, and also the upper-layer wiring may have a wiring structure with three or more layers.

Seventh Embodiment

Figure 43:
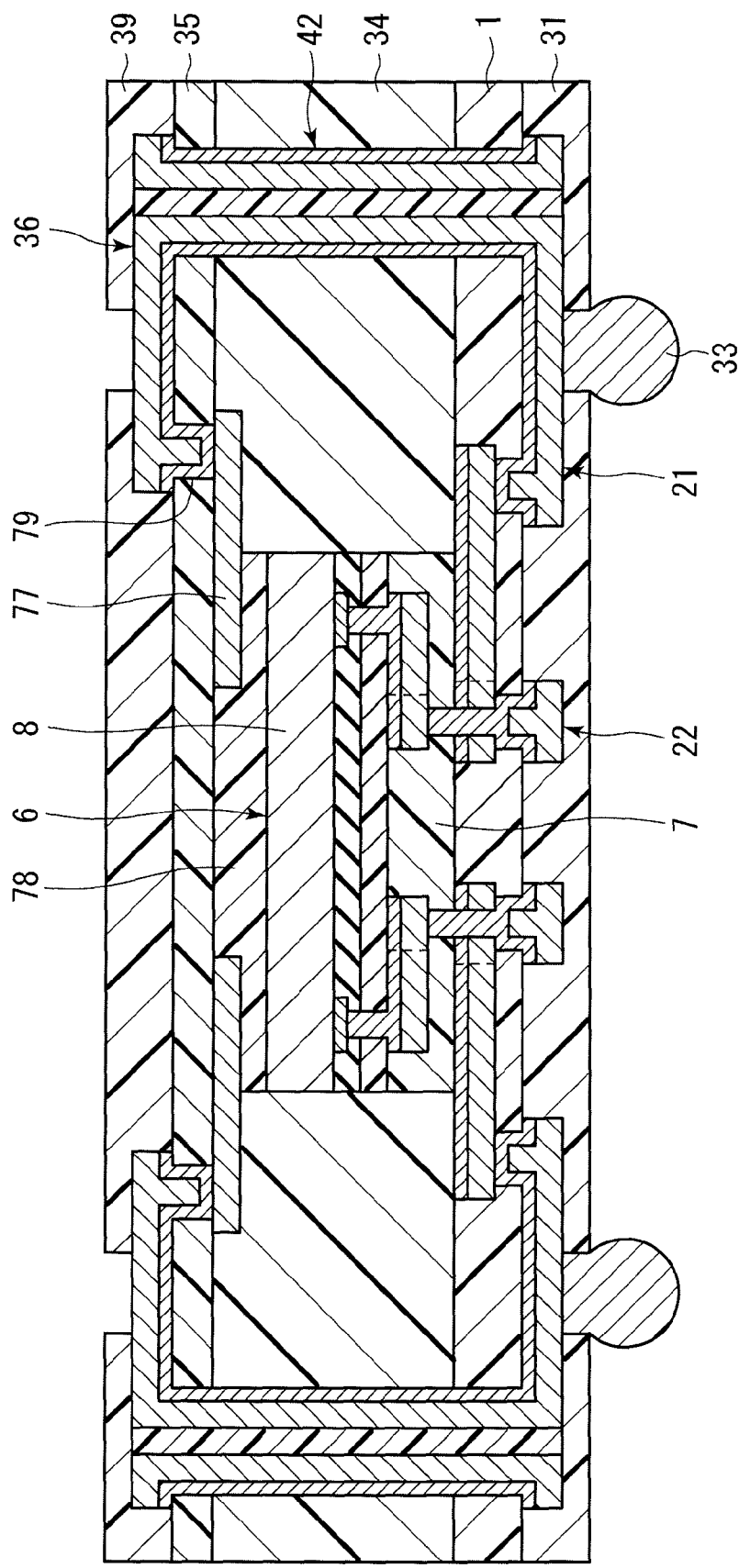
FIG. 43 is a cross-sectional view of a semiconductor device according to the seventh embodiment of the present invention.

FIG. 43 is a cross-sectional view of a semiconductor device according to the seventh embodiment of the present invention. The semiconductor device according to the seventh embodiment greatly differs from the semiconductor device shown in FIG. 1 in that another upper-layer wiring 77 is provided on the bottom surface of the upper-layer insulating film 35. In this case, the upper surface of the silicon substrate 8 of the semiconductor construct 6 is connected to the bottom surface of the upper-layer insulating film 35 including the second upper-layer wiring 77 via the adhesive layer 7. One end section of the upper-layer wiring 36 is connected to a connection pad section of the other upper-layer wiring 77 via an opening 79 formed on the upper-layer insulating film 35.

Figure 44:
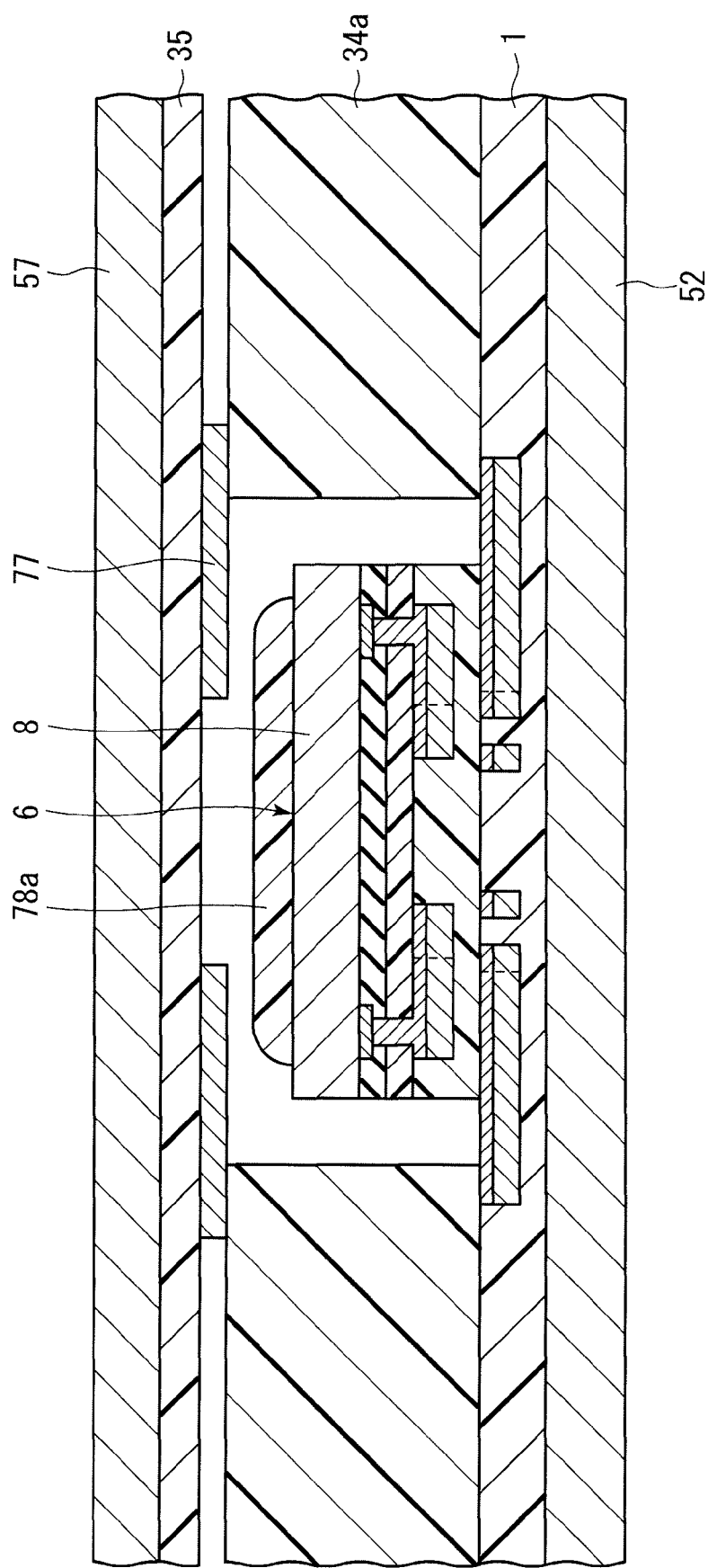
FIG. 44 is a cross-sectional view of a predetermined procedure in an example of a manufacturing method of the semiconductor device shown in FIG. 43.

Next, an example of a manufacturing method of this semiconductor device will be described. In this case, as shown in FIG. 44, the top surface of the silicon substrate 8 of the semiconductor construct 6 is coated with a liquid adhesive material 78a using a dispenser and the like, during a procedure such as that shown in FIG. 8. The adhesive material 78a is made of epoxy system resin including a silicon coupling agent, and the like. Next, the upper-layer insulating film 35, on the bottom surface of which the other upper-layer wiring 77 made of copper foil is formed, is disposed on the top surface of the insulation layer formation sheet 34a, while being positioned by a pin and the like. The upper-layer insulating film 35 is formed on the bottom surface of the sub-base plate 57. In this case, thermosetting resin composed of epoxy system resin and the like in the upper-layer insulating film 35 is already hardened.

Figure 45:
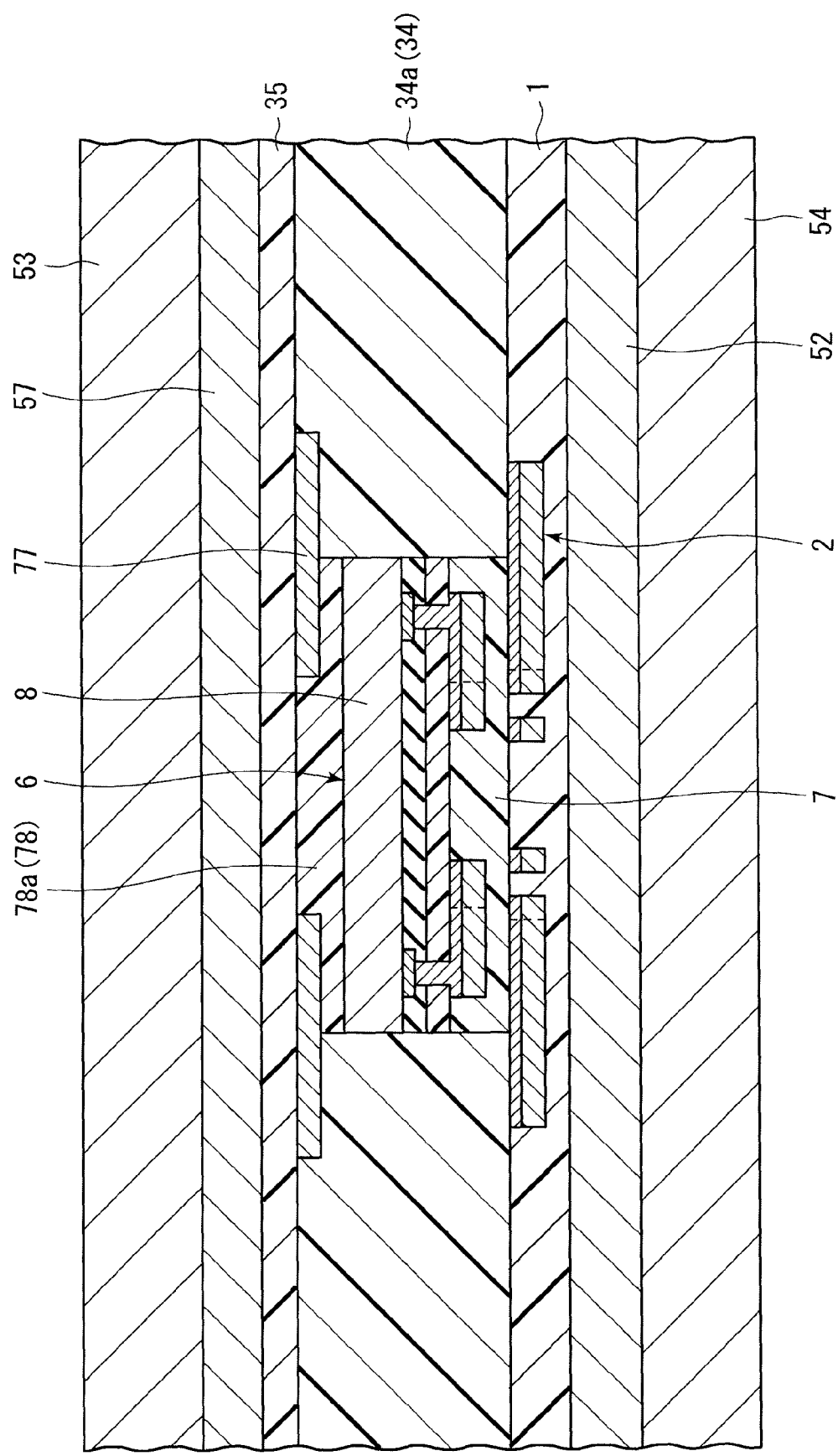
FIG. 45 is a cross-sectional view of a procedure performed after that in FIG. 44.
Figure 46:
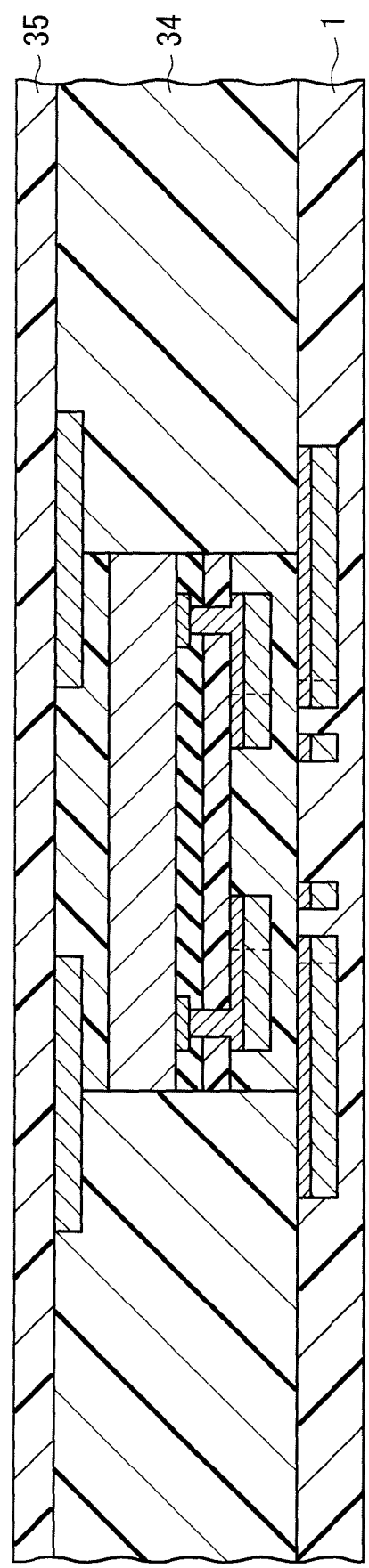
FIG. 46 is a cross-sectional view of a procedure performed after that in FIG. 45.

Next, as shown in FIG. 45, the insulating layer 34 is formed on the top surface of the lower-layer insulating film 1 including the first lower-layer wiring 2 around a periphery of the semiconductor construct 6 including the adhesive layer 7, by heat compression from the upper and lower sides performed by a pair of heat-compression plates 53 and 54. In addition, the top surface of the silicon substrate 8 of the semiconductor construct 6 is adhered to the bottom surface of the upper-layer insulating film 35 including the other upper-layer wiring 77 via an adhesive layer 78. Then, the bottom surface of the upper-layer insulating film 35 including the other upper-layer wiring 77 is fixed to the top surface of the insulating layer 34. Next, when the base plate 52 and the sub-base plate 57 are removed by etching, as shown in FIG. 46, the bottom surface of the lower-layer insulating film 1 is exposed, and also the top surface of the upper-layer insulating film 35 is exposed.

Figure 47:
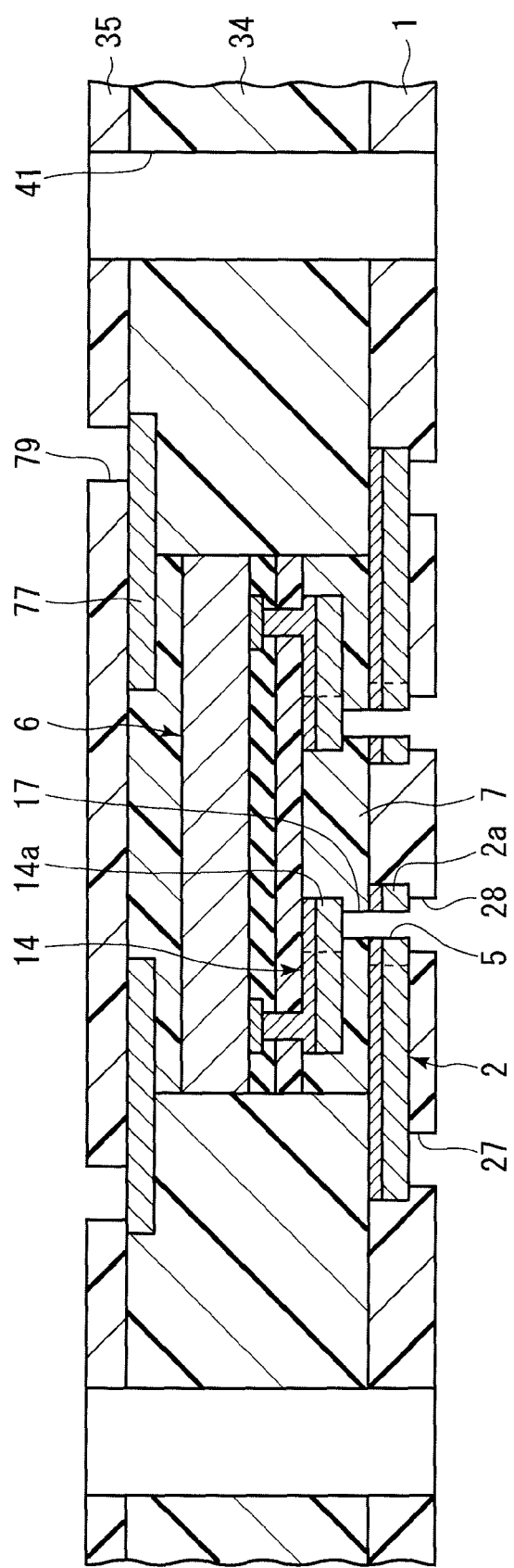
FIG. 47 is a cross-sectional view of a procedure performed after that in FIG. 46.

Next, as shown in FIG. 47, by laser processing performed by laser beam irradiation, the opening 28 and the opening 27 are formed on the lower-layer insulating film 1 at sections corresponding to the center of each bottom surface of the one connection pad section 2a and the other connection pad section of the first lower-layer wiring 2. In addition, the adhesive layer 7 in the circular hole 5 of the one connection pad section 2a of the first lower-layer wiring 2 is removed. The opening 17 is also formed on the adhesive layer 7 at a section corresponding to the center of the bottom surface of the connection pad section 14a of the wiring member 14 of the semiconductor construct 6.

Moreover, by laser processing performed by laser beam irradiation, the opening 79 is formed on the upper-layer insulating film 35 at a section corresponding to the connection pad section of the other upper-layer wiring 77. In addition, the through-hole 41 is formed in predetermined sections of the lower-layer insulating film 1, the insulating layer 34, and the upper-layer insulating film 35 using a mechanical drill or laser processing performed by laser beam irradiation. Hereafter, when procedures similar to those according to the first embodiment are performed, a plurality of semiconductor devices shown in FIG. 43 can be obtained.

In the semiconductor device obtained as described above, even when the upper-layer wiring has a two-layer wiring structure, because the upper-layer insulating film is a single layer, thinning can be performed, compared to the semiconductor device shown in FIG. 42. In heat-compression processing using a pair of heat-compression plates, if the thermosetting resin in the insulating layer formation sheet 34a fluidized can sufficiently flow around the top surface of the silicon substrate 8 of the semiconductor construct 6, the adhesive layer 78 may be omitted.

Eighth Embodiment

Figure 48:
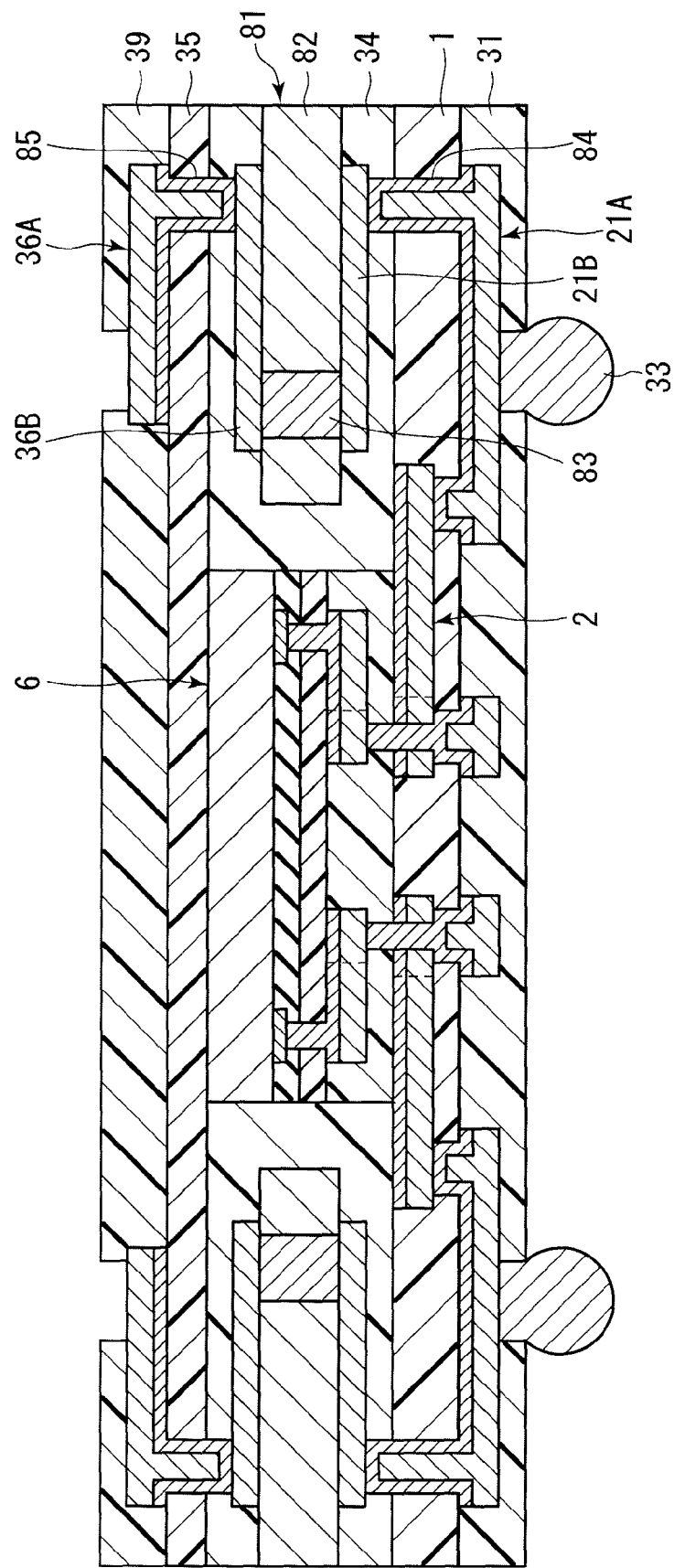
FIG. 48 is a cross-sectional view of a semiconductor device according to the eighth embodiment of the present invention.

FIG. 48 is a cross-sectional view of a semiconductor device according to the eighth embodiment of the present invention. The semiconductor device according to the eighth embodiment greatly differs from the semiconductor device shown in FIG. 1 in that the upper/lower communicating section 42 is not provided. Instead, a circuit board 81 is disposed, embedded in the insulating layer 34 around a periphery of the semiconductor construct 6. The circuit board 81 is square frame shaped and has a double-side wiring structure.

In this case, the circuit board 81 includes a substrate 82 that is square frame shaped and is made of glass cloth base material epoxy resin and the like. The third lower-layer wiring 21B made of copper foil is provided on the bottom surface of the substrate 82, and the second upper-layer wiring 36B made of copper foil is provided on the top surface of the substrate 82. The third lower-layer wiring 21B and the second upper-layer wiring 36B are connected by an upper/lower communicating section 83 made of conductive paste and the like provided in the substrate 82.

The second lower-layer wiring 21A provided on the bottom surface of the lower-layer insulating film 1 is connected to a connection pad section of the third lower-layer wiring 21B via an opening 84 provided on the lower-layer insulating film 1 and the insulating layer 34. The first upper-layer wiring 36A provided on the top surface of the upper-layer insulating film 35 is connected to a connection pad section of the second upper-layer wiring 36B via an opening 85 provided on the upper-layer insulating film 35 and the insulating layer 34.

Figure 49:
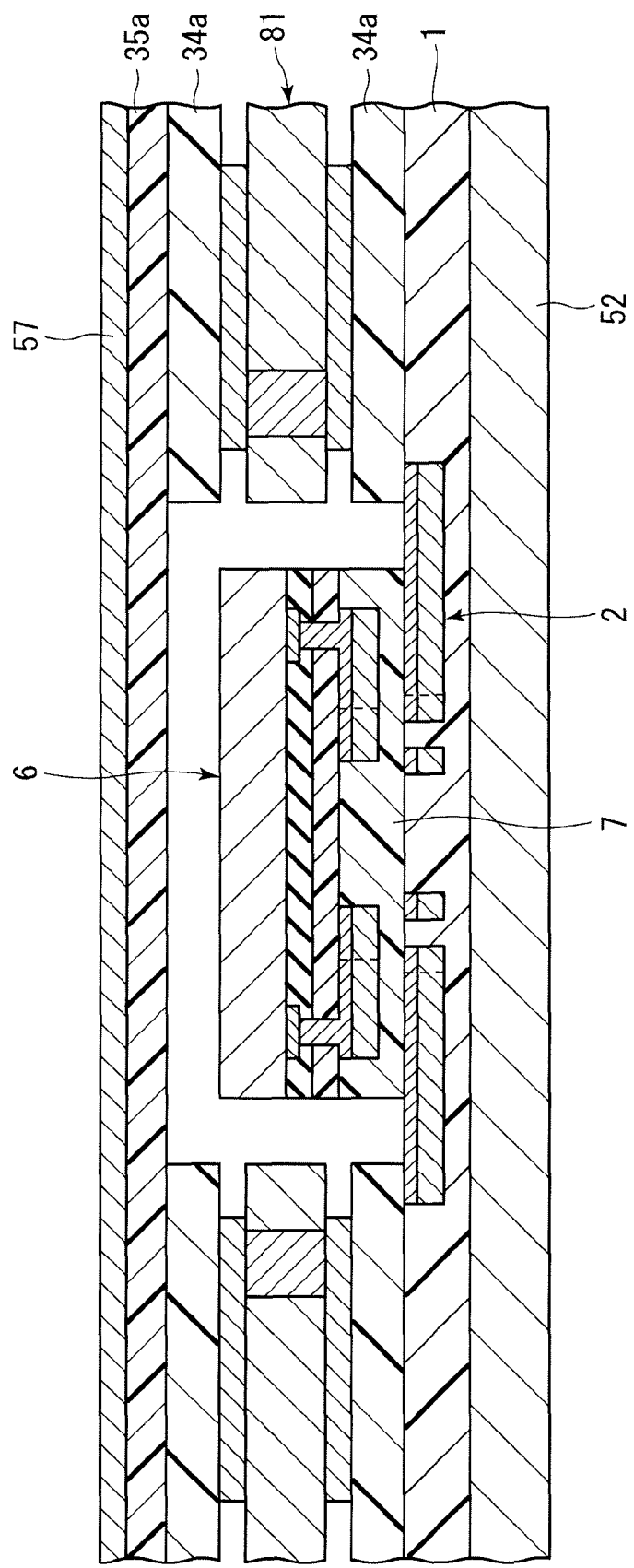
FIG. 49 is a cross-sectional view of a predetermined procedure in an example of a manufacturing method of the semiconductor device shown in FIG. 48.

Next, an example of a manufacturing method of this semiconductor device will be described. In this case, as shown in FIG. 49, the lattice-shaped insulating layer formation sheet 34a, the lattice-shaped circuit board 81, and the lattice-shaped insulating layer formation sheet 34a are disposed on the top surface of the lower-layer insulating film 1 including the first lower-layer wiring 2 around a periphery of the semiconductor construct 6 including the adhesive layer 7, while being positioned by a pin and the like, during a procedure such as that shown in FIG. 8. Next, the sub-base plate 57, on the bottom surface of which the upper-layer insulating film formation layer 35a is formed, is disposed on the top surface of the insulating layer formation sheet 34a on the upper side.

Figure 50:
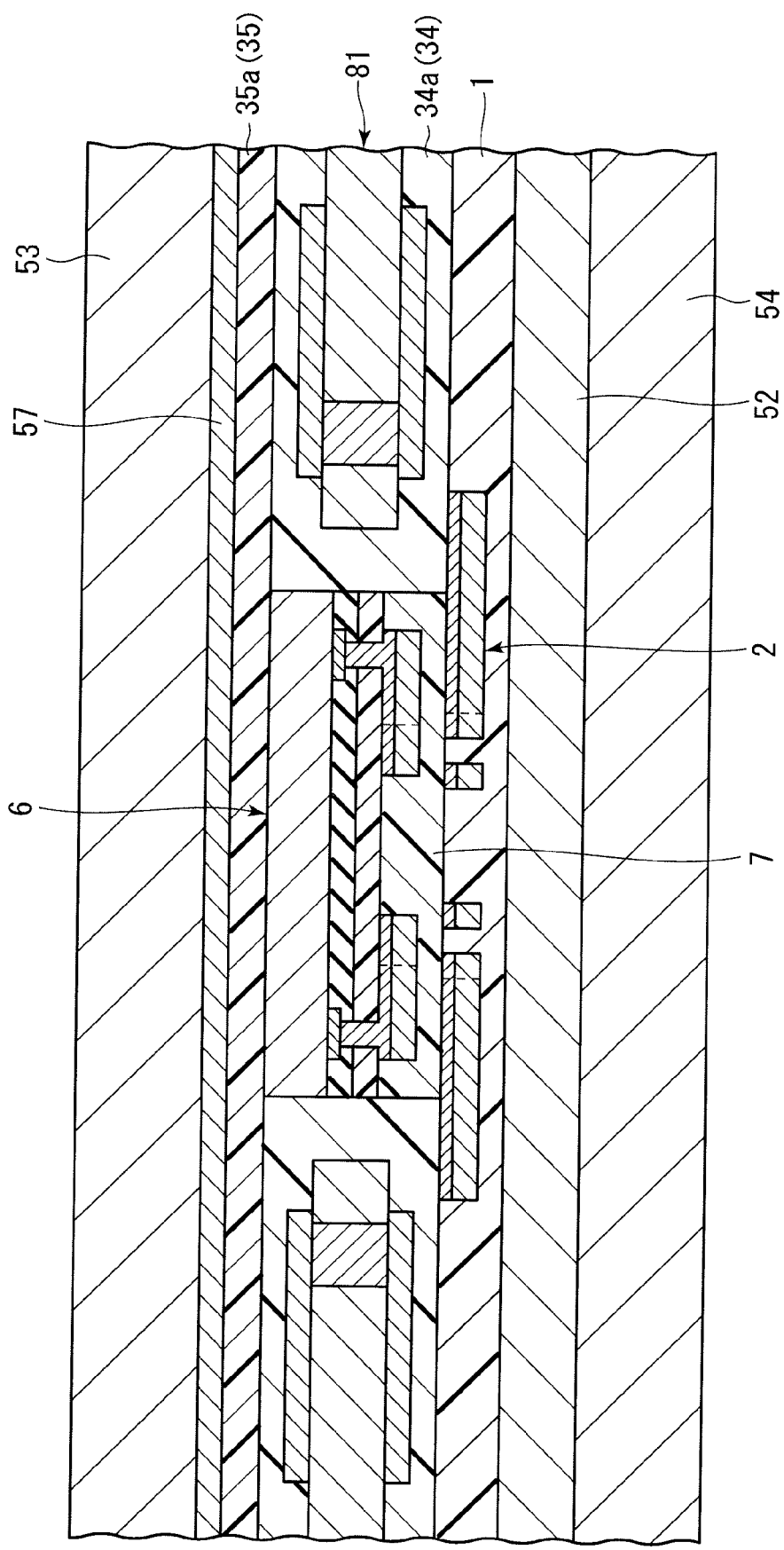
FIG. 50 is a cross-sectional view of a procedure performed after that in FIG. 49.
Figure 51:
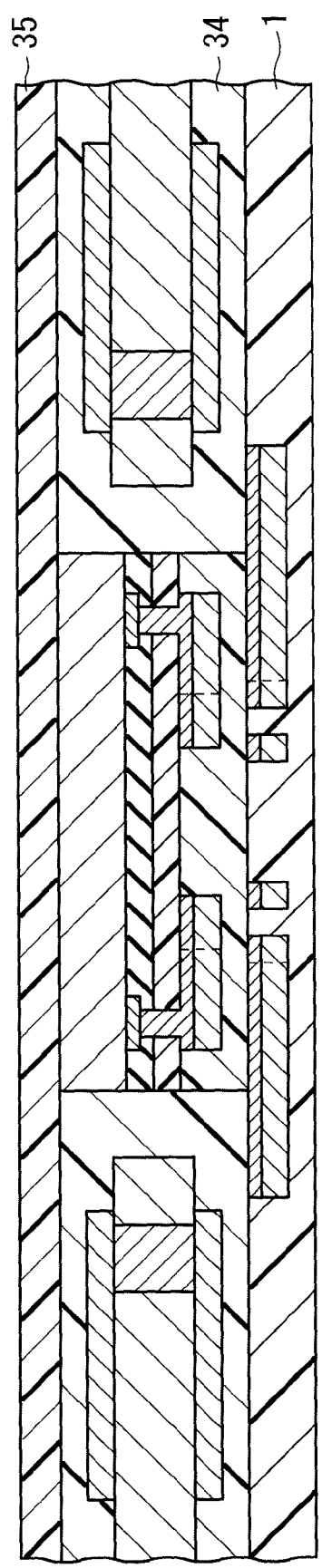
FIG. 51 is a cross-sectional view of a procedure performed after that in FIG. 50.

Next, as shown in FIG. 50, the insulating layer 34 is formed on the top surface of the lower-layer insulating film 1 including the first lower-layer wiring 2 around a periphery of the semiconductor construct 6 including the adhesive layer 7, by heat compression from the upper and lower sides performed by a pair of heat-compression plates 53 and 54. In addition, the circuit board 81 is embedded in the insulating layer 34, and the upper-layer insulating film 35 is formed on the top surface of the insulating layer 34 and the semiconductor construct 6. Next, when the base plate 52 and the sub-base plate 57 are removed by etching, the bottom surface of the lower-layer insulating film 1 is exposed as shown in FIG. 51, and also the top surface of the upper-layer insulating film 35 is also exposed.

Figure 52:
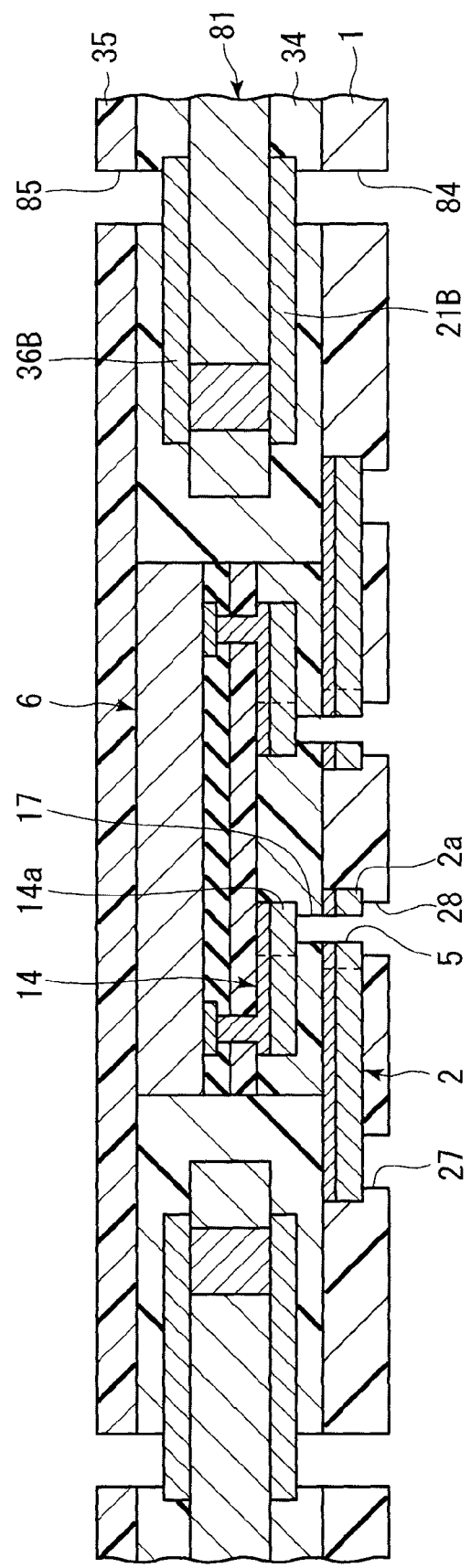
FIG. 52 is a cross-sectional view of a procedure performed after that in FIG. 51.

Next, as shown in FIG. 52, by laser processing performed by laser beam irradiation, the opening 28 and the opening 27 are formed on the lower-layer insulating film 1 at sections corresponding to the center of each bottom surface of the one connection pad section 2a and the other connection pad section of the first lower-layer wiring 2. In addition, the adhesive layer 7 in the circular hole 5 of the one connection pad section 2a of the first lower-layer wiring 2 is removed, and the opening 17 is formed on the adhesive layer 7 at the section corresponding to the center of the bottom surface of the connection pad section 14a of the wiring member 14 of the semiconductor construct 6.

Moreover, by laser processing performed by laser beam irradiation, the opening 84 and the opening 85 are formed on the lower-layer insulating film 1 and the upper-layer insulating film 35 at sections corresponding to each connection pad section of the third lower-layer wiring 21B and the second upper-layer wiring 36B of the circuit board 81. Hereafter, when procedures similar to those according to the first embodiment are performed, a plurality of semiconductor devices shown in FIG. 48 can be obtained.

In the semiconductor device obtained as described above, even when the lower-layer wiring has a three-layer structure and the upper-layer wiring has a two-layer wiring structure, because the lower-layer insulating film and the upper-layer insulating film are single layers, thinning can be performed, compared to the semiconductor device shown in FIG. 42. Also, because the upper/lower communicating section 42 is not provided, the through-hole 41 is not required to be formed using a mechanical drill.

Ninth Embodiment

Figure 53:
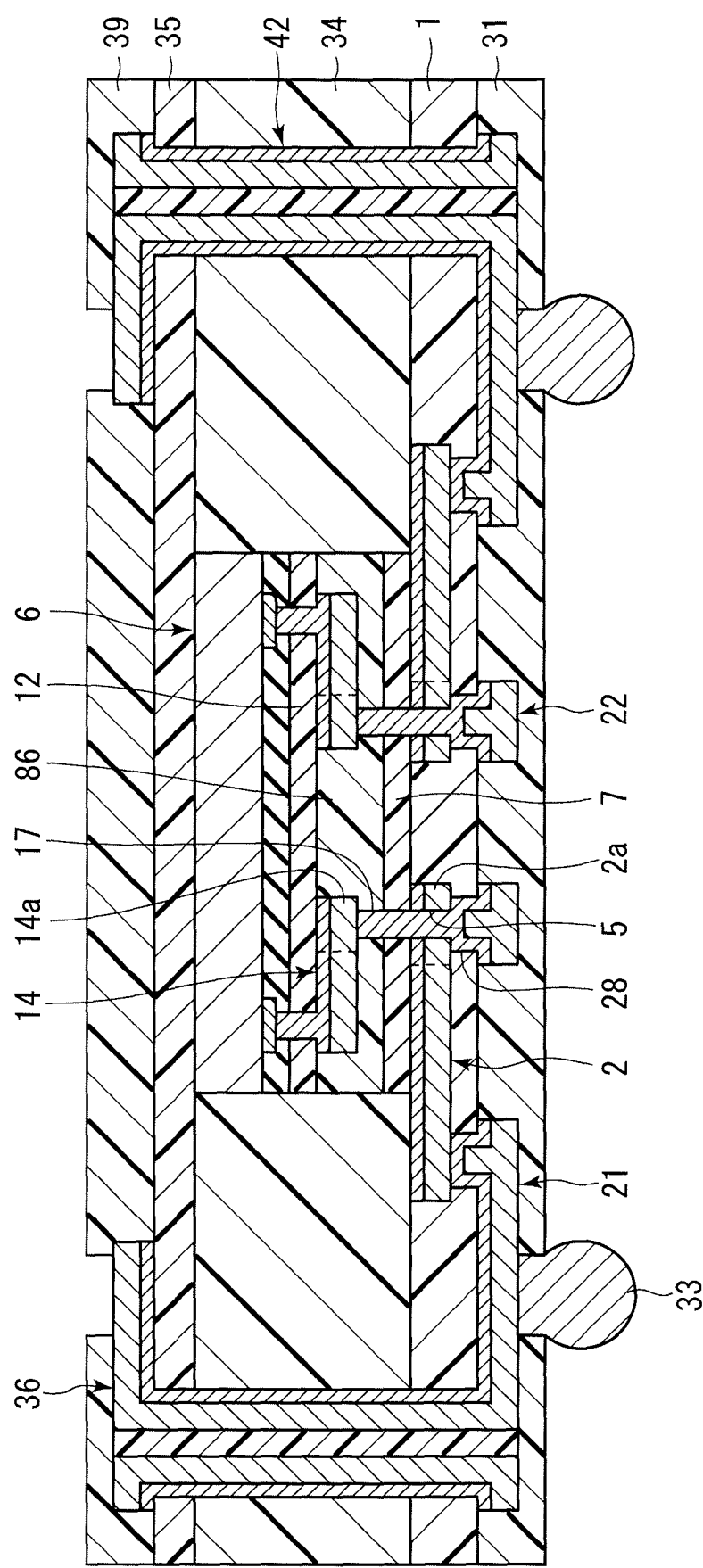
FIG. 53 is a cross-sectional view of a semiconductor device according to the ninth embodiment of the present invention.

FIG. 53 is a cross-sectional view of a semiconductor device according to the ninth embodiment of the present invention. The semiconductor device according to the ninth embodiment differs from the semiconductor device in FIG. 1 in that an anti-static protective film 86 is provided on the bottom surface of the protective film 12 including the wiring member 14 of the semiconductor construct 6. The anti-static protective film 86 is made of an insulating material, such as polyimide system resin, epoxy system resin, and the like.

Therefore, in this case, the bottom surface of the anti-static protective film 86 of the semiconductor construct 6 is adhered to the center of the top surface of the lower-layer insulating film 1 including the first lower-layer wiring 2 via the adhesive layer 7. The connection pad section 22 is connected to the connection pad section 14a of the wiring member 14 of the semiconductor construct 6 via the opening 27 on the lower-layer insulating film 1, the circular hole 5 in the one connection pad section 2a of the first lower-layer wiring 2, and the opening 17 on the adhesive layer 7 and the protective layer 86.

Before the semiconductor construct 6 is mounted on the lower-layer insulating film 1, the opening 17 is not formed on the protective film 86. In addition, the protective film 86 that does not have the opening 17 protects an integrated circuit formed under the silicon substrate 8 from static electricity in the time between when the protective layer 86 is formed under the silicon substrate 8 that is in a wafer-state and when the semiconductor construct 6 is mounted on the lower-layer insulating film 1.

Tenth Embodiment

Figure 54:
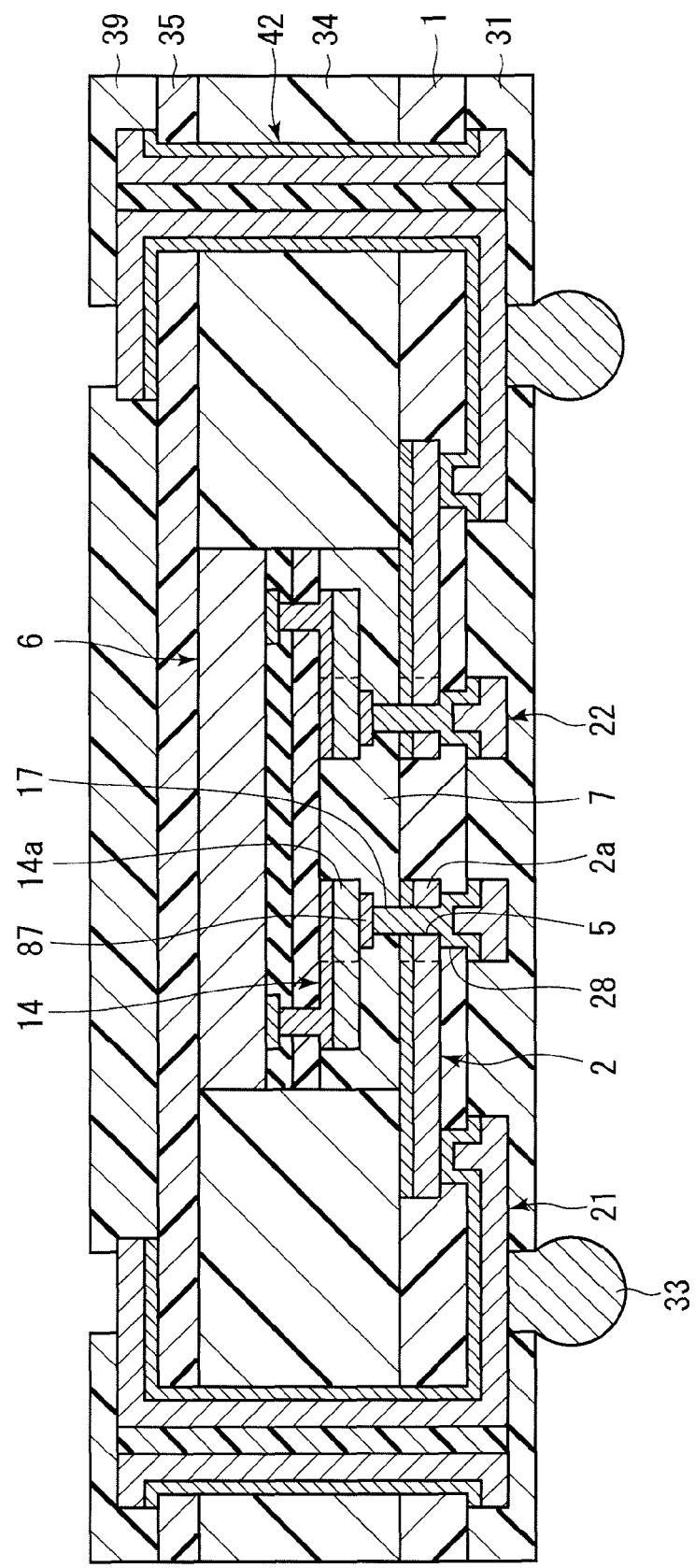
FIG. 54 is a cross-sectional view of a semiconductor device according to the tenth embodiment of the present invention.

FIG. 54 is a cross-section al view of a semiconductor device according to the tenth embodiment of the present invention. The semiconductor device according to the tenth embodiment differs from the semiconductor device shown in FIG. 1 in that a protective layer 87 made of electrolytic copper plating is provided on the bottom surface of the connection pad section 14a of the wiring member 14 of the semiconductor construct 6. In this case, the protective layer 87 protects the connection pad section 14a of the wiring member 14 when a laser beam is irradiated. In other words, the wiring member 14 is formed with a thickness of 5 µm to 10 µm, and in expectation of an amount etched by the laser beam, the protective layer 87 with a thickness of several micrometers is formed only on the connection pad section 14a of the wiring member 14. As a result, thinning of the semiconductor construct 6 can be performed. Note that, for clarification, the protective layer 87 is shown in FIG. 54. However, the thickness of the protective layer 87 after laser beam irradiation is, in effect, preferably nearly zero.

Eleventh Embodiment

Figure 55:
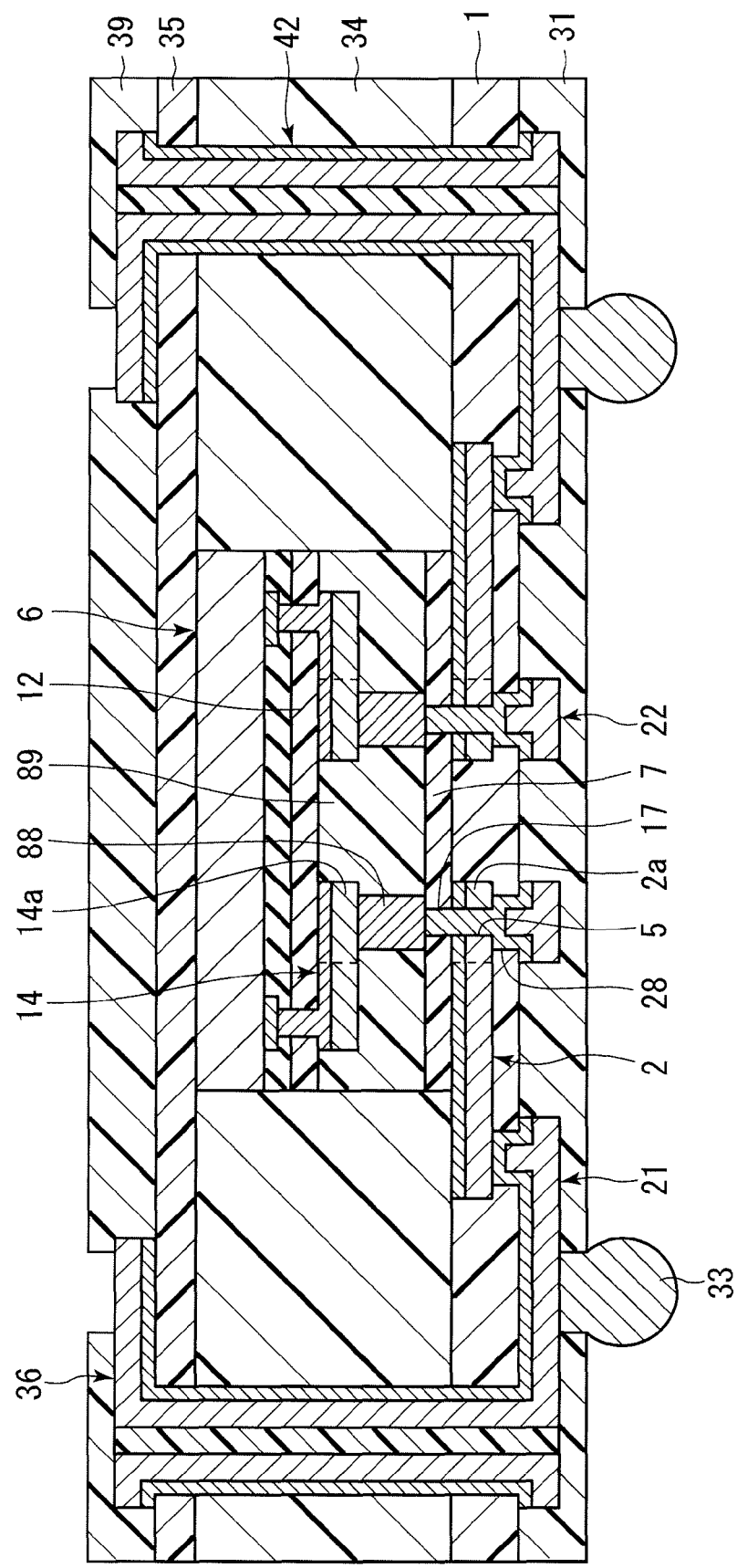
FIG. 55 is a cross-sectional view of a semiconductor device according to the eleventh embodiment of the present invention.

FIG. 55 is a cross-sectional view of a semiconductor device according to the eleventh embodiment of the present invention. The semiconductor device according to the eleventh embodiment differs from the semiconductor device in FIG. 1 in that a columnar electrode (external connection electrode) 88 made of electrolytic copper plating is provided in the center of the bottom surface of the connection pad section 14a of the wiring member 14 of the semiconductor construct 6, and that a sealing film 89 made of epoxy system resin and the like is provided on the bottom surface of the protective film 12 including the wiring member 14 in such a manner that the bottom surface of the sealing film 89 is flush with the bottom surface of the columnar electrode 88.

Therefore, in this case, the bottom surface of the sealing film 89 including the columnar electrode 88 is adhered to the center of the top surface of the lower-layer insulating film 1 via the adhesive layer 7. The connection pad section 22 is connected to the columnar electrode 88 of the semiconductor construct 6 via the opening 27 on the lower-layer insulating film 1, the circular hole 5 in the one connection pad section 2a of the first lower-layer wiring 2, and the opening 17 on the adhesive layer 7.

Twelfth Embodiment

Figure 56:
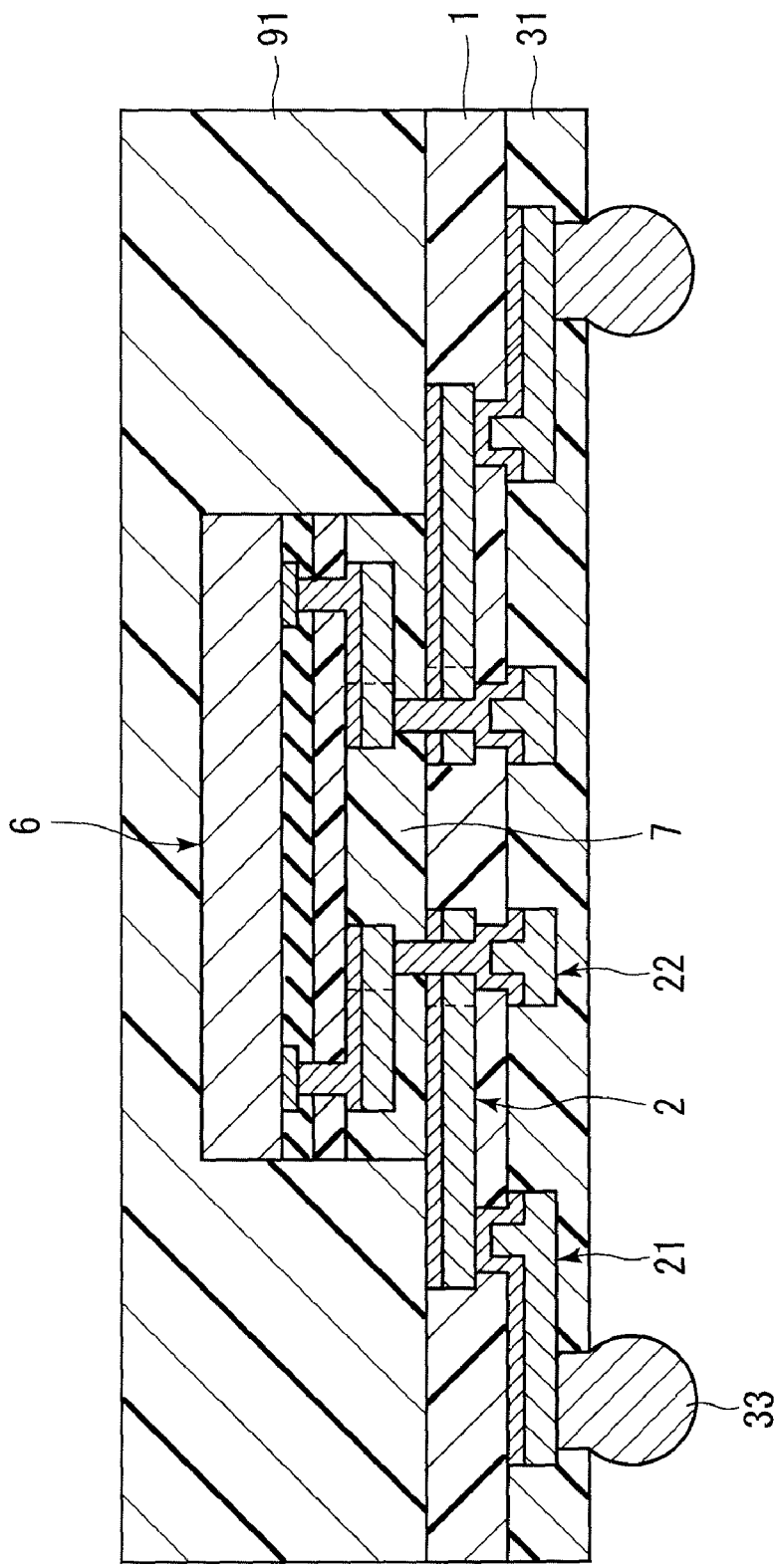
FIG. 56 is a cross-sectional view of a semiconductor device according to the twelfth embodiment of the present invention.

FIG. 56 is a cross-sectional view of a semiconductor device according to the twelfth embodiment of the present invention. The semiconductor device according to the twelfth embodiment differs from the semiconductor device in FIG. 1 in that only a sealing film (insulating layer) 91 made of epoxy system resin and the like is formed on the top surface of the semiconductor construct 6 and the lower-layer insulating film 1 including the first lower layer wiring 2. In this case, the sealing film 91 is formed by molding method such as transfer molding method.

Thirteenth Embodiment

Figure 57:
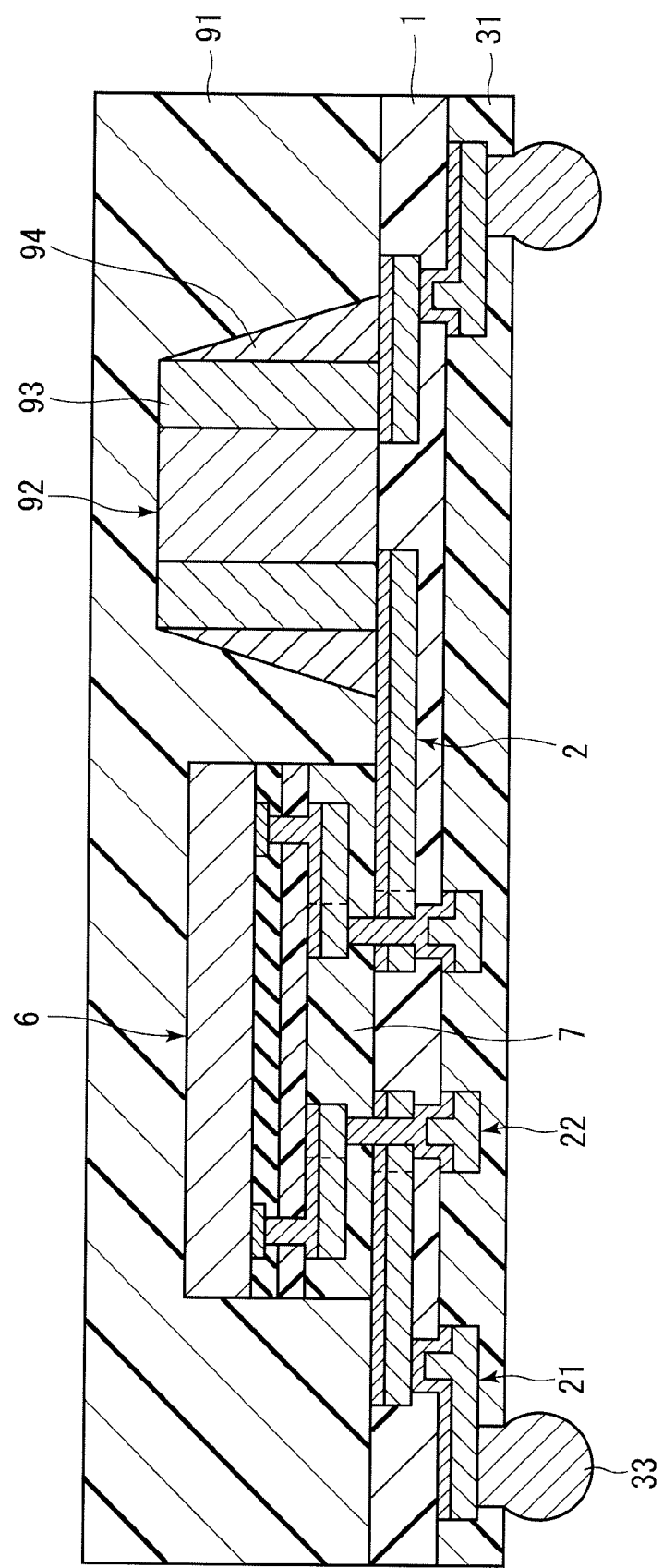
FIG. 57 is a cross-sectional view of a semiconductor device according to the thirteenth embodiment of the present invention.

FIG. 57 is a cross-sectional view of a semiconductor device according to the thirteenth embodiment of the present invention. The semiconductor device according to the thirteenth embodiment differs from the semiconductor device in FIG. 56 in that a chip component 92 is mounted on the top surface of the first lower-layer wiring 2 embedded on the top surface side of the lower-layer insulating film 1 around a periphery of the semiconductor construct 6 including the adhesive layer 7. The chip component 92 includes a resistor, a capacitor, and the like. In this case, both electrodes 93 of the chip component 92 are connected to the first lower-layer wiring 2 by a solder 94. The chip component 92 including the solder 94 is covered by the sealing film 91.

Fourteenth Embodiment

Figure 58:
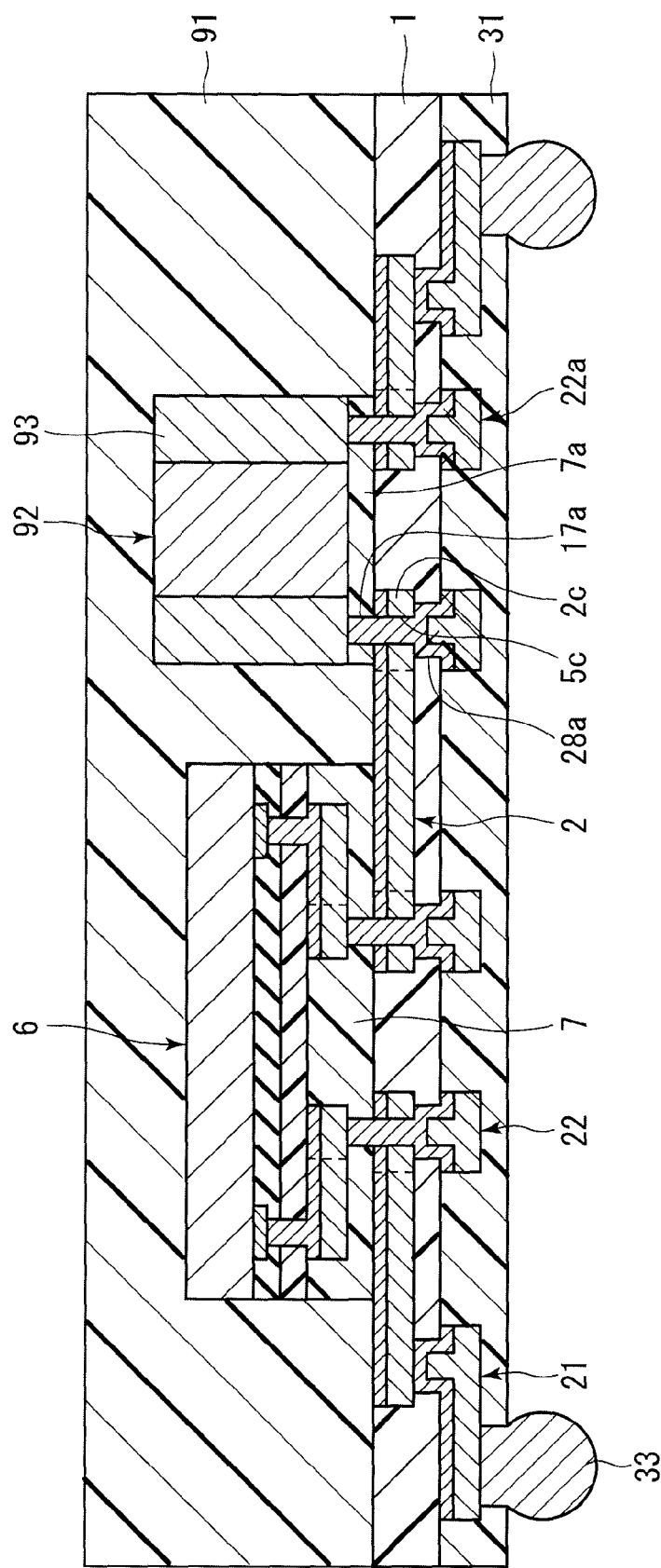
FIG. 58 is a cross-sectional view of a semiconductor device according to the fourteenth embodiment of the present invention.

FIG. 58 is a cross-sectional view of a semiconductor device according to the fourteenth embodiment of the present invention. The semiconductor device according to the fourteenth embodiment greatly differs from the semiconductor device in FIG. 57 in that the chip component 92 is adhered to the top surface of the lower-layer insulating film 1 including the first lower-layer wiring 2 around a periphery of the semiconductor construct 6 including the adhesive layer 7, by an adhesive layer 7a made of the same material as that of the adhesive layer 7.

In this case, the both electrodes 93 of the chip component 92 are formed from copper. In addition, the connection pad section 22a provided on the bottom surface of the lower-layer insulating film 1 is connected to another connection pad section 2c of the first lower-layer wiring 2 via an opening 27a on the lower-layer insulating film 1. The connection pad section 22a is also connected to the electrodes 93 of the chip component 92 via a circular hole 5c in the other connection pad section 2c of the first lower-layer wiring 2 and the opening 17a on the adhesive layer 7a.

According to each of the above-described embodiments, the opening 5 on the connection pad section 2a of the first lower-layer wiring 2, the opening 17 formed on the adhesive layer 7, and the like have a circular planar shape. However, the present invention is not limited thereto. The planar shape may be, for example, polygonal or a random shape. In addition, the wiring member 14 connected to the connection pad 9 is formed in the semiconductor construct 6. However, the present invention can also be applied to a semiconductor construct that does not have a wire-routing section and on which only external connection electrode is formed. Furthermore, various other modifications can also be made within the scope of the present invention.

While the present invention has been described with reference to the preferred embodiments, it is intended that the invention be not limited by any of the details of the description therein but includes all the embodiments which fall within the scope of the appended claims.

What is claimed is:

1. A semiconductor device, comprising:
    a semiconductor construct having a semiconductor substrate, an external connection electrode formed on the semiconductor substrate and an electrode enveloping layer which has a second opening that exposes at least a portion of the external connection electrode;
    an insulating layer formed around a periphery of the semiconductor construct;
    a wiring which is formed below the semiconductor construct and below the insulating layer and including a connection pad having a first opening which is formed at the position corresponding to the external connection electrode; and
    a connection conductor for electrically connecting the external connection electrode to the wiring via the second opening and the first opening.

2. The semiconductor device according to claim 1, wherein a protective film is formed on the semiconductor substrate and the external connection electrode is configured as a portion of the wiring formed on the protective film.

3. The semiconductor device according to claim 1, further comprising:
    an insulating film for covering the wiring.

4. The semiconductor device according to claim 3, wherein the insulating film has a third opening corresponding to the first opening, and the connection conductor protrudes onto the insulating film via the third opening.

5. The semiconductor device according to claim 3, wherein the wiring is formed in such a manner to protrude from a top surface of the insulating film and to be embedded in a thickness direction of the electrode enveloping layer of the semiconductor construct and the insulating layer.

6. The semiconductor device according to claim 1, further comprising:
    an insulating film formed between the electrode enveloping layer of the semiconductor construct and the wiring, and between the insulating layer and the wiring.

7. The semiconductor device according to claim 6, wherein the wiring is formed in such a manner to be embedded in the insulating film.

8. The semiconductor device according to claim 1, wherein a circuit board is embedded in the insulating layer.

9. The semiconductor device according to claim 1, further comprising:
    a metallic protective layer for at least partly covering a surface of the external connection electrode.

10. The semiconductor device according to claim 1, wherein the semiconductor construct further includes a protective film formed on the semiconductor substrate and a wiring member formed on the protective film; the external connection electrode is formed on the wiring member and has a columnar configuration.

11. The semiconductor device according to claim 1, wherein the insulating layer has a section that covers a back surface of the semiconductor substrate.

* * * * *